US012476605B2

(12) United States Patent
Hurwitz et al.

(10) Patent No.: US 12,476,605 B2
(45) Date of Patent: Nov. 18, 2025

(54) PACKAGED ELECTRONIC COMPONENTS

(71) Applicant: Zhuhai Crystal Resonance Technologies Co., Ltd., Guangdong (CN)

(72) Inventors: Dror Hurwitz, Zhuhai (CN); BawChing Perng, Zhuhai (CN); Duan Feng, Zhuhai (CN)

(73) Assignee: ZHUHAI CRYSTAL RESONANCE TECHNOLOGIES CO., LTD., Zhuhai (CN)

( * ) Notice: Subject to any disclaimer, the term of this patent is extended or adjusted under 35 U.S.C. 154(b) by 204 days.

(21) Appl. No.: 17/342,756

(22) Filed: Jun. 9, 2021

(65) Prior Publication Data

US 2021/0297054 A1 Sep. 23, 2021

Related U.S. Application Data

(62) Division of application No. 16/521,704, filed on Jul. 25, 2019, now Pat. No. 11,063,571.

(51) Int. Cl.

| | |
|---|---|
| *H03H 9/02* | (2006.01) |
| *H01L 23/00* | (2006.01) |
| *H01L 23/538* | (2006.01) |
| *H03H 9/17* | (2006.01) |
| *H10N 30/20* | (2023.01) |
| *H10N 30/85* | (2023.01) |
| *H10N 30/87* | (2023.01) |

(52) U.S. Cl.
CPC ..... *H03H 9/02015* (2013.01); *H01L 23/5385* (2013.01); *H01L 23/5386* (2013.01); *H01L 24/14* (2013.01); *H01L 24/94* (2013.01); *H03H 9/174* (2013.01); *H10N 30/2047* (2023.02); *H10N 30/852* (2023.02); *H10N 30/877* (2023.02)

(58) Field of Classification Search
CPC ............... H03H 9/02015; H03H 9/174; H10N 30/2047; H10N 30/877; H10N 30/852; H01L 23/5385; H01L 23/5386; H01L 24/14; H01L 24/94
See application file for complete search history.

(56) References Cited

U.S. PATENT DOCUMENTS

| | | | | |
|---|---|---|---|---|
| 6,204,737 B1 * | 3/2001 | Ella | ......................... | H01P 1/127 333/133 |
| 2005/0237132 A1 * | 10/2005 | Sano | ........................ | H03H 3/02 333/191 |
| 2011/0148547 A1 * | 6/2011 | Zhang | ................ | H03H 9/02118 333/187 |

(Continued)

*Primary Examiner* — Samuel S Outten
(74) *Attorney, Agent, or Firm* — Wiggin and Dana LLP

(57) ABSTRACT

A package for an electronic component, the package comprising a front end, a back end, and an active membrane layer sandwiched between front and back electrodes of conducting material; wherein front electrode has a surface that extends beyond an adjacent surface of the active membrane layer, the active membrane mechanically supported by the front end and covered by a back end comprising at least one back cavity having organic walls and lid of organic material, with filled through vias traversing the organic walls and lid for coupling to the electrodes by an internal routing layer; the vias being coupleable by external solderable bumps to a circuit board for coupling the package in a flip chip configuration.

21 Claims, 23 Drawing Sheets

(56) References Cited

U.S. PATENT DOCUMENTS

| | | | |
|---|---|---|---|
| 2014/0118091 A1* | 5/2014 | Burak | H03H 9/02157 |
| | | | 333/187 |
| 2014/0191826 A1* | 7/2014 | Hashimoto | H03H 9/582 |
| | | | 310/320 |
| 2018/0254764 A1* | 9/2018 | Lee | H03H 9/174 |
| 2019/0058451 A1* | 2/2019 | Lee | H03H 9/175 |
| 2020/0304103 A1* | 9/2020 | Kawasaki | H03H 9/0523 |

* cited by examiner

PACKAGED ELECTRONIC COMPONENTS

CROSS-REFERENCE TO RELATED PATENT APPLICATIONS

This patent application is a divisional of U.S. patent application Ser. No. 16/521,704 filed Jul. 25, 2019, which is herein incorporated by reference in its entirety. Moreover, this patent application is related to U.S. patent application Ser. No. 16/521,674, titled "Method of Fabricating Novel Packages for Electronic Components" and issued as U.S. Pat. No. 10,797,681; U.S. patent application Ser. No. 16/521,727, titled "Method for Packaging an Electronic Component in a Package with an Organic Back End"; and U.S. patent application Ser. No. 16/521,752, titled "Packages with Organic Back Ends for Electronic Components"; all by Dror Hurwitz, Dr. Harry Perng and Dr. Duane Feng, all filed on Jul. 25, 2019, and all of which are herein incorporated by reference in their entireties.

BACKGROUND

The next generation of mobile phones will be required to operate at higher frequencies and larger bandwidths to enable transmitting and receiving the ever growing data traffic. Moving to such higher frequencies without enlarging the mobile phone requires small low power resonators that operate at very high frequencies, which can be used in smart phones without rapid depletion of the battery power pack.

With different geographical locations using different frequencies, and ever greater data traffic requiring higher frequencies, fifth generation mobile phones will have a plurality of nearby bandwidths, and will require several tens of RF filters, each comprising arrays of RF resonators. With space being restricted, there is a need for small, reliable, high performance RF filters. As described in applicant's previous patent applications, eliminating grain boundaries minimizes losses, and the best performances are obtainable with highly oriented or single crystal membrane acoustic resonators, and the inventor and applicant has devised ways of achieving this with materials such as $Ba_xSr_{(1-x)}TiO_3$ henceforth BST, c-axis-oriented $Sc_xAl_{(1-x)}N$ henceforth ScAlN, AlN and $Al_xGa_{(1-x)}N$ henceforth AlGaN which may be incorporated into (Bulk Acoustic Wave) BAW Resonators in general, and as FBARs (Film Bulk Acoustic Resonators) in particular.

As always, in commercialization of such products, improved yields and reduction in unit cost without compromising performance is highly advantageous, if not essential.

Bulk-acoustic-wave (BAW) filters provide better performance than surface acoustic wave filters. Whereas the best SAW filters may have Q factors of 1000 to 1500, current state of the art BAW resonators have Q factors of 2500 to 5000.

BAW filters can operate at higher frequencies than SAW filters. They have better power handling, a smaller size, higher electrostatic discharge (ESD) and exhibit reduced bulk radiation losses.

The electrical impedance of a BAW resonator has two characteristic frequencies: the resonance frequency fR and the anti-resonance frequency fA. At fR, the electrical impedance is very small, whereas at fA, the electrical impedance is very large. Filters may be constructed by combining several resonators. The shunt resonator is shifted in frequency with respect to the series resonator. When the resonance frequency of the series resonator equals the anti-resonance frequency of the shunt resonator, the maximum signal is transmitted from the input to the output of the device. At the anti-resonance frequency of the series resonator, the impedance between the input and output terminals is high and the filter transmission is blocked. At the resonance frequency of the shunt resonator, any current flowing into the filter section is shorted to ground by the low impedance of the shunt resonator so that the BAW filter also blocks signal transmissions at this frequency. The frequency spacing between fR and fA determines the filter bandwidth.

For frequencies other than the resonance and anti-resonance frequencies, the BAW resonator behaves like a Metal-Insulator-Metal (MIM) capacitor. Consequently, far below and far above the resonance and anti-resonance frequencies, the magnitude of the electrical impedance is proportional to $1/f$ where f is the frequency. The frequency separation between fR and fA is a measure of the strength of the piezoelectric effect in the resonator and is related to the effective coupling coefficient—represented by $K^2_{eff}$. Another way to describe the effective coupling coefficient is as a measure of the efficiency of the conversion between electrical and mechanical energy by the resonator (or filter). It will be noted that the electromechanical coupling coefficient is a material related property of the combination of the piezoelectric film and its associated electrodes.

The level of performance of a filter may be defined by its Factor Of Merit (FOM) which is defined as $FOM=Qmax*K^2_{eff}$.

For practical applications, both a sufficiently high $K^2_{eff}$ and a high Q factor value is desired. However, there is a trade-off between these parameters. Although $K^2_{eff}$ is not a function of frequency, the Q-value is frequency dependent and therefore the FOM (Factor of Merit) is also a function of frequency. Hence the FOM is more commonly used in filter design than in the resonator design.

Depending on the application, in many cases, the device designers can tolerate a lowering in the $K^2_{eff}$ in order to achieve a high Q factor where a small sacrifice in $K^2_{eff}$ gives a large boost in the Q value. However, the opposite approach of sacrificing Q-value to obtain a design having an adequate $K^2_{eff}$ is not feasible.

$K^2_{eff}$ can be enhanced by choosing a high acoustic impedance electrode, and can also be compensated for by adjusting other parameters such as electrode thickness and thicker passivation layers. However its magnitude is largely dictated by the piezoelectric material selected.

There are two main types of BAW resonators (and thus filters): SMR (solidly mounted resonators) and FBAR (Film Bulk Acoustic Resonator resonators.

In the SMR resonator, a Bragg reflector is created under the bottom electrode using a stack of alternating low and high impedance thin film layers, each having a thickness $\lambda/4$, where $\lambda$ is the wavelength of the target frequency. The Bragg reflector stack acts as an acoustic mirror to reflect the acoustic wave back into the resonator.

SMR resonators are easier to manufacture than FBAR resonators; and, since the piezoelectric film is attached directly to the substrate, heat is dissipated more effectively. However, in SMR based filters, only the longitudinal acoustic wave is reflected, but not the shear waves. Consequently SMR filter designs have lower Q factors than FBAR based filters.

In the FBAR resonator a free-standing bulk acoustic membrane which is supported only around its edge is used. An air cavity is provided between the bottom electrode and the carrier wafer. The high Q factor of the FBAR is a great advantage over the SMR.

Fabricating FBAR resonators, filters and other components including an active membrane with adjacent cavities may be costly. Traditional packaging solutions are expensive and have low yields, and since the packaging and segmentation of arrays of packaged components into individual components are late stages of the manufacturing process, poor yields at this stage are extremely costly. There is thus a need for improved packaging solutions and methods of packaging of FBAR related filters, and the present invention is directed to this need.

SUMMARY OF THE INVENTION

A first aspect of the invention is directed to a method of fabricating packaged components, said method comprising the stages of:
a) Obtaining an active membrane layer on a carrier substrate;
b) Depositing a front electrode onto the front of the active membrane layer;
c) Obtaining a front inner section comprising at least a silicon handle or wafer;
d) Attaching the front inner end section to the outer surface of the front electrode;
e) Detaching the carrier substrate from a back surface of the active membrane on the opposite surface from the front surface on which the front electrode is deposited;
f) Optionally trimming the active membrane to a specified thickness;
g) Patterning the active membrane layer into an array of at least one island of membrane;
h) Selectively removing the front electrode and bonding layer;
i) Selectively applying an inner passivation layer;
j) Selectively depositing a back electrode layer and optionally a frame layer and optionally a mass loading layer on the thus exposed back surface of the active membrane;
k) Selectively depositing an outer passivation layer patterned to selectively expose a first route and a second route for respectively routing signals from external contacts to the front and back electrodes;;
l) Selectively depositing a first internal conductive route that is coupled to the back electrode layer and a second internal route that is coupled to the front electrode layer by a part of the back electrode layer isolated from the membrane by way of a filled through-via traversing the inner passivation layer;
m) Optionally thinning the handle or wafer to a desired thickness;
n) Creating an array of at least one front cavity by selectively removing at least the silicon handle or wafer of the front inner end section, to fabricate a cavity opposite each island of membrane;
o) Obtaining a front outer end section and bonding the front outer end section to the front inner end section such that the front outer end section spans across and seals the at least one cavity of the array of front cavities;
p) Optionally thinning the front outer end section;
q) Optionally trimming the exposed outer passivation layer;
r) Applying an organic back end comprising a selectively deposited inner organic layer comprising an array of back cavities therethrough, comprising one back cavity and a pair of through via holes per trimmed island of active membrane, wherein the through via holes are opposite the internal pads of the routing layer, and are open to the routing layer through the apertures in the outer passivation layer, and further comprising back trenches through the inner organic layer, opposite the region wherein the silicon handle or wafer of the front inner layer is exposed by the patterning of the silicon oxide and inner passivation layer;
s) Selectively applying a back outer organic layer onto the back inner organic comprising through via holes over the through via holes in the back inner organic layer and extensions to the back trenches, thereby creating deep trenches, but spanning and sealing the at least one upper cavity;
t) Optionally fabricating deep trenches on the front side of the package, wherein said deep trenches on the front side are aligned with the deep trenches on the back side of the package and traverse the front outer layer and any package bonding layer to the silicon handle or wafer of the front inner layer;
u) Optionally applying a sealing liner coating onto the outer surface of both the back and front ends and into the deep trenches, and then removing the sealing liner coating from in and around the via holes;
v) Filling the array of via holes through the outer and inner organic layers with a metal that contacts the conductive inner pad layer to create filled vias and extending the filled vias to create external pads;
w) Applying a barrier layer and solder bumps to the external pads of the filled vias;
x) Reflowing the solder bumps;
y) Optionally thinning the back outer layer of the front end section;
z) Dicing arrays into separate component dies.

Typically, the carrier substrate is selected from the group of:
a c-axis <0001> single crystal sapphire membrane covered with a c-axis <0001> single crystal GaN release layer; and
a single crystal <111> or <110> or <100> silicon wafer covered with a c-axis <0001> single crystal GaN release layer.

In preferred embodiments, at least one of the following limitations is true:
the active membrane layer comprises a piezoelectric material selected from the group comprising c-axis-oriented $Sc_xAl(1-x)N$ henceforth ScAlN, c-axis-oriented $Al_xGa_{(1-x)}N$ henceforth AlGaN, AlN, $Ba_xSr_{(1-x)}TiO_3$ henceforth BST, $LiNbO_3$ at YX1/36° and $LiTaO3$ at YX1/42° to YX1/52°;
the active membrane layer is up to 2 microns thick;
the active membrane layer is up to 1 micron thick;
the active membrane comprises a highly oriented crystalline membrane;
the active membrane comprises a single crystal membrane.

Typically, the active membrane layer comprises a material selected from:
$Sc_xAl_{(1-x)}N$ and step a) comprises a preliminary step of applying a seed layer of $Sc_xAl_{(1-x)}N$ or $Al_xGa_{(1-x)}N$ onto the GaN release layer where the seed layer has an x value different from the x value of the main $Sc_xAl_{(1-x)}N$ film membrane;
AlN and step a) comprises a preliminary step of applying a seed layer of $Sc_xAl_{(1-x)}N$ or $Al_xGa_{(1-x)}N$ onto the GaN layer;

$Al_xGa_{1-x}N$, and step a) comprises a preliminary step of depositing a c-axis-oriented AlN seed layer onto the GaN layer and gradually increasing the gallium content;

$Ba_xSr_{(1-x)}TiO_3$, and step a) comprises at least one preliminary step selected from the group of depositing a seed layer comprising <100> $TiO_2$ (rutile); a seed layer comprising <111> single crystal $SrTiO_3$ or a double seed layer comprising a layer of $TiO_2$ followed by a seed layer of $SrTiO_3$ onto the GaN release layer prior to depositing the $Ba_xSr_{(1-x)}TiO_3$.

$LiNbO_3$ at YX1/36° or $LiTaO_3$ at YX1/42° to YX1/52° and the carrier comprises a silicon wafer.

Preferably, the active membrane layer comprises a piezoelectric material and a piezoelectric seed layer is provided on a surface of the piezoelectric material adjacent to a surface of the front electrode, to a surface of the back electrode or adjacent to surfaces of both electrodes, the piezoelectric material comprising:

$Sc_xAl_{1-x}N$ and the seed layer comprising $Sc_xAl_{1-x}N$ having a different stoichiometry (x value) than the bulk piezoelectric layer;

AlN and the seed layer comprising $Sc_xAl_{1-x}N$;

$Al_xGa_{1-x}N$ and the seed layer comprising $Al_xGa_{(1-x)}N$ having a different stoichiometry (x value) than the bulk piezoelectric layer.

Typically the seed layers are characterized by at least one of the following limitations:

each seed layer has a thickness in the range of 3 nm to 100 nm.

each seed layer and the active membrane layer are deposited by a technology selected from the group comprising MOCVD, RF sputtering, molecular beam epitaxy; sputtering followed by MBE and MBE followed by sputtering.

a plurality of thin seed layers are stacked on one or both sides of the active layer, each one having slightly different proportions of dopant to gradually vary the composition, enabling lattice matching with the GaN release layer and/or with the electrodes subsequently deposited thereonto.

Typically step (b) comprises at least one of the following limitations:

a preliminary step of ion beam etching with argon or nitrogen to trim the thickness of the piezoelectric layer prior to subsequent deposition of the front electrode by sputtering or by Molecular Beam Epitaxy;

the trimming of the piezoelectric layer comprising removal of between 3 nm and 100 nm of material to ensure surface cleanliness and to reduce roughness, thereby ensuring good adhesion of the front electrode to be deposited thereupon;

the front electrode deposited having a thickness in the range of 50 nm to 350 nm;

the front electrode being selected from the group comprising Mo, W, Ti—W and Ru and being deposited either by sputtering or by MBE;

the front electrode comprising molybdenum deposited with a very strong crystalline texture; and the front electrode comprising molybdenum deposited as single crystal films.

In some embodiments, steps a) and b) comprise fabricating an active membrane of highly oriented crystalline ScAlN by applying a ScAlN seed layer having a stoichiometry of $Sc_{0.1}Al_{0.9}N$ and lattice spacing of 3.15 Å onto a GaN release layer on a single crystal sapphire or a silicon carrier; depositing $Sc_xAl_{1-x}N$ piezoelectric membrane thereover, followed by a second $Sc_{0.1}Al_{0.9}N$ seed layer and then depositing a front electrode of highly oriented crystalline molybdenum thereover.

Some variant methods comprise removal of the piezoelectric layer from the carrier substrate and removal of the GaN release layer, and depositing a back electrode of highly oriented crystalline molybdenum onto the back surface of the piezoelectric membrane.

Optionally step a) comprises depositing a highly oriented crystalline active membrane of $Sc_xAl_{(1-x)}N$ onto a GaN release layer on a single crystal sapphire or silicon carrier followed by a first seed layer having a stoichiometry of $Sc_{0.1}Al_{0.9}N$ and lattice spacing of 3.15 Å onto the active membrane layer and step b) comprises depositing a front electrode of highly oriented crystalline molybdenum thereover.

Optionally, following removal of the piezoelectric layer from the carrier substrate and removal of the GaN release layer, a second $Sc_{0.1}Al_{0.9}N$ seed layer is deposited onto the back surface of the piezoelectric layer and then a back electrode of highly oriented molybdenum is deposited onto the second seed layer.

Typically, the front inner section of step c) is selected from the group comprising:

a silicon wafer having a resistivity exceeding 3000 ohm*cm;

a silicon wafer having a resistivity exceeding 3000 ohm*cm and a silicon oxide layer deposited onto the silicon wafer;

a silicon wafer having a resistivity exceeding 3000 ohm*cm and a silicon wafer membrane coupled to the silicon wafer by a silicon oxide BOX (Buried OXide) layer.

Optionally, step (d) of attaching the front inner section to the front electrode comprises applying a first bonding layer on to the first electrode, and attaching a second bonding layer to the surface of the front inner section, and then fusing the two bonding layers together.

Typically, step d) further comprises at least one of the following limitations:

the two bonding layers are identical and are selected from the group of Au—In, Au, AlN, ScAlN and $SiO_2$;

the bonding layers are applied by a technique selected from the group comprising sputtering, MBE and PECVD;

depositing an adhesion layer comprising Ti or Ti—W between the first bonding layer and the first electrode and/or between the second bonding layer and the silicon oxide surface; and the front inner section comprises a silicon wafer having a resistivity exceeding 3000 ohm*cm and a bonding layer of silicon oxide is deposited onto the silicon wafer by PECVD or grown in situ on the silicon wafer, and a silicon oxide bonding layer is applied to the front electrode by PECVD, and step d) of attaching the front inner section to the front electrode comprising fusing together the silicon oxide layer on the first electrode and the silicon oxide layer of the front inner section.

Typically, step e) of detaching the carrier comprises a step selected from:

grinding away the carrier to expose the GaN and then removing any residual GaN by ICP plasma, and laser lift-off.

In some embodiments, the carrier comprises a sapphire single crystal wafer coated with GaN and the laser lift off comprises irradiating the GaN through the sapphire using a 248 nm excimer square waveform laser. Residual GaN may then be removed with ICP plasma.

Typically, step (e) further comprises at least one further limitation selected from at least one of:
  removing GaN by inductive coupled plasma, and
  the GaN layer having a thickness ranging from 0.5 µm to 5 µm.

Typically, step f) of trimming the active membrane to a desired thickness comprises at least one of:
  applying a scanning surface ion milling process over the surface of the active membrane; and
  obtaining the trimmed piezoelectric surface with an average surface roughness of below 0.3 nm.

Optionally, step g) of patterning the active membrane layer into an array of at least one island of membrane comprises at least one of:
  selectively etching away the active membrane layer to fabricate an array of at least one discrete island, and
  etching with a technique selected from the group including induction coupled plasma etching, wet etching, a two-stage etching comprising etching with induction coupled plasma followed by etching with a wet etchant, and etching with a wet etchant followed by etching with induction coupled plasma.

Typically, step h) of selectively removing the front electrode and bonding layer comprises ion beam etching and/or ion milling.

Optionally, the front inner end comprises a silicon wafer membrane attached to a silicon wafer handle by a buried silicon oxide (BOX) layer, and the step of selectively removing the silicon membrane from around the at least one island of active membrane comprises ICP or RIE etching.

Optionally, step i) of selectively applying an inner passivation layer over the back surface of the front of the package, over the front electrode and around and over the edges of the active membrane layer leaving exposed areas on the piezoelectric surface and access to the top surface of the front side electrode comprises at least one of the following limitations:
  depositing a material having a low relative permittivity (dielectric constant K) of K≤4.
  depositing a material selected from the group consisting of $SiO_2$, Fluorine-doped Oxide (SiOF), Porous Silicon Oxide and Carbon-doped Oxide (SiCO).
  depositing a material by PECVD.

Optionally, step j) of selectively depositing a back electrode onto the inner passivation layer and the back of the piezoelectric islands comprises at least one of the following limitations:
  the back electrode material is deposited by sputtering;
  the back electrode material is deposited by molecular beam epitaxy MBE;
  the back electrode material is selected from the group consisting of Mo, W, Ti—W and Ru;
  the back electrode has a thickness in the range of 50 nm to 350 nm;
  depositing the back electrode material is applied as an all-over coating and then selectively removing excess back electrode material;
  step j) comprises an additional step of depositing a raised frame of the same material as the back electrode defining a perimeter around the back electrode opposite the front cavity.

Optionally, the active membrane layer comprises $Sc_xAl_{1-x}N$, and step j) comprises at least one preliminary step of applying a seed layer of $Sc_xAl_{1-x}N$ onto the GaN release layer where the X value (stoichiometry) of the seed layer is different than the x value of the main $Sc_xAl_{1-x}N$ membrane and at least one of the following limitations is true:
  the back electrode comprises molybdenum deposited with a very strong crystalline texture or as a single crystal film.
  the active membrane further comprising outer seed layers of $Sc_{0.1}Al_{0.9}N$ and one or more inner $Sc_xAl_{(1-x)}N$ seed layers to gradually bring the stoichiometry (Sc:Al ratio) to that of the main piezoelectric membrane.

In some embodiments, an individual die comprises an array of resonators coupled together to create a filter and a mass loading layer of the same material as the back electrode is selectively patterned over the entire back electrode of certain resonators within the filter die.

Typically, at least one of the following limitations is true:
  the mass loading layer reduces the central frequency of certain resonators, such as shunt resonators, when compared to the central frequency of other resonators, such as series resonators within the same filter die;
  a desired thickness of the mass loading layer is in the range of from 5 nm to 200 nm and the desired thickness is dependent on the materials of the electrodes and piezoelectric membrane and on the desired resonant frequency.

Optionally Step k) comprises applying an outer passivation layer over the entire surface of the back electrode surface, frame, mass loading layer and the inner passivation layer, and then patterning the outer passivation layer to create first and second routes for coupling first and second external contacts to front and back electrodes respectively.

In some embodiments, the outer passivation layer is selected from the group of AlN, ScAlN and SiN and has a thickness in the range of between 50 nm and 150 nm.

Typically, the outer passivation layer is etched away from the surface of the inner passivation layer and the outer passivation layer, any mass loading layer, the raised frame and the back electrode layer are patterned in a single step, thereby ensuring sharp clean edges of the vibrating part the back side electrode as defined by the raised frame.

Optionally, step l) comprises selectively depositing an conductive routing material onto the back surface of the stack within the first route in the outer passivation layer for coupling to the front electrode via the back electrode material in a section of the back electrode layer disconnected from the back of the membrane by a through via that traverses the passivation layer, and a second route which couples to the back electrode.

Typically, at least one of the following limitations is true:
  the conductive routing material comprises gold and is deposited by sputtering through a photoresist lift off process, and
  an adhesion layer selected from the group of titanium, titanium-tungsten and chromium is applied to enhance the adhesion between the conductive routing material and the back electrode layer.

Optional step (m) of thinning the silicon handle (or wafer) may comprise attaching a temporary carrier wafer to the back of the work-piece with a temporary organic bonding material and then thinning the silicon handle to a thickness of less than 200 microns, and preferably to a thickness of about 50 microns.

Typically, at least one of the following limitations is true:
  the temporary organic bonding material is selected from the group comprising resin, polyester, wax and rubber.

the temporary organic bonding material is removed by at least one of thermal debonding, chemical attack, exposure to UV laser irradiation.

the thinning comprises at least one technique selected from the group of grinding, polishing and Chemical Mechanical Polishing (CMP).

Optionally, step (n) of creating an array of front cavities comprises applying a through silicon via etch (TSV) through a photo-resist protection mask to create an array of at least one front cavity through the silicon handle or wafer opposite an island of resonator, and having the same shape as an area of a back electrode defined by a raised frame, and at least the same size thereof, and is coaligned therewith.

Typically at least one of the following limitations is true:
the front inner section comprising a silicon wafer that is adhered to the front side electrode by a bonding layer, and following fabricating at least one cavity in the silicon wafer, the bonding layer within the at least one cavity is removed, exposing the front electrode on the front side of the active membrane spanning across the at least one front cavity thus formed;

the front inner section further comprises a silicon oxide layer on the silicon handle and the method comprises selectively removing the silicon oxide from within the at least one cavity by at least one process selected from: chemical etching with HF vapor, etching with a BOE (Buffered Oxide Etch) solution containing HF as an active ingredient; etching with ICP and RIE etching;

the inner section comprises a silicon membrane attached to a silicon wafer handle by a silicon oxide BOX layer and the silicon membrane of the inner section is adhered to the front electrode on the front surface of the active membrane layer, and the silicon membrane, bonding layer and any adhesion layer are etched away from within the at least one cavity, exposing the unsupported front electrode to the front cavity on the front side of the active membrane;

any $SiO_2$ is removed from within the cavity by a technique selected from etching with HF vapor, by a BOE (Buffered Oxide Etch) solution containing HF as an active ingredient, by ICP or by RIE etching;

the bonding layer comprises Au or Au—In, and is removed from within the cavity to expose the front electrode, by etching with a KI/I2 wet solution;

any adhesion layer of Ti or Ti—W between the bonding layer and the front electrode and/or between the bonding layer and the front inner section are removed by dry etching from within the cavity, thereby exposing the front electrode;

the bonding layer comprises AlN or ScAlN, and is removed from within the cavity to expose the front electrode, by Induction Coupled Plasma (ICP) using $BCl_3$ and/or $Cl_2$ and/or diluted tetra methyl ammonium hydroxide (TMAH) wet solution.

Optionally, step o) of applying a front outer end section comprises adhering a continuous front outer section to the silicon handle wherein the front outer section comprises an insulating material or a dielectric material having high resistivity.

Typically, wherein the front outer end section comprises one of the group of:
a silicon wafer having an electrical resistivity larger than 3000 Ohm-cm.
a glass wafer;
an AlN wafer, and
a sapphire wafer.

Optionally, the front outer end section is bonded to the outer layer of the front inner section by a permanent package bonding material.

Typically, the package bonding material used for bonding the wafer to the outer layer of the front inner section comprises a layer of an organic adhesive having at least one of the following limitations:
a thickness in the range of between 5 µm and 50 µm.
is selected from the group consisting of SU-8, PDMS, PBO, epoxy, TMMF and ink jetable die attach polymers.

Optionally, the package bonding material used to bond the wafer to the outer layer of the front inner section comprises gold or gold indium applied as thin coatings to outer surfaces of the front inner section and outer surface of the front outer section and then fusing the thin coatings together.

Typically, in optional step q), the front outer layer is thinned by at least one of grinding, chemical polishing and Chemical Mechanical Polishing (CMP) to a final thickness of less than 150 microns.

Optionally in step o), the outer layer of the front section comprises a thick organic layer that is available as a dry film, thereby dispensing with the need for a package bonding layer.

Typically, in optional step r) the exposed outer passivation layer is trimmed by reducing the outer passivation layer to a desired thickness.

Typically, at least one of the following limitations is true:
a typical thickness of the outer passivation layer before trimming is in the range of from 200 nm to 300 nm.
the thickness of the outer passivation layer after trimming is determined by the desired frequency response of the filter.
different post trimming thicknesses are specified for different filters cofabricated on a same wafer.
if a temporary carrier wafer was previously attached to the back side of the work-piece it is removed prior to the trimming process by applying at least one of heat, a suitable solvent, UV exposure or laser radiation to the temporary organic bonding material.

Optionally step s) of selectively applying an organic back end inner layer onto the upper passivation layer comprises laminating an organic photosensitive dielectric layer over the upper passivation layer and developing it to create via holes, trenches extending through the upper and lower passivation layers, any silicon membrane and silicon oxide layer down to the silicon wafer.

Typically, at least one of the following limitations is true:
the organic back inner layer is photo-sensitive and is applied as one of a continuous dry film, a spin coating and a spray coating; and
the organic back inner layer comprises a material selected from the group of SU-8, PDMS, epoxy, PBO, TMMR and TMMF.

Optionally, step t) comprises depositing a back outer organic layer onto the back inner organic layer that spans and seals the at least one upper cavity, extending the via holes and trenches.

Typically at least one of the following limitations is true:
the outer organic back layer comprises an organic photosensitive dielectric available as a dry film; the outer organic back layer comprises PBO or TMM; and
the inner and back outer organic layers are fabricated from the same material.

Optionally, protection of the packaged components against humidity is provided by underfill and over-mold materials that are part of the RF module package that comprises the filter flip chip die.

Some embodiments, further comprise selectively applying a sealing coating material onto the package outer-surfaces, covering all exposed organic surfaces to further seal the flip chip filter device.

Optionally, the back inner organic layer is patterned with back cavities, through via holes and deep trenches, and the outer organic layer seals the back cavities but extends the through via holes and the deep trenches.

Typically, optional step u) comprises fabricating deep trenches on front side of the package array, wherein the deep trenches on the front side are aligned with the deep trenches on the back side of the package array and traverse the front outer layer, and any package bonding layer to the silicon handle or wafer of the front inner layer.

Optionally, the front outer layer comprises silicon or glass, and said deep trenches are fabricated by deep ion etching or by plasma etching.

Optionally, step v) of applying a sealing liner coating onto the outer surface of the front and back end, into the deep trenches on the back end, and into any deep trenches in the front end, comprises applying a coating resistant to moisture absorption that seals the organic materials and prevents damage due to humidity adsorption.

Typically, the sealing liner coating has at least one of the following limitations:
the sealing liner is selected from the group of AlN, SiN, $Ta_2O_5$ and TaN;
said sealing liner coating is deposited to a thickness with the range of from 100 nm to 500 nm;
said sealing liner coating is applied by RF sputtering at a deposition temperature of less than 250° C.;
said sealing liner coating is selectively removed from the via holes and therearound by a dry etching technique.

In some embodiments, step w) of filling the through via holes comprises depositing and patterning a photoresist layer over the back end to expose the via holes, depositing a seed layer that optionally comprises an adhesion layer such as titanium, chromium or titanium-tungsten followed by a thin copper layer that is typically up to 1 μm thick on to the outer surface of the back end and into the through via holes, selectively filling up the via hole with copper by electroplating, and generating external pads.

In some embodiments, step x) comprises electroplating a Ni barrier layer in the range of 1 μm to 5 μm, followed by applying solder, tin, SnAg or lead free solderable bumps.

In some embodiments, in step x) the seed layer of step w) is etched away and the bumps are reflowed to generate wafer level flip chip contacts.

Optionally, the front outer layer of the work-piece comprises silicon or glass without a sealing liner layer and trenches, and in step y) the back of the work-piece is attached to a UV removable tape and then the silicon or glass front outer layer is thinned by a process selected from the group consisting of grinding, chemical polishing and Chemical Mechanical Polishing (CMP), to a desired thickness.

In some embodiments, step z) of dicing the array into individual packaged electronic components, using at least one of a dicing blade, a plasma cutting technique and a laser.

A second aspect of the invention is directed to a package for an electronic component wherein the package comprises a front end, a back end, and an active membrane layer sandwiched between front and back electrodes of conducting material; wherein the front electrode has a surface that extends beyond an adjacent surface of the active membrane layer, the active membrane is mechanically supported by a front end and covered by a back end comprising at least one back cavity having organic walls and lid, with filled through vias traversing the organic walls and lid for coupling to the electrodes by an internal routing layer; the vias being coupleable by external solderable bumps to a circuit board for coupling the package in a flip chip configuration.

Typically, the package comprises at least one of the following limitations:
the package comprises at least one front cavity in the front end on an opposite side of the active film from the at least one back cavity.
the active membrane layer comprises a piezoelectric membrane.
the package comprises an electronic component.

In some embodiments, the package comprises resonators or arrays of resonators providing a filter.

In some embodiments, the electronic component comprises an RF filter comprising a plurality of resonators in series and shunt, each resonator having dedicated back and front cavities.

In some embodiments, the active membrane layer comprises a piezoelectric membrane selected from the group comprising $Ba_xSr_{(1-x)}TiO_3$ henceforth BST, c-axis-oriented $Sc_xAl_{(1-x)}N$ henceforth ScAlN, $Al_xGa_{(1-x)}N$ henceforth AlGaN, AlN, $LiNbO_3$ and $LiTaO_3$.

In some embodiments, the package further comprises at least one of the following limitations:
the active membrane layer further comprises one or more piezoelectric seed layers adjacent to a surface of the front electrode and/or to a surface of the back electrode;
the piezoelectric layer and the seed layer each comprise $Sc_xAl_{1-x}N$, and the one or more seed layers have a relative proportion of aluminum that is different to the relative proportion of aluminum to scandium in the piezoelectric layer;
the active membrane layer comprises a piezoelectric membrane of $Sc_xAl_{1-x}N$ and a first seed layer of $Al_xGa_{1-x}N$ adjacent to the surface of the front electrode and a second seed layer of $Sc_xAl_{1-x}N$ adjacent to the surface of the back electrode wherein said second seed layer has a relative proportion of aluminum that is different to the relative proportion of aluminum to scandium in the piezoelectric layer;
the active membrane layer comprises a piezoelectric membrane of AlN and the seed layer comprises $Sc_xAl_{1-x}N$;
the active membrane layer comprises a piezoelectric membrane of $Al_xGa_{1-x}N$ and the seed layer comprises $Al_xGa_{1-x}N$ having a different proportion of Aluminum to Gallium (x value) to that of the active membrane layer;
the active membrane layer comprises a piezoelectric membrane that is highly oriented in the c-axis direction, and
the active membrane layer comprises a single crystal piezoelectric membrane.

In some embodiments, the front and back electrode comprise a refractory metal having at least one of the following limitations:
high acoustic velocity, low acoustic attenuation and a highly oriented crystalline structure;
the front electrode is selected from the group comprising molybdenum, tungsten, titanium-tungsten and rubidium;
the back electrode is selected from the group comprising molybdenum, tungsten, titanium-tungsten and rubidium, and the front electrode and the active membrane have ultra flat surfaces (roughness<0.3 nm) and the front electrode has a high crystal orientation with respect to the active membrane.

Optionally, the active membrane layer comprises a highly oriented crystalline piezoelectric membrane of $Sc_xAl_{1-x}N$ with a desired stoichiometry, which is deposited by first applying a ScAlN seed layer having a stoichiometry of $Sc_{0.1}Al_{0.9}N$ onto a GaN release layer provided on a single crystal sapphire carrier prior to deposition of the highly oriented crystalline piezoelectric membrane of $Sc_xAl_{1-x}N$ with a desired stoichiometry.

Typically, at least one of the following limitations is true:
a second seed layer having a stoichiometry of $Sc_{0.1}Al_{0.9}N$ is deposited onto the highly oriented crystalline piezoelectric membrane of $Sc_xAl_{1-x}N$ with a desired stoichiometry and a first electrode comprising a highly oriented or a single crystal layer of molybdenum, is grown on the second $Sc_{0.1}Al_{0.9}N$ seed layer, and subsequent to removal of the piezoelectric layer from the carrier substrate and the GaN, a second electrode of highly oriented or single crystal molybdenum is grown onto the thus exposed seed layer.

In some embodiments, the active membrane layer comprises a highly oriented crystalline active membrane of $Sc_xAl_{1-x}N$ that is deposited onto a c-axis <0001> single crystal GaN release layer, provided on a c-axis <0001> single crystal sapphire carrier or a <111> or <110> or <100> silicon wafer carrier, followed by a first seed layer having a stoichiometry of $Sc_{0.1}Al_{0.9}N$ onto the active membrane layer and then depositing a front electrode of highly oriented crystalline molybdenum onto the first seed layer.

In some embodiments, following removal of the piezoelectric layer from the carrier substrate and removal of the GaN release layer, a second $Sc_{0.1}Al_{0.9}N$ seed layer is deposited onto the back surface of the piezoelectric layer exposed by removal of the GaN release layer, followed by depositing a back electrode of highly oriented molybdenum that is deposited onto the second seed layer.

In some embodiments, the active membrane layer comprises a piezoelectric membrane, and a section of the back electrode with a raised frame there around and the front side cavity adjacent to the front electrode both have the same pentagonal shape and are concentrically aligned; the front side cavity being at least as large as the shape of the back electrode as defined by the raised frame.

In some embodiments, the active membrane layer comprises a piezoelectric membrane having a top surface, a bottom surface and edges, and the package further comprising an inner passivation material around the edges of the active membrane.

Typically, at least one of the following limitations is true:
the inner passivation material comprises a low permittivity dielectric material having a dielectric constant K such that K≤4;
the inner passivation material is selected from the group comprising $SiO_2$, Fluorine-doped Silicon Oxide (SiOF), Porous Silicon Oxide and Carbon-doped Silicon Oxide (SiCO);
the back electrode selectively covers the back surface of the active membrane and the inner passivation material;
the package further comprises a raised frame around at least part of the back surface of the active membrane, the raised frame being deposited onto the back electrode wherein the raised frame comprises the conductive material of the back electrode.

In some embodiments, some resonators within a multiple resonator filter package further comprise a mass loading layer covering entire vibrating part of the back electrode and the mass loading layer comprises the conductive material of the back electrode.

In some embodiments, the back end of the package comprises an outer passivation layer covering the back side electrode area and frame and said outer passivation layer has first and second routes patterned therein, selectively exposing the back side electrode metal surface outside the vibrating part of the back electrode.

Typically, the package further comprises at least one of the following limitations:
the outer passivation layer comprises a material selected from the group of AlN, ScAlN and SiN.
thickness of the outer passivation layer covering different resonators within a filter unit varies between filters.
an internal conductive routing layer comprising gold is deposited over the back electrode within the routes in the outer passivation layer
The package of claim 1 wherein, the back end of the package comprises an inner patterned back layer of a photo-sensitive polymer defining side walls of the back cavity, and a back outer layer comprising a photo-sensitive polymer.

Typically, at least one of the following limitations is true:
the back inner layer of photo-sensitive polymer is selected from the group comprising SU-8, PDMS, epoxy, PBO, TMM provided as a resin or film.
the back outer layer of photo-sensitive polymer is provided as a dry film.
the back inner support layer and the back outer layer comprises the same polymer.

Typically, the package further comprises a front inner section comprising: a high resistivity silicon wafer, and a front cavity formed within the front inner section, adjacent to the front electrode on the active membrane layer and formed with the front inner section.

Optionally, the front inner section further comprises a layer of silicon oxide on the inner surface of the silicon wafer and said front cavity lies within both the silicon wafer and within the layer of silicon oxide and the front electrode is exposed within the cavity.

In some embodiments, the front inner section is bonded to the front electrode by a bonding layer.

Optionally, the bonding layer is selected from the group consisting of Au—In, Au, AlN, ScAlN and $SiO_2$.

In some embodiments, the front inner section and the front electrode each have ultra flat surfaces (roughness<0.3 nm).

Optionally, the front inner section further comprises a layer of silicon membrane attached to the layer of silicon oxide on an opposite side of the silicon oxide from the silicon handle by a bonding layer and the silicon membrane and bonding layer are removed from within the cavity to expose the front electrode within the cavity.

In some embodiments, the front inner section further comprises a layer of silicon membrane attached to the layer of silicon oxide on an opposite side of the silicon oxide from the silicon handle by a bonding layer and the silicon membrane and bonding layer are retained adhered to the front electrode and spanning the at least one front cavity.

Optionally, the front inner section is bonded to the front electrode by a bonding layer.

Typically, the bonding layer is selected from the group consisting of Au—In, Au, AlN, ScAlN and $SiO_2$.

In some embodiments, the bonding layer comprises Au or Au—In, and to facilitate adhesion of the bonding layer to at least one of the front electrode and/or to the front inner section, adhesion layers of Ti or Ti—W are used.

Preferably, the bonding layers and, if present, adhesion layers used to attach then bonding layers to the front electrode material and to the front inner section of the package, are removed from the within the cavity to expose the front electrode.

In some embodiments, the bonding layer comprises a first layer of AlN or ScAlN attached to the front electrode and a second layer of AlN or ScAlN attached to the inner face of the front inner part of the front end of the package, the two bonding layers being fused together.

Optionally, the bonding layer is removed from within the front cavity by Induction Coupled Plasma (ICP) using $BCl_3$ and/or $Cl_2$ and/or aqueous tetra methyl ammonium hydroxide (TMAH) solution to expose the front electrode to the cavity.

Alternatively, the bonding layer comprises $SiO_2$ and is removed from within the cavity to expose the front electrode, by etching with HF vapor, by a BOE (Buffered Oxide Etch) solution containing HF as an active ingredient, by ICP etching or by RIE etching.

Optionally, the inner section is coupled to an outer section that closes the front cavity.

Typically, the package further comprises at least one of the following limitations:
- the front outer section comprises one of: a silicon wafer having an electrical resistivity higher than 3000 Ohm*cm, a glass wafer, a sapphire wafer and an AlN wafer that is attached to the silicon wafer of the front inner section by a package bonding material.
- the package bonding material comprises an organic adhesive;
- the organic adhesive is selected from the group comprising SU-8, PDMS, PBO, epoxy, TMM and Ink Jet Die-attach Polymers; and
- the package bonding material comprises a bonding layer of gold and gold-indium.

In some embodiments, the front inner section is attached to a front outer section comprising a film of an organic material.

Optionally, the front outer section comprises a layer of a photo-sensitive dielectric available as a film.

Optionally, the front outer layer is selected from the group comprising SU-8, PDMS, PBO, epoxy and TMM.

Typically, filled vias traverse the polymeric back of the package and are coupled to the upper and lower electrodes by routing layers within the outer passivation layers, the filled vias being terminated with external pads, a barrier layer and solderable bumps deposited thereover.

Typically, at least one of the following limitations is true:
- the routing layers comprise gold; the filled vias and outer pads comprise copper;
- the barrier layer comprises nickel, and;
- the solderable bumps are selected from the group of materials comprising solder, tin, SnAg or lead free solder.

Optionally, the package may be fabricated as an array of packages comprising deep trenches through the at least the back outer sections and any package bonding material to the silicon handle or wafer.

Optionally, corresponding deep trenches are fabricated through the front outer sections down to the silicon handle.

Typically, a sealing liner layer is applied within the trenches and on both sides of the package to protect the package against moisture.

In some embodiments, the sealing liner layer is selected from the group of AlN, SiN, $Ta_2O_5$ and TaN and has a thickness within the range of between 100 nm and 500 nm.

A third aspect of the invention is directed to a back end for a package for packaging an electronic component, wherein said electronic component is provided on a front end of said package such that on attaching the back end, the electronic component is encased by said package; the back end comprising at least one back cavity having organic walls and lid, and with vias through the back end around said at least one back cavity for coupling to electrodes of the electronic component; the vias being coupleable in a flip chip configuration to a circuit board.

Typically, the back end comprises an inner patterned layer of photosensitive polymer defining side walls of the back cavity and through-via holes, and an outer dry film of photosensitive polymer patterned only with through via holes and deep trenches, that spans and seals said at least one back cavity.

Optionally, the back end comprises the inner organic back layer comprises an organic photosensitive dielectric selected from the group of SU-8, PDMS, epoxy, PBO and TMM.

Optionally, the outer organic back layer is an organic photosensitive dielectric selected from the group consisting of PBO and TMM.

In some embodiments, the back end is fabricated in an array on a substrate; the array further comprises an array of deep trenches through the back end of the package.

Such an array may further comprise a sealing liner coating over the back outer surface of the package and into the deep trenches.

Optionally, the sealing liner coating is selected from the group of AlN, SiN, $Ta_2O_5$ and TaN.

Typically, the back end further comprises a first filled via that passes through the organic back end of the package and is coupled via a routing material deposited in a first route patterned into an outer passivation layer to a back electrode of the electronic component coupled to the back electrode, and a first external pad on the end of the first filled via that is terminated with a barrier layer comprising a coating of nickel, followed by a solderable bump comprising solder, tin, SnAg or lead free solder, and a second filled via that passes through the organic back end of the package and is coupled via a second routing layer deposited into a second route patterned into the outer passivation layer which is coupled by a through-via in the inner passivation layer to a front electrode, and having a second external pad on the end of the second filled via that is terminated with a barrier layer comprising a coating of nickel, followed by a solderable bump comprising solder, tin, SnAg or lead free solder.

Optionally, the electronic component comprises an active membrane trapped between front and back electrodes.

Typically, the active membrane comprises a piezoelectric membrane and the front and back electrodes comprise refractory metal having high acoustic velocity.

In some embodiments, the piezoelectric membrane comprises a material selected from the group comprising $Ba_xSr_{(1-x)}TiO_3$ henceforth BST, c-axis-oriented $Sc_xAl_{(1-x)}N$ henceforth ScAlN, $Al_xGa_{(1-x)}N$ henceforth AlGaN, AlN, $LiNbO_3$ and $LiTaO_3$.

Optionally, a single crystal active membrane of ScAlN comprises a seed layer of ScAlN having at least one of the following limitations:

a different stochiometry than the active membrane onto a surface of a GaN layer provided on a single crystal sapphire or silicon carrier.

a stoichiometry of $Sc_{0.1}Al_{0.9}N$ and a lattice spacing of 3.15 Å.

a second ScAlN seed layer is deposited onto the front of the piezoelectric membrane.

In some embodiments:

the front electrode and the active membrane have ultra flat surfaces (roughness<0.3 nm) and the front electrode has a high crystal orientation with respect to the active membrane.

the front and back electrodes have highly oriented crystalline structures;

the front and back electrodes display low acoustic attenuation.

the front and back electrodes comprise material selected from the group of W, Ru, W—Ti or Mo, the back and front electrodes have thicknesses in the range of 50 nm to 350 nm.

the front and back electrodes each comprise single crystal layers films. The back end of claim 15 wherein the back electrode comprises molybdenum with a very strong crystalline texture.

the front and/or back electrodes comprise single crystal thin film molybdenum having thicknesses in the range of 50 nm to 350 nm;

the front electrode and the active membrane have ultra flat surfaces (roughness<0.3 nm) and the front electrode has a high crystal orientation with respect to the active membrane, and the active membrane comprises a highly oriented or single crystal piezo membrane.

In some embodiments, a front end of the package is fabricable over the front electrode and comprises at least one front cavity on an opposite side of the electronic component from the at least one back cavity.

Typically, the back end further comprises a protruding frame comprising the conductive material of the back electrode that is deposited onto the back electrode around at least part of the back electrode and defines a resonating area of the active layer.

Optionally, the back electrode within a raised frame and the front side cavity adjacent to the front electrode both have a same pentagonal shape and are concentrically aligned; the front cavity being is at least as large as the back electrode.

In some embodiments, the electronic component comprises a resonator or an array of resonators providing a filter.

Optionally, the electronic component comprises an RF filter comprising a plurality of resonators in series and shunt, each resonator having a dedicated upper and lower cavity.

Typically, the front end comprises a silicon wafer having a resistivity exceeding 3000 ohm*cm and at least one front cavity within the silicon handle or wafer.

In some embodiments, the front electrode is attached to the front inner section by a bonding layer selected from the group comprising gold, gold-indium, ScAlN, AlN and $SiO_2$ and at least one of the following restrictions is true:

the front inner section further comprises a layer of silicon oxide, and said front active membrane and said front electrode span said cavity, and said bonding layer attaches the front electrode to the $SiO_2$ layer of the front inner section around said cavity.

the bonding layer comprises Au or Au—In, and to facilitate adhesion of the bonding layer to at least one of the front electrode and/or to the front inner section, adhesion layers of Ti or Ti—W are used.

said barrier layer and any adhesion layers are removed from the within the cavity to expose the front electrode;

the bonding layer comprises AlN or ScAlN attached to both the front electrode and to a silicon inner surface of the front part of the front end of the package, and then fused together.

the bonding layer comprises AlN or ScAlN and is removed from within the front cavity by Induction Coupled Plasma (ICP) using $BCl_3$ and/or $Cl_2$ and/or diluted tetra methyl ammonium hydroxide (TMAH) wet solution to expose the front electrode to the cavity.

the bonding layer comprises $SiO_2$;

the bonding layer comprises $SiO_2$ and the bonding layer is removed from within the cavity to expose the front electrode by etching with HF vapor, by a BOE (Buffered Oxide Etch) solution containing HF as an active ingredient, by ICP etching or by RIE etching.

In some embodiments, the front inner section further comprises a layer of silicon membrane attached to a layer of silicon oxide on an opposite side of the silicon oxide from the silicon wafer and the bonding layer attaches said front electrode to said silicon membrane. In some embodiments, the silicon membrane spans the front cavity and supports the electrode and active membrane, and in other embodiments, the silicon membrane is removed from within the front cavity, exposing the front electrode.

Typically, the front inner section is coupled to a front outer section that closes the front cavity.

Typically, at least one of the following limitations is true:

the front outer section is selected from the group comprising an insulator, a dielectric or a semiconductor having a resistivity exceeding 3000 ohm*cm;

the front outer section is selected from the group comprising: a silicon wafer having a resistivity exceeding 3000 ohm, a glass wafer, a sapphire wafer and an AlN wafer;

the front outer section is attached to the front inner section by a package bonding material comprising an organic adhesive;

the front outer section is attached to the front inner section by a package bonding material comprising SU-8, PDMS, PBO, epoxy, and ink jetable die attach polymers;

the front outer section is attached to the front inner section by a package bonding material comprising a bonding layer of gold or gold-indium;

the front outer section comprises a layer of polymer provided as a dry film;

the front outer section is fabricated from a material selected from the group comprising SU-8, PDMS, PBO, epoxy and TMM.

Typically, the back end is fabricated in an array with back deep trenches around each package through to a silicon wafer or handle of the front inner layer.

Optionally, the back of the package further comprises a sealing liner coating around the package and into the deep trenches that provides protection against humidity, and said sealing liner coating is selected from the group comprising AlN, SiN, $Ta_2O_5$ and TaN.

Typically, the front section comprises deep trenches corresponding to the deep trenches in the back section, and may further comprise a sealing liner coating around the package and into the deep trenches that provides protection against humidity.

In some embodiments, the active membrane has a back surface, a front surface and edges, and the back part of the package further comprises an inner passivation material around the edges of the active membrane and overlapping a perimeter of the front surface.

Typically, at least one of the following limitations is true:
the inner passivation material comprises a dielectric material having a low relative permittivity such that K≤4;
the inner passivation material is selected from the group comprising $SiO_2$, Fluorine-doped Silicon Oxide (SiOF), Porous Silicon Oxide and Carbon-doped Silicon Oxide (SiCO).

Typically, the back end further comprises an outer passivation layer that selectively covers the back electrode area and frame leaving the outer surface of the inner passivation exposed and said outer passivation layer is patterned with routes for coupling the front and back electrodes to the first and second external contacts.

Typically, an internal conductive routing layer comprising gold is deposited over the back electrode within the routes patterned into the outer passivation layer.

Typically, the outer passivation coating is selected from the group comprising AlN, ScAlN and SiN.

Optionally, the packages are typically fabricated in an array and deep trenches pass through the back end around components of the array.

In some embodiments, the array of back ends of the packages is coupled to an array of front sections of the package, and an array of front trenches is fabricated in the front array down to the silicon handle or wafer of the front inner layer that corresponds to the array of deep trenches in the back section, and the front and back surfaces and any deep trenches are coated with a sealing liner coating that protects against moisture absorption.

Typically, the sealing liner coating is selected from the group comprising AlN, SiN, $Ta_2O_5$ and TaN.

A fourth aspect is directed to a method for fabricating an array of the back end for a back end for a package for packaging an electronic component, wherein the electronic component is provided on a front end of said package such that on attaching the back end, the electronic component is encased by said package; the back end comprising at least one back cavity having organic walls and lid, and with vias through the back end around said at least one back cavity for coupling to electrodes of the electronic component; the vias being coupleable in a flip chip configuration to a circuit board, the method comprising:

obtaining an array of electronic components each comprising at least one island of membrane layer sandwiched between front and back electrodes, with a front end of the package below the front electrode, and having conductive contacts to the back and front electrode;
depositing an inner photosensitive organic layer;
developing an array of back cavities comprising one back cavity, deep trenches around the component, and a pair of via holes per island of membrane layer wherein the via holes expose routing layers patterned in an outer passivation layer that act are coupled to the front and back electrodes;
applying a back outer layer of a photosensitive organic film onto the back inner organic layer, spanning and sealing the at least one upper cavity;
developing extensions to the via holes and deep trenches;
Selectively applying a sealing coating layer over the back surface and into the trenches but leaving the via holes clear of the sealing coating layer;
filling the array of via holes through the outer and inner organic layers with a metal that contacts the conductive contacts to create filled vias;
applying terminations and solder bumps to outer ends of the filled vias, and
sectioning the array into individual dies.

Typically, an adhesion layer of titanium or titanium-tungsten is sputtered over the outer surface of the back section and into the through via holes and a copper seed layer is sputtered thereover and the through vias are then filled with copper by electroplating prior to removing the seed layer from the outer surface.

The method may be used for packaging an array of electronic components that each comprise an active membrane layer on a front electrode over a front end of a package and an inner passivation material surrounding the electronic components and partially covering the electronic components; a layer of back electrode material selectively covering the inner passivation material and the active membrane, a first and second routing layer being deposited onto the back electrode material and a layer of outer passivation material selectively patterned with first and second routes filled with a conductive material to serve as routing layers therein, wherein a first filled through via traverses the outer passivation material and is coupled by the first routing layer to the back electrode, and a second filled through via is coupled by the second routing layer and by a section of the back electrode material disconnected from the back electrode over the active membrane layer and by a through-via in the inner passivation layer to the front electrode.

Optionally, the front end comprises an inner layer comprising a silicon wafer with a front cavity therein of a same pentagonal shape as a part of the back electrode within a raised frame that is concentrically aligned therewith; the front cavity being at least as large as the part of the back electrode; and a front outer layer sealing the front cavity, wherein an array of deep trenches are formed through the back ends to the silicon handle or wafer.

A fifth aspect is directed to a method for fabricating an array of front ends for an array of packaged electronic component comprises the stages of:

i. Obtaining a carrier substrate having an active membrane layer attached thereto by its rear surface, with a front electrode on the front surface of the active membrane layer;
ii. Obtaining a front inner end section;
iii. Attaching the front inner end section to the exposed front surface of the front electrode;
iv. Detaching the carrier substrate from the rear surface of the active membrane layer;
v. Optionally thinning the front inner section;
vi. Processing the rear surface by removing material to create an array of at least one island of active membrane on at least one island of front electrode;
vii. Creating an array of at least one front cavity by selectively removing at least outer layer of the front inner end section, such that there is one cavity opposite each island of membrane on the front side of the front electrode on the opposite side to the island of active membrane;
viii. Applying a front outer end section to the front inner end section and bonding the front outer end section to an outer surface of the front inner end section such that the front outer end section spans across and seals the at least one cavity of the array of front cavities.

Typically, the active membrane layer comprises a piezoelectric material.

Optionally, the active membrane layer comprises a single crystal membrane selected from the group comprising $Ba_xSr_{(1-x)}TiO_3$, c-axis-oriented $Sc_xAl_{(1-x)}N$, $Al_xGa_{(1-x)}N$, AlN, $LiNbO_3$ and $LiTaO_3$.

Typically, at least one of the following limitation is true:
the carrier substrate comprises a <111> or <110> or <100> silicon wafer carrier covered with a c-axis <0001> single crystal GaN release layer;
the carrier substrate comprises a c-axis <0001> single crystal sapphire membrane covered with a c-axis <0001> single crystal GaN release layer;
the active membrane layer comprises $Ba_xSr_{(1-x)}TiO_3$, and step i) comprises a preliminary step of depositing a seed layer comprising <100> $TiO_2$ (rutile) or <111> single crystal $SrTiO_3$ or a double seed layer comprising a layer of $TiO_2$ followed by a layer of $SrTiO_3$ onto the GaN release layer prior to depositing the $Ba_xSr_{(1-x)}TiO_3$;
the active membrane layer comprises $Al_xGa_{(1-x)}N$, and step i) comprises a preliminary step of depositing a c-axis-oriented AlN layer and gradually increasing the gallium content.
the active membrane layer comprises $LiNbO_3$ at YX1/36° or $LiTaO_3$ at YX1/42° to YX1/52° attached to a GaN release layer over sapphire substrate by a silicon oxide fused layer
the active membrane layer comprises AlN and step i) comprises at least one preliminary step of applying a seed layer onto the GaN layer of $Sc_xAl_{(1-x)}N$ or $Al_xGa_{(1-x)}N$.
the active membrane layer comprises $Sc_xAl_{(1-x)}N$ step i) may comprise at least one preliminary step of applying a seed layer of $Sc_xAl_{(1-x)}N$ or $Al_xGa_{(1-x)}N$ onto the GaN release layer wherein the seed layer has a stoichiometry (x value) that is different from that of the main $Sc_xAl_{(1-x)}N$ film membrane.

Typically, the front electrode is characterized by a thickness in the range of 50 nm to 350 nm and comprises a metal selected from the group comprising Mo, W, W—Ti and Ru.

Typically, the front inner section comprises a silicon wafer or handle having a resistivity exceeding 3000 Ohm*cm.

In some embodiments, the front inner section further comprises a silicon oxide layer between the wafer or handle and the front electrode.

Optionally, the front inner section further comprises a silicon membrane coupled to the silicon wafer by a silicon oxide box layer.

Typically, step (iii) of attaching the inner section of the front of package to the front electrode comprises depositing a first half bonding layer onto the first electrode, and depositing a second half bonding layer onto the inner section of the front of package and fusing the bonding layers together.

Typically, at least one of the following limiting futures is true:
the half bonding layers are identical and may each comprise Au—In or Au, AlN, ScAlN or $SiO_2$;
the front electrode and the active membrane have ultra flat surfaces (roughness<0.3 nm) and the front electrode has a high crystal orientation with respect to the active membrane;
the bonding layer comprises Au or Au—In, and to facilitate adhesion of the bonding layer to at least one of the front electrode and/or to the front inner section, adhesion layers of Ti or Ti—W are used;
said adhesion layers and said bonding layer are removed from the within the cavity to expose the front electrode, and
the bonding layer comprises AlN or ScAlN attached to both the front electrode and to the silicon front inner part of the front end of the package, and then fused together.

Optionally, the method further comprises removing the bonding layer from within the front cavity to expose the front electrode.

Typically, at least one of the following limitations is true:
any $SiO_2$ is removed from within the cavity by a technique selected from etching with HF vapor, by a BOE (Buffered Oxide Etch) solution containing HF as an active ingredient, by ICP or by RIE etching;
the bonding layer comprises Au or Au—In, and is removed from within the cavity to expose the front electrode, by etching with a $KI/I_2$ wet solution;
any adhesion layer of Ti or Ti—W between the bonding layer and the front electrode and/or between the bonding layer and the front inner section are removed by dry etching from within the cavity, thereby exposing the front electrode, and
the bonding layer comprises AlN or ScAlN and is removed from within the cavity to expose the front electrode, by Induction Coupled Plasma (ICP) using $BCl_3$ and/or $Cl_2$ and/or diluted tetra methyl ammonium hydroxide (TMAH) wet solution.

Typically, step (iv) of detaching the carrier substrate from a surface of the active membrane is selected from the group of:
laser lift-off;
wherein the carrier substrate comprises a sapphire single crystal wafer coated with GaN, detachment is by laser lift off comprising irradiating the GaN through the sapphire using a 248 nm excimer square waveform laser;
where the carrier substrate comprises a silicon wafer, detaching the carrier substrate from surface of the active membrane comprises grinding away the carrier substrate.

Optionally, step (iv) further comprises at least one of:
removing GaN by induction coupled plasma, and
obtaining a piezoelectric membrane or piezoelectric seed layer with average surface roughness characteristics (Ra) of less than 0.3 nm Optionally, a front inner end section comprises a silicon handle or silicon wafer having a resistivity of at least 3000 $\Omega$cm, and step (v) comprises temporary bonding the back of the device wafer to a carrier wafer with a temporary polymeric bonding material and thinning the silicon wafer by a method selected from the group comprising grinding, chemical polishing and chemical mechanical polishing CMP.

Typically, at least one of the following limitations is true:
the carrier wafer is selected from the group comprising glass, silicon and sapphire;
the temporary polymeric bonding material is selected from the group comprising resin, polyester, wax and rubber;
the temporary polymeric bonding material is removable by application of at least one of heat, a chemical solvent and laser irradiation.

In some embodiments, processing the rear surface comprises selectively removing the active membrane to form islands, selectively removing the lower electrode and optionally removing a silicon wafer and/or silicon oxide layer thereunder around the active membrane and trimming the active membrane to a desired thickness by applying a scanning surface ion milling process over exposed surface of the active membrane.

Optionally, a carrier wafer is temporarily attached to the rear surface by a temporary polymeric bonding material and the front inner layer is thinned to a desired thickness.

In some embodiments, the front inner section comprises a silicon wafer and step (vii) of creating an array of at least one front cavity comprises applying a through silicon etch to create the array of at least one front cavity through the silicon wafer.

Optionally, the front inner section further comprises a silicon dioxide layer between the silicon wafer and the first electrode and step (vii) further comprises selective removal of the silicon oxide layer by one of chemical etching with HF vapor, BOE (Buffered Oxide Etch containing HF), ICP etching or RIE etching, with the silicon wafer serving as a mask to create the at least one cavity aligned with the islands of active material.

In some embodiments, the front inner section further comprises a silicon membrane between the silicon dioxide layer and the first electrode and either step (vii) further comprises selective removal of the silicon membrane exposed by the previous removal of the silicon oxide, by a through silicon etch and removing the bonding layer thereby exposing the unsupported front electrode on the front side of the active membrane spanning across the at least one front cavity, or the silicon membrane that is exposed by removal of the silicon oxide by a through silicon etch is retained bonded by a bonding layer to the front electrode and the active membrane spanning across the at least one front cavity.

Optionally, the front outer section comprises a layer of silicon, glass or a ceramic, the step (viii) comprises attaching the front outer layer to the front inner section with a package bonding layer.

Typically, at least one of the following limitations applies:
the package bonding layer comprises gold, or gold indium alloy, and the bonding material is applied as a thin coating to an outer surface of the front inner section and as a thin coating to an inner surface of the front outer section, and then the thin coatings are fused together;
adhesion layers are deposited between the substrates and the bonding layer, said adhesion layers being selected from the group of titanium, titanium-tungsten and chromium adhesion layers;
the package bonding layer comprises an organic bonding layer;
the package bonding layer comprises an organic bonding layer selected from the group comprising SU-8, PDMS, PBO, epoxy, TMM and jetable die attach polymers.

Typically, optional step (xi) comprises thinning the front outer layer by a method selected from the group comprising grinding, chemical polishing and chemical mechanical polishing CMP, and then removing the carrier wafer and polymeric bonding material.

In embodiments where the outer layer of the front section comprises a thick organic layer, step (viii) comprises laminating the thick organic layer to the outer surface of the silicon handle that spans the at least one cavity on the array of front cavities.

Typically, the outer layer of the front section comprises PBO or TMM.

In some embodiments, when fabricating a whole package, the method further comprises the step (x) of fabricating back ends of the package.

Typically, back ends of the package comprise an inner organic layer having an array of at least one back cavity therein, said at least one the back cavity being sealed by an outer organic layer, with vias through the inner and outer organic layers around said at least one back cavity for coupling via routing layers in a passivation layer to electrodes of the electronic component; the vias terminating in external contact pads that are coupleable in a flip chip configuration to a circuit board.

Optionally, the method further comprises fabricating deep trenches in back end of the package, down to the silicon wafer of the front end.

Optionally, the method further comprises the step (xi) of fabricating deep trenches on the front surfaces, such that said deep trenches expose the inner silicon wafer and then, when fabricating a whole package, applying a sealing liner coating to the back outer surface and into the deep trenches thereof, whilst ensuring that the external contact pads are not covered, and then, where applicable, to the front outer surface step (xi) and into the deep trenches thereon.

Typically, the sealing liner coating is selected from the group comprising AlN, SiN, $Ta_2O_5$ and TaN and is deposited by radio frequency (RF) sputtering or by PECVD to a thickness in the range of 100 nm, to 500 nm.

Typically, the front ends are fabricated in an array and the method further comprises step (xii) of singulating the array into individual packaged components.

A sixth aspect is directed to a front end of a package array for packaging islands of active membrane, comprising a front electrode attached to the active membrane, a front inner packaging section attached to the opposite side of the front electrode from the islands of active membrane, the front inner packaging section having an array of cavities therein, each cavity being opposite an island of the active membrane, and a front outer packaging layer attached to the front inner packaging layer that seals the cavities of the array.

Typically, the front inner packaging layer comprises a silicon wafer.

In some embodiments, the front inner packaging layer further comprises a layer of silicon oxide between the silicon handle and wafer and the front electrode.

Optionally, the front inner packaging layer further comprises a silicon membrane between the silicon oxide and the front electrode.

In some embodiments, the front inner packaging layer is attached to the front electrode by a bonding layer.

Typically, the bonding layer is selected from the group comprising Au, Au—I, AlN, ScAlN and $SiO_2$ and where at least one of the following limitations is true:
the front electrode and the active membrane have ultra flat surfaces (roughness<0.3 nm) and the front electrode has a high crystal orientation with respect to the active membrane;
the bonding layer comprises Au or Au—In, and to facilitate adhesion of the bonding layer to at least one of the front electrode and/or to the front inner section, adhesion layers of Ti or Ti—W are used;
the bonding layer comprises AlN or ScAlN attached to both the front electrode and to the silicon front inner part of the front end of the package, and then fused together, and
the bonding layer comprises $SiO_2$.

Optionally, the bonding layer, and, where provided, said adhesion layers, and where provided, said silicon membrane, are removed from the within each of said at least one front cavity to expose the front electrode.

Alternatively, the silicon membrane, bonding layer and any adhesion layers remain attached to the front electrode and span each cavity, becoming part of each resonator.

Optionally, the front outer packaging layer comprises high resistivity silicon, glass, AlN or sapphire.

Typically, the front inner packaging layer is attached to the front outer packaging layer by a package bonding layer that comprises one of the following limitations:
the package bonding layer is selected from the group comprising Au or Au—I;
the package bonding layer comprises an organic bonding material, and
the package bonding layer comprises an organic bonding material selected from the group comprising SU-8, PDMS, PBO, epoxy, TMM and jetable die attach polymers.

Alternatively, the front outer packaging layer comprises an organic film.

In some embodiments, the front outer packaging layer comprises PBO or TMM.

Optionally, the front end further comprises front deep trenches fabricated in the outer layer of the front end corresponding to similar deep trenches in a back end of the package and crossing the front outer layer and bonding layer into the silicon wafer or handle of the front inner section.

In some embodiments, the front end and any deep trenches may be coated by a sealing liner coating.

Typically, the sealing lining coating is characterized by at least one of:
being a dielectric material selected from the group of AlN, SiN, $Ta_2O_5$ and TaN; and
having a thickness in the range from 100 nm to 500 nm.\

A packaged electronic component comprising:
an electrical element packaged within a package comprising
a front part of a package comprising an inner section with a cavity therein opposite the resonator defined by the raised frame and an outer section sealing said cavity; and
A back part of the package comprising a back cavity in a back inner section, and a back outer section sealing the cavity, said back package further comprising a first and a second via through the back end around said at least one back cavity for coupling to front and back electrodes of the electronic component; the vias terminating in external contact pads that are coupleable in a flip chip configuration to a circuit board.

Generally, the electronic component comprises an active membrane trapped between front and back electrodes.

Typically, wherein the electronic component comprises a resonator or an array of resonators providing a filter.

Optionally, the electronic component comprises an RF filter comprising a plurality of resonators in series and shunt, each resonator having a dedicated upper and lower cavity.

Typically the active membrane comprises a piezoelectric membrane and the front and back electrodes comprise refractory metal having high acoustic velocity.

Typically, at least one of the following limitations is true:
the active membrane comprises a highly oriented or single crystal piezo membrane.
the front electrode, back electrode and the active membrane have ultra flat surfaces (roughness<0.3 nm) and the front electrode has a high crystal orientation with respect to the active membrane.
the front and back electrodes have highly oriented crystalline structures;
the front and back electrodes display low acoustic attenuation;
the front and back electrodes comprise material selected from the group of W, Ru, W—Ti or Mo;
the back and front electrodes have thicknesses in the range of 50 nm to 350 nm;
the front and back electrodes each comprise single crystal layers films; and
the front and/or back electrodes comprise single crystal thin film molybdenum having thicknesses in the range of 50 nm to 350 nm.

Generally, the piezoelectric membrane comprises a material selected from the group comprising $Ba_xSr_{(1-x)}TiO_3$ henceforth BST, c-axis-oriented $Sc_xAl_{(1-x)}N$ henceforth ScAlN, $Al_xGa_{(1-x)}N$ henceforth AlGaN, AlN, $LiNbO_3$ and $LiTaO_3$.

Typically, the piezoelectric membrane of ScAlN comprises a seed layer of ScAlN having at least one of the following limitations:
a different stochiometry than the active membrane onto a surface of a GaN layer provided on a single crystal sapphire or silicon carrier.
a stoichiometry of $Sc0_{0.1}Al_{0.9}N$ and a lattice spacing of 3.15 Å.
a second ScAlN seed layer is deposited onto the front of the piezoelectric membrane.

Typically, the packaged component further comprises a raised frame comprising the conductive material of the back electrode that is deposited onto the back electrode around at least part of the back electrode and defines a resonating area of the active layer.

Preferably, the back electrode within the raised frame and the front side cavity adjacent to the front electrode both have a same pentagonal shape and are concentrically aligned; the front cavity being at least as large as the back electrode.

Typically, the active membrane has a back surface, a front surface and edges, and the back part of the package further comprises an inner passivation material around the edges of the active membrane and overlapping a perimeter of the front surface.

In preferred embodiments, the active membrane comprises at least one of the following limitations:
the inner passivation material comprises a dielectric material having a low relative permittivity such that K≤4;
the inner passivation material is selected from the group comprising $SiO_2$, Fluorine-doped Silicon Oxide (SiOF), Porous Silicon Oxide and Carbon-doped Silicon Oxide (SiCO).

Typically, the packaged electronic component further comprises an outer passivation layer that selectively covers the back electrode area and frame leaving the outer surface of the inner passivation exposed and said outer passivation layer is patterned with routes for coupling the front and back electrodes to the first and second external contacts.

Optionally, an internal conductive routing layer comprising gold is deposited over the back electrode within the routes patterned into the outer passivation layer.

In preferred embodiments, the outer passivation coating is selected from the group comprising AlN, ScAlN and SiN.

Typically, the front inner section of the package comprises a silicon wafer having a resistivity exceeding 3000 ohm*cm and at least one front cavity within the silicon wafer, said at least one front cavity being closed with a front outer layer that is bonded to the front inner layer.

Optionally, the front electrode is attached to the front inner section by a bonding layer selected from the group comprising gold, gold-indium, ScAlN, AlN and SiO$_2$ and at least one of the following restrictions is true:

the front inner section further comprises a layer of silicon oxide, and said front active membrane and said front electrode spans said cavity, and said bonding layer attaches the front electrode to the SiO$_2$ layer of the front inner section around said cavity;

the bonding layer comprises Au or Au—In, and to facilitate adhesion of the bonding layer to at least one of the front electrode and/or to the front inner section, adhesion layers of Ti or Ti—W are used;

said bonding layer and any adhesion layers are removed from the within the cavity to expose the front electrode;

the bonding layer comprises AlN or ScAlN attached to both the front electrode and to a silicon inner surface of the front part of the front end of the package, and then fused together;

the bonding layer comprises AlN or ScAlN and is removed from within the front cavity by Induction Coupled Plasma (ICP) using BCl$_3$ and/or Cl$_2$ and/or diluted TMAH wet solution to expose the front electrode to the cavity;

the bonding layer comprises SiO$_2$;

the bonding layer comprises SiO$_2$ and the bonding layer is removed from within the cavity to expose the front electrode by etching with HF vapor, by a BOE (Buffered Oxide Etch) solution containing HF as an active ingredient, by ICP etching or by RIE etching.

Optionally, the front inner section further comprises a layer of silicon membrane attached to a layer of silicon oxide on an opposite side of the silicon oxide from the silicon wafer and the bonding layer attaches said front electrode to said silicon membrane, wherein either the silicon membrane spans the front cavity and supports the electrode and active membrane, or the silicon membrane is removed from within the front cavity, exposing the front electrode.

Typically, the active membrane comprises a piezoelectric film, and further comprises a front electrode attached to the active membrane, a front inner packaging section attached to the opposite side of the front electrode from the islands of active membrane, the front inner packaging section having an array of cavities therein, each cavity being opposite an island of the active membrane, and a front outer packaging layer attached to the front inner packaging layer that seals the cavities of the array.

Typically, the front inner packaging layer comprises a silicon wafer having a resistivity exceeding 3000 ohm*cm.

In some embodiments, the front inner packaging layer further comprises a layer of silicon oxide between the silicon wafer and the front electrode.

In some embodiments, the front inner packaging layer further comprises a silicon membrane between the silicon oxide and the front electrode.

Typically, the front inner packaging layer is attached to the front electrode by a bonding layer.

Optionally, the bonding layer is selected from the group comprising Au, Au—I, AlN, ScAlN and SiO$_2$ and where at least one of the following limitations is true:

the front electrode and the active membrane have ultra flat surfaces (roughness<0.3 nm) and the front electrode has a high crystal orientation with respect to the active membrane;

the bonding layer comprises Au or Au—In, and to facilitate adhesion of the bonding layer to at least one of the front electrode and/or to the front inner section, adhesion layers of Ti or Ti—W are used;

the bonding layer comprises AlN or ScAlN attached to both the front electrode and to the silicon front inner part of the front end of the package, and then fused together, and the bonding layer comprises SiO$_2$.

In some embodiments, the bonding layer, and where provided said adhesion layers, and where provided, said silicon membrane are removed from the within each of said at least one front cavity to expose the front electrode.

In other embodiments, the silicon membrane, bonding layer and any adhesion layers remain attached to the front electrode and span each cavity, becoming part of each resonator.

Typically, the front outer packaging layer is selected from the group comprising high resistivity silicon, glass, AlN or sapphire.

Typically, the front inner packaging layer is attached to the front outer packaging layer by a package bonding layer that comprises one of the following limitations:

the package bonding layer is selected from the group comprising Au or Au—I.

the package bonding layer comprises an organic bonding material, and the package bonding layer comprises an organic bonding material selected from the group comprising SU-8, PDMS, PBO, epoxy, TMM and jetable die attach polymers.

Optionally, the front outer packaging layer comprises an organic film.

For example, the front outer packaging layer comprises PBO or TMM.

Typically, the packaged electronic component further comprises front deep trenches fabricated in the outer layer of the front end, crossing the front outer layer and bonding layer into the silicon wafer of the front inner section.

Optionally, the front end and any deep trenches may be coated by a sealing liner coating.

Typically, the sealing lining coating is characterized by at least one of:

being a dielectric material selected from the group of AlN, SiN, Ta$_2$O$_5$ and TaN.

having a thickness in the range from 100 nm to 500 nm.

Typically, the electronic component is provided on a front end of said package such that on attaching the back end, the electronic component is encased by said package; the back end comprising at least one back cavity having organic walls and lid, and with vias through the back end around said at least one back cavity for coupling to electrodes of the electronic component; the vias being coupleable in a flip chip configuration to a circuit board.

The back end typically comprises an inner organic back layer defining side walls of the back cavity and through-via holes, and an outer dry film of photosensitive polymer patterned only with through via holes and deep trenches, that spans and seals said at least one back cavity.

Typically, the inner organic back layer comprises an organic photosensitive dielectric selected from the group of SU-8, PDMS, epoxy, PBO and TMM and patterned with the back cavity and through vias.

Typically, the outer dry film of organic photosensitive dielectric is selected from the group consisting of PBO and TMM.

Preferably, the back end comprises a sealing liner coating over the back outer surface of the package and into the deep trenches.

Optionally, the sealing liner coating is selected from the group of AlN, SiN, Ta$_2$O$_5$ and TaN.

Typically, the back end further comprises a first filled via that passes through the organic back end of the package and is coupled via a routing material deposited in a first route patterned into an outer passivation layer to a back electrode of the electronic component coupled to the back electrode, and a first external pad on the end of the first filled via that is terminated with a barrier layer comprising a coating of nickel, followed by a solderable bump comprising solder, tin, SnAg or lead free solder, and a second filled via that passes through the organic back end of the package and is coupled via a second routing layer deposited into a second route patterned into the outer passivation layer which is coupled by a through-via in the inner passivation layer to a front electrode, and having a second external pad on the end of the second filled via that is terminated with a barrier layer comprising a coating of nickel, followed by a solderable bump comprising solder, tin, SnAg or lead free solder.

A further aspect is directed to an array of packaged electronic components that each comprise an active membrane layer on a front electrode over a front end of a package and an inner passivation material surrounding the electronic components and partially covering the electronic components; a layer of back electrode material selectively covering the inner passivation material and the active membrane, a first and second routing layer being deposited onto the back electrode material and a layer of outer passivation material selectively patterned with first and second routes filled with a conductive material to serve as routing layers therein, wherein a first filled through via traverses the outer passivation material and is coupled by the first routing layer to the back electrode, and a second filled through via is coupled by the second routing layer and by a section of the back electrode material disconnected from the back electrode over the active membrane layer and by a through-via in the inner passivation layer to the front electrode.

Typically, the front end comprises an inner layer comprising a silicon wafer with a front cavity therein of a same pentagonal shape as a part of the back electrode within a raised frame that is concentrically aligned therewith; the front cavity being at least as large as the part of the back electrode; and a front outer layer sealing the front cavity, wherein an array of deep trenches are formed through the back ends to the silicon handle or wafer.

A further aspect is directed to a method for fabricating an array of front ends for an array of packaged electronic components each comprising:
an electrical element packaged within a package comprising
a front part of a package comprising an inner section with a cavity therein opposite the resonator defined by the raised frame and an outer section sealing said cavity; and a back part of the package comprising a back cavity in a back inner section, and a back outer section sealing the cavity, said back package further comprising a first and a second via through the back end around said at least one back cavity for coupling to front and back electrodes of the electronic component; the vias terminating in external contact pads that are coupleable in a flip chip configuration to a circuit board; the method comprising the stages of:
(i) Obtaining a carrier substrate having an active membrane layer attached thereto by its rear surface, with a front electrode on the front surface of the active membrane layer;
(ii) Obtaining a front inner end section;
(iii) Attaching the front inner end section to the exposed front surface of the front electrode;
(iv) Detaching the carrier substrate from the rear surface of the active membrane layer;
(v) Optionally thinning the front inner section;
(vi) Processing the rear surface by removing material to create an array of at least one island of active membrane on at least one island of front electrode;
(vii) Creating an array of at least one front cavity by selectively removing at least outer layer of the front inner end section, such that there is one cavity opposite each island of membrane on the front side of the front electrode on the opposite side to the island of active membrane;
(viii) Applying a front outer end section to the front inner end section and bonding the front outer end section to an outer surface of the front inner end section such that the front outer end section spans across and seals the at least one cavity of the array of front cavities.

Typically, step (iii) of attaching the inner section of the front of package to the front electrode comprises depositing a first half bonding layer onto the first electrode, and depositing a second half bonding layer onto the inner section of the front of package and fusing the bonding layers together.

Typically, at least one of the following limitations is true:
the half bonding layers are identical and may each comprise Au—In or Au, AlN, ScAlN or SiO$_2$;
the front electrode and the active membrane have ultra flat surfaces (roughness<0.3 nm) and the front electrode has a high crystal orientation with respect to the active membrane;
the bonding layer comprises Au or Au—In, and to facilitate adhesion of the bonding layer to at least one of the front electrode and/or to the front inner section, adhesion layers of Ti or Ti—W are used;
said adhesion layers and said bonding layer are removed from the within the cavity to expose the front electrode, and
the bonding layer comprises AlN or ScAlN attached to both the front electrode and to the silicon front inner part of the front end of the package, and then fused together.

Optionally the method further comprises removing the bonding layer from within the front cavity to expose the front electrode.

Typically, at least one of the following limitations is true:
any SiO$_2$ is removed from within the cavity by a technique selected from etching with HF vapor, by a BOE (Buffered Oxide Etch) solution containing HF as an active ingredient, by ICP or by RIE etching;
the bonding layer comprises Au or Au—In, and is removed from within the cavity to expose the front electrode, by etching with a KI/I$_2$ wet solution;
any adhesion layer of Ti or Ti—W between the bonding layer and the front electrode and/or between the bonding layer and the front inner section are removed by dry etching from within the cavity, thereby exposing the front electrode, and
the bonding layer comprises AlN or ScAlN and is removed from within the cavity to expose the front electrode, by Induction Coupled Plasma (ICP) using BCl$_3$ and/or Cl$_2$ and/or diluted tetra methyl ammonium hydroxide (TMAH) wet solution.

In some embodiments the step (iv) of detaching the carrier substrate from a surface of the active membrane is selected from the group of:
- laser lift-off;
  wherein the carrier substrate comprises a sapphire single crystal wafer coated with GaN, detachment is by laser lift off comprising irradiating the GaN through the sapphire using a 248 nm excimer square waveform laser;
- where the carrier substrate comprises a silicon wafer, detaching the carrier substrate from surface of the active membrane comprises grinding away the carrier substrate.

In some embodiments the step (iv) further comprises at least one of:
- removing GaN by induction coupled plasma, and
- obtaining a piezoelectric membrane or piezoelectric seed layer with average surface roughness characteristics (Ra) of less than 0.3 nm Typically, a front inner end section comprises a silicon wafer having a resistivity of at least 3000 Ω cm, and step (v) comprises temporary bonding the back of the device wafer to a carrier wafer with a temporary polymeric bonding material and thinning the silicon wafer by a method selected from the group comprising grinding, chemical polishing and chemical mechanical polishing CMP.

Typically, at least one of the following limitations is true:
- the carrier wafer is selected from the group comprising glass, silicon and sapphire;
- the temporary polymeric bonding material is selected from the group comprising resin, polyester, wax and rubber;
- the temporary polymeric bonding material is removable by application of at least one of heat, a chemical solvent and laser irradiation.

Typically, processing the rear surface comprises selectively removing the active membrane to form islands, selectively removing the lower electrode and optionally removing a silicon wafer and/or silicon oxide layer thereunder around the active membrane and trimming the active membrane to a desired thickness by applying a scanning surface ion milling process over exposed surface of the active membrane.

In preferred embodiments, the front inner section comprises a silicon wafer having a resistivity of at least 3000 Ωcm and step (vii) of creating an array of at least one front cavity comprises applying a through silicon etch to create the array of at least one front cavity through the silicon wafer.

Optionally, the front inner section further comprises a silicon dioxide layer between the silicon wafer and the first electrode and step (vii) further comprises selective removal of the silicon oxide layer by one of chemical etching with HF vapor, BOE (Buffered Oxide Etch containing HF), ICP etching or RIE etching, with the silicon wafer serving as a mask to create the at least one cavity aligned with the islands of active material.

Optionally, the front inner section further comprises a silicon membrane between the silicon dioxide layer and the first electrode and either step (vii) further comprises selective removal of the silicon membrane exposed by the previous removal of the silicon oxide, by a through silicon etch and removing the bonding layer thereby exposing the unsupported front electrode on the front side of the active membrane spanning across the at least one front cavity, or the silicon membrane that is exposed by removal of the silicon oxide by a through silicon etch is retained bonded by a bonding layer to the front electrode and the active membrane spanning across the at least one front cavity.

Typically, the front outer section comprises a layer of silicon, glass or a ceramic, the step (viii) comprises attaching the front outer layer to the front inner section with a package bonding layer.

Typically, at least one of the following limitations applies:
- the package bonding layer comprises gold, or gold indium alloy, and the bonding material is applied as a thin coating to an outer surface of the front inner section and as a thin coating to an inner surface of the front outer section, and then the thin coatings are fused together;
- adhesion layers are deposited between the substrates and the bonding layer, said adhesion layers being selected from the group of titanium, titanium-tungsten and chromium adhesion layers;
- the package bonding layer comprises an organic bonding layer;
- the package bonding layer comprises an organic bonding layer selected from the group comprising SU-8, PDMS, PBO, epoxy, TMM and jetable die attach polymers.

In some embodiments, the optional step (xi) comprises thinning the front outer layer by a method selected from the group comprising grinding, chemical polishing and chemical mechanical polishing CMP, and then removing the carrier wafer and polymeric bonding material.

Typically, the outer layer of the front section comprises a thick organic layer and step (viii) comprises laminating the thick organic layer to the outer surface of the silicon handle, spanning the at least one cavity on the array of front cavities.

Generally, the outer layer of the front section comprises PBO or TMM.

Typically, back ends with terminations are fabricated over the front ends.

Optionally, the method further comprises the step (xi) of fabricating deep trenches on the front surfaces, such that said deep trenches expose the inner silicon wafer and then, when fabricating a whole package, applying a sealing liner coating to the back outer surface and into the deep trenches thereof, whilst ensuring that the external contact pads are not covered, and then, where applicable, to the front outer surface step (xi) and into the deep trenches thereon.

Typically, the sealing liner coating is selected from the group comprising AlN, SiN, $Ta_2O_5$ and TaN and is deposited by radio frequency (RF) sputtering or by PECVD to a thickness in the range of 100 nm, to 500 nm.

Optionally, the front ends are fabricated in an array and the method further comprises step (xii) of singulating the array into individual packaged components.

A further aspect is directed to a method for fabricating an array of the back end for a package for an electronic component comprising:
- an electrical element packaged within a package comprising
- a front part of a package comprising an inner section with a cavity therein opposite the resonator defined by the raised frame and an outer section sealing said cavity; and
- A back part of the package comprising a back cavity in a back inner section, and a back outer section sealing the cavity, said back package further comprising a first and a second via through the back end around said at least one back cavity for coupling to front and back electrodes of the electronic component; the vias terminating in external contact pads that are coupleable in a flip chip configuration to a circuit board; the method comprising:

a. Obtaining an array of electronic components each comprising at least one island of membrane layer sandwiched between front and back electrodes, with a front end of the package below the front electrode, and having conductive contacts to the back and front electrode;

b. depositing an inner photosensitive organic layer;

c. developing an array of back cavities comprising one back cavity, deep trenches around the component, and a pair of via holes per island of membrane layer wherein the via holes expose routing layers patterned in an outer passivation layer that act are coupled to the front and back electrodes;

d. Applying a back outer layer of a photosensitive organic film onto the back inner organic layer, spanning and sealing the at least one upper cavity;

e. Developing extensions to the via holes and deep trenches;

f. Selectively applying a sealing coating layer over the back surface and into the trenches but leaving the via holes clear of the sealing coating layer;

g. Filling the array of via holes through the outer and inner organic layers with a metal that contacts the conductive contacts to create filled vias;

h. Applying terminations and solder bumps to outer ends of the filled vias, and i. Sectioning the array into individual dies.

Typically, an adhesion layer of titanium or titanium-tungsten is sputtered over the outer surface of the back section and into the through via holes and a copper seed layer is sputtered thereover and the through vias are then filled with copper by electroplating prior to removing the seed layer from the outer surface.

Optionally, the back of the package further comprises a sealing liner coating around the package and into the deep trenches that provides protection against humidity.

Typically, the sealing liner coating is selected from the group comprising AlN, SiN, $Ta_2O_5$ and TaN.

BRIEF DESCRIPTION OF FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In particular, it will be appreciated that the schematic illustrations are not to scale, and the thickness of some very thin layers is exaggerated. In the accompanying drawings.

DETAILED DESCRIPTION

Figure 1:
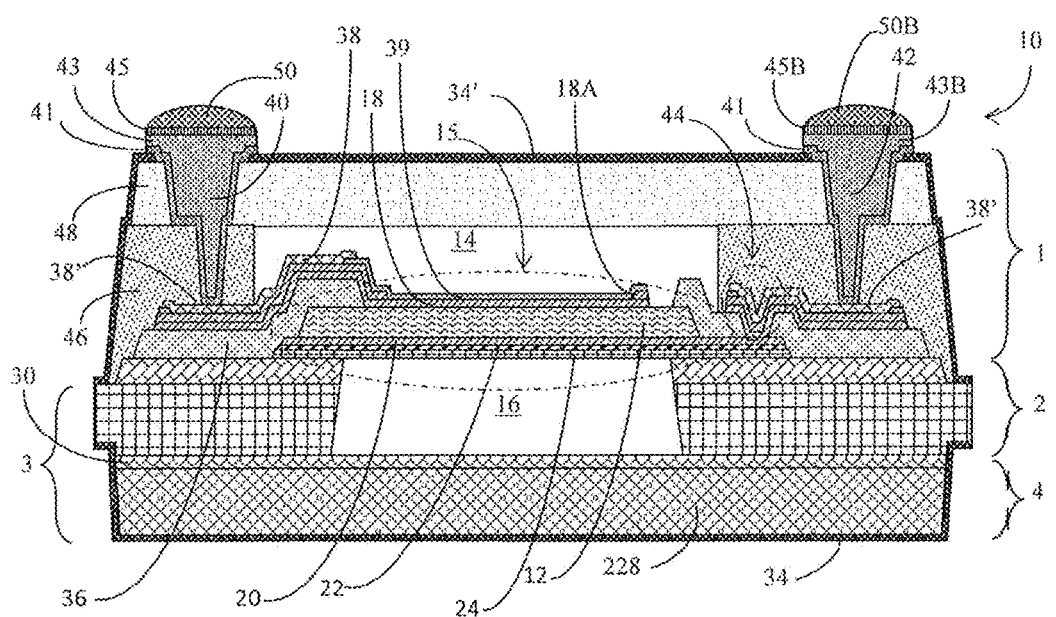
FIG. 1 is a schematic not-to-scale cross section representation of a first embodiment of a packaged membrane such as a FBAR resonator module; a plurality of which would typically be fabricated together and coupled in half ladder or lattice arrangements or combinations thereof to provide an RF filter.

Embodiments of the present invention are directed to packages for electronic components and to methods for the fabrication of packaging electronic components in general. In particular, embodiments of the invention are directed to methods of packaging and packages for active membranes together with a cavity backing the active membrane such that a back part of the package covering the membrane and defining the cavity comprises organic (i.e. polymeric) material. The membrane may be an acoustic resonator for a filter, or a sensor, for example. In preferred embodiments, there are dedicated cavities on both sides of the active membrane, i.e. on the front and at the back.

The specific embodiments illustrated are packages for FBAR resonators and for filters comprising epitaxial piezoelectric films sandwiched between electrodes with adjacent cavities within the package. Strongly textured epitaxially grown piezoelectric films are expected to have smoother surfaces than those of randomly oriented films.

When used as resonator membranes in filters, a reduced scattering loss and a smooth interface between the metal electrodes and the piezoelectric films both contribute to a higher Q-factor. Furthermore, the reduced surface roughness of the active membrane results in a smoother interface with the electrodes deposited thereon, and thereby reduces the sheet resistance (towered bulk resistivity values) of the metal thin film electrodes, providing further improvements to the Q values. With well-controlled electrode deposition processes it becomes possible to take advantage of the highly oriented piezoelectric film to grow electrodes thereover that have more highly oriented crystalline structures, thus achieving even better electrical conductivity properties with improved acoustic properties and overall better resonator FOM values. For these reasons, defect-free single crystal films are required for the next generation of high frequency Bulk Acoustic Resonators (BAW).

Highly oriented crystalline piezoelectric film and electrodes, (having an XRD FWHM of less than 1°), and single crystal piezoelectric film and electrodes, (having an XRD FWHM of less than 0.1°), have great impact on the properties of Bulk Acoustic Resonators (BAW) constructed therefrom, such as FBAR and SMR, and can reduce by as much as 50% the RF power that is otherwise wasted as heat. This power saving may significantly reduce the rate of dropped calls and increase the battery life of mobile phones.

There are various piezoelectric materials which may be used as active membranes for FBAR and SMR filters. These include single crystal $Ba_xSr_{(1-x)}TiO_3$ henceforth BST, AlN, $Al_xGa_{(1-x)}N$ henceforth AlGaN, $Sc_xAl_{(1-x)}N$ (henceforth ScAlN), $LiNbO_3$ or $LiTaO_3$.

Strong c-axis texture is the most important prerequisite for AlN, doped AlN or BST based FBARs because the acoustic mode for such FBARs needs to be longitudinally activated, and the piezoelectric axis of AlN, doped AlN and BST are all along the c-axis.

Furthermore, in the case of doped AlN piezoelectric films and especially in the case of the scandium doped AlN films that are becoming necessary for higher $K^2_{eff}$ values and thus wider bandwidth filters, a highly c-axis-oriented piezoelectric film helps in keeping the stress level of the piezoelectric film in its low tensile stress mode, improving processability and confronting the tendency of the piezoelectric film to drop its Q level as the Sc doping level increases.

By way of example, in accordance with a first embodiment of the invention, FIG. 1 is a schematic not-to-scale cross-section representation of a packaged electronic component 10, specifically a FBAR resonator module 15 having a dedicated back cavity 14 and a dedicated front cavity 16 each alongside the resonator module 15.

Figure 2:
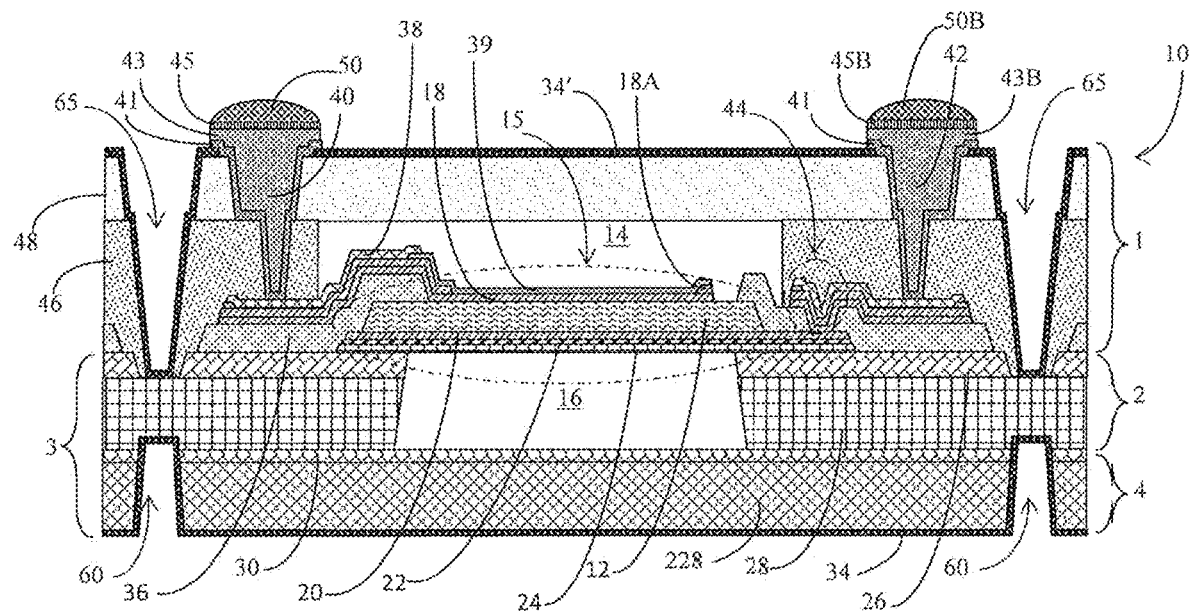
FIG. 2 is a schematic not-to-scale cross-sectional representation of an FBAR resonator module in accordance with the first embodiment showing how the packaged component may be fabricated in an array, with deep trenches to remove stress and to aid in sectioning. It will be noted that a silicon membrane spans the cavity and supports the active membrane as part of the resonator.

The package of FIG. 1 is fabricated in an array, and, as shown in FIG. 2, for reducing stresses in the package, and aiding subsequent dicing, deep trenches 60 and 65 may be fabricated in the various layers on the front 3 and/or the back 1, through to a handle or wafer 28 of a dielectric having a high electric resistivity (>3000 ohm*cm) such as undoped or low doped silicon 28 which is common to all the embodiments described herein, and in the embodiment shown in FIGS. 1 and 2 is provided as the silicon handle 28 of a silicon membrane 24 coupled to the silicon handle 28 by a buried oxide layer (BOX) of silicon oxide, henceforth silicon oxide layer 26. In other embodiments, described hereinbelow, the silicon membrane 24 and sometimes the silicon oxide layer 26 are dispensed with.

The silicon membrane 24 supporting the piezoelectric membrane 12 in the first embodiment is part of the resonator 15 and is typically a single crystal silicon layer and may have an orientation of <100>, <111> or <110>, for example. It typically has a thickness of 0.1 microns. When exposed to temperature variations, the single crystal silicon membrane 24 shows a reduced frequency shift, and serves as a mechanical support layer to the resonator 15 that has low acoustic losses and is itself attached by a layer of silicon oxide 26 using SOI technology (i.e. an embedded BOX layer) to a thicker silicon wafer having a resistivity of at least 3000 Ohm cm, that is also known as a 'handle' 28, providing a "membrane 24 on handle 28". Such membrane 24 on handles 28, joined by a layer of silicon oxide 26 are commercially available silicon on insulator (SOI) products. A silicon membrane 24 on handle 28 obtainable from SOITEC™ or WaferPro™ using SMARTCUT™ technology that is suitable, consists of a silicon film or membrane 24 that comes in thicknesses in the typical range 0.05 to 0.5 μm that is coupled by a $SiO_2$ (BOX) layer 26 that is typically 1 to 3 μm thick to a Silicon handle 28 that may be 700 μm thick or more, depending on the wafer diameter.

The SOI product may be obtained pre-coated with a bonding metal coating 22 on the silicon film 24, aiding its attachment to the electrode 20 on the piezoelectric film 12.

Thus the silicon oxide layer 26, the silicon membrane 24 supporting the active membrane layer 12 and the silicon handle 28 may be the remains of such a commercially available membrane on handle, after selective removal of the silicon handle 28, silicon oxide layer 26 and in some embodiments, also the silicon membrane 24 to form the lower cavity 16.

A plurality of such resonator modules 15 may be coupled together to provide a RF filter. The resonator module 15 consists of an active membrane layer 12, which, in RF filters, is a piezoelectric membrane, a back electrode 18, a front electrode 20, and sometimes additional layers. Generally an outer passivation layer 39 covers the outer surface of the back electrode 18. The front and back electrodes 18, 20 are typically fabricated from W, Ru, W—Ti or Mo which are refractory metals having high acoustic velocities and low acoustic attenuation, and which may be deposited as highly oriented crystalline structures or as single crystals.

In the specific embodiment of FIG. 1 which is shown fully annotated in FIG. 2, the front electrode 20 is adhered to the silicon membrane 24 by a bonding layer 22 that permits low temperature bonding, such as gold, Au—In, AlN, ScAlN or $SiO_2$. The bonding layer 22 is typically between about 30 nm and 1000 nm (1 µm) thick. The active membrane layer 12 is preferably a membrane of a piezoelectric material and is more preferably a highly oriented crystalline membrane and most preferably is a single crystal membrane of piezoelectric material, and may be a highly oriented or single crystal membrane of BST, AlN, AlGaN, AlScN, $LiNbO_3$ or $LiTaO_3$, for example. These materials, when provided as single crystal or at least as highly oriented polycrystalline membranes, have high Q and $K^2_{eff}$ values and excellent performance and can provide the required larger bandwidth RF filters for 5G telecommunication BST, AlN, AlGaN and ScAlN may be epitaxially grown on a suitable substrate such as sapphire using molecular beam epitaxy or sputtering, for example. Membranes of $LiNbO_3$ or $LiTaO_3$ cannot be deposited onto a sapphire substrate 10 by sputtering or MBE due to their lattice spacing incompatibility. They are, however, both available as single crystals, and have extremely high Q and coupling coefficient values, and membranes of $LiNbO_3$ and $LiTaO_3$ may be fabricated by spalling from a single crystal wafer having an appropriate orientation by subjecting the surface of the single crystal to ion bombardment with an appropriate ion at an appropriate intensity to cause a weakness at a desired depth. For example, single crystals of $LiNbO_3$ in YX1/36 orientation or $LiTaO_3$ in YX1/42 orientation may be bombarded with helium ions to create a weakened layer up to 1 µm below the surface of the single crystal. A bonding layer such as a 100 to 1000 nanometer thick $SiO_2$ layer may then be deposited by PECVD onto the surface of the spalled off piezoelectric film and a similar bonding layer of silicon oxide may be deposited onto the release layer 12 of a support wafer 10, such as a GaN coated sapphire support wafer, and the two $SiO_2$ bonding layers may then be polished using chemical mechanical polishing (CMP) and brought into contact which causes them to bond. See U.S. Pat. No. 10,771,031 to Hurwitz, for more details.

Thus active membrane layers 12 may be piezoelectric films that can be either epitaxially grown or fabricated by spalling from a single crystal. However, the resultant structure in both cases is a piezoelectric film of desired orientation, coupled to a sapphire substrate by a GaN layer, possibly with the addition of a buffer layer of rutile $TiO_2$ and/or $SrTiO_3$ for BST piezoelectric membranes, or $Al_xGa_{(1-x)}N$ and/or $Sc_xAl_{(1-x)}N$ with various values for x (ion concentrations) for piezoelectric layers of AlN, ScAlN or AlGaN.

The active membrane layer 12 and front electrode 20 and sometimes additional layers 22, 24 span across a cavity 16 that is fabricated in the inner layers 2 of the front end 3 below which are outer layers 4 of the front end 3 that seal the cavity 16.

Figure 4:
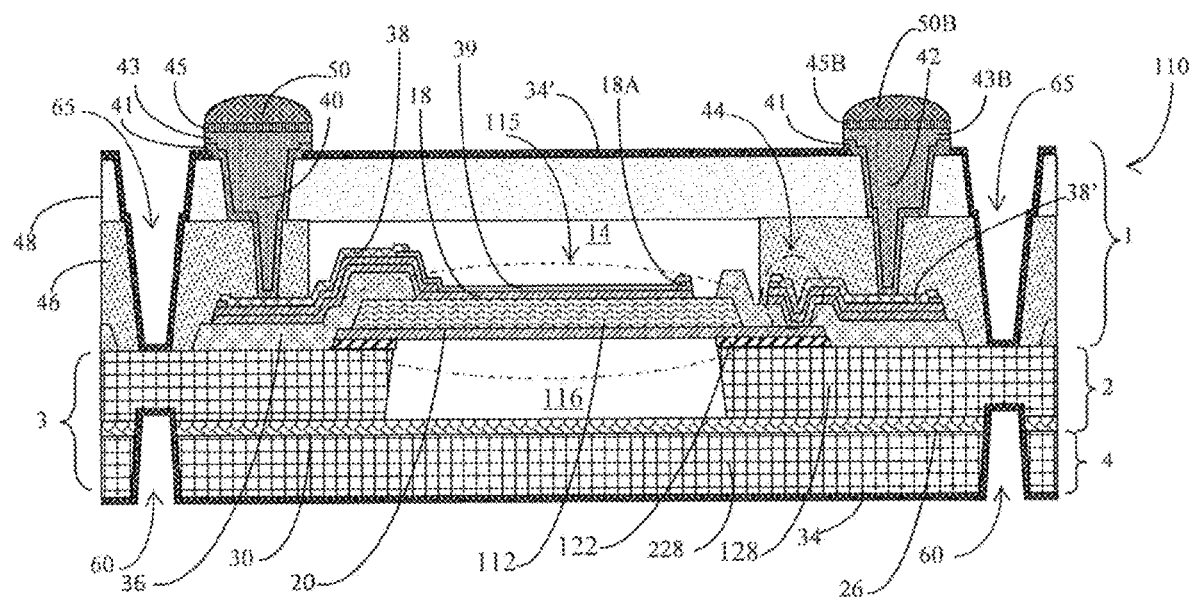
FIG. 4 is a schematic not-to-scale cross-sectional representation of a second embodiment of a packaged membrane such as a FBAR resonator module where in this case, the inner and outer parts of the front section of the package both consist of silicon wafers.
Figure 7:
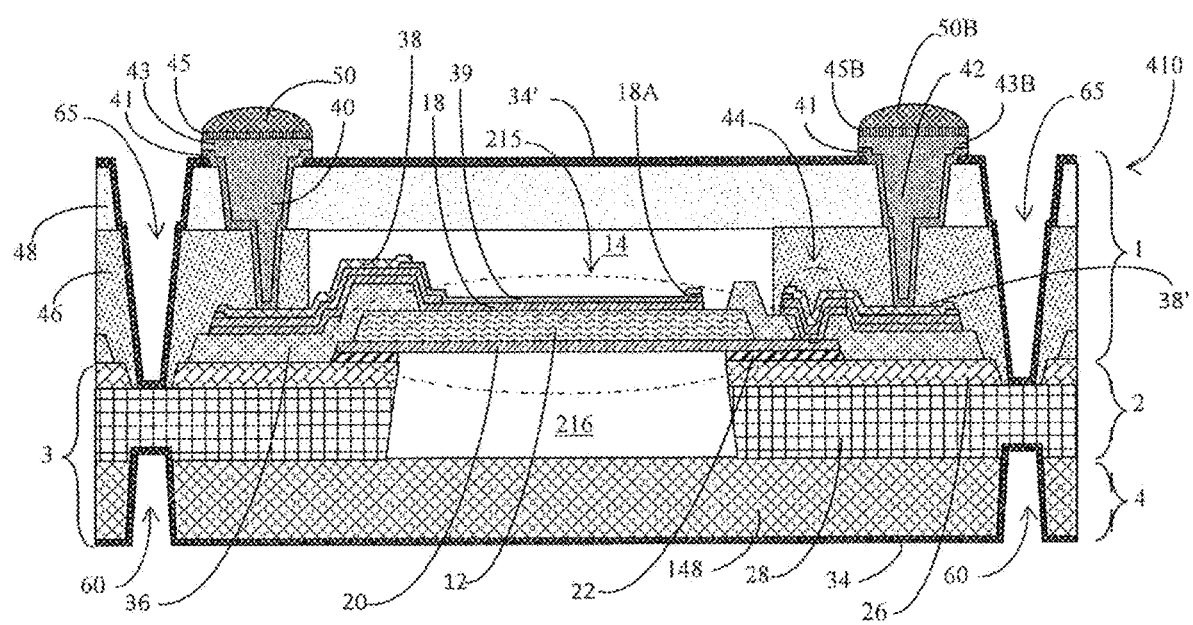
FIG. 7 is a schematic not-to-scale cross-sectional representation of a fifth embodiment of a packaged membrane such as a FBAR resonator module where in this case, the inner part of the front section consists of a silicon wafer "handle" supporting a silicon oxide layer that is coupled to the front electrode material on the active membrane by a bonding layer of gold or gold indium, where the bonding layer is removed from the cavity, so that the electrode active membrane spans the cavity, without being supported by a silicon membrane, and the outer part of the package consists of a thick organic layer.

There are various configurations for the resonator 12 and the package, and specific embodiments are shown in FIGS. 2, 4 and 7. It will further be appreciated that different resonator configurations, such as with or without a silicon membrane 24 spanning the front cavity 16 and acting as a stiffener of the active membrane layer 12, and also improving the stability in operating frequency with temperature changes, and, may be packaged with different front sections 3 of the package, and the front inner section 2 may or may not include a silicon membrane 24 and/or a silicon oxide layer 26.

The front outer section 4 may be any insulating material or dielectric having high resistivity, such as a silicon, glass or other material having an electric resistivity exceeding 3000 Ohm-cm. The front outer section may be a silicon wafer 228 that is coupled to the silicon outer layer 28 of the front inner section 2 by a package bonding layer 30 which may be gold or gold indium, applied as thin layers to the two silicon wafers 28, 228 and fused together, or may be an organic adhesive such as layer such as PDMS, PBO, epoxy, SU-8 and TMM being available as a resin or film (TMMR or TMMF) from TOK™, or various ink jetable die-attach polymers as available from Sekisui™ or Inkron™ for example.

SU-8 is a commonly used epoxy-based photoresist that is composed of Bisphenol A Novolac epoxy that is dissolved in an organic solvent (gamma-butyrolactone GBL or cyclopentanone, depending on the formulation) and up to 10 wt % of mixed Triarylsulfonium and hexafluoro-antimonate salt as the photoacid generator. Polydimethylsiloxane (PDMS), also known as dimethyl-polysiloxane or dimethicone, belongs to a group of polymeric organosilicon compounds that are commonly referred to as silicones. PDMS is the most widely used silicon-based organic polymer, and is particularly known for its unusual rheological (or flow) properties. PDMS is one of several types of silicone oil (polymerized siloxane). It is optically clear, and, relatively inert, non-toxic, and non-flammable.

TMM is a high-contrast, epoxy-based photoresists.

Alternatively, as shown in FIG. 7, the front outer section may consist of a thick organic dry film 148 that is laminated to the silicon outer layer 28 of the front inner section 2, spanning the front cavities 16 of the array. An appropriate thick organic layer is TMMF from TOK™ Using a dry organic film dispenses with the need for a separate package bonding layer. In such embodiments the organic layer is the front outer side layer.

Of primary interest however, and common to all the embodiments shown in FIGS. 1-7 is the back end 1 of the electronic packages 10 (110, 210, 310, 410) which defines and covers the back cavity 14 and is substantially fabricated from inner and outer organic material layers 46, 48 that is coated with a sealing liner coating 34'. The back end 1 of the packages 10 (110, 210, 310, 410) also includes external contact pads 43, 43B on filled vias 40, 42 that are coupled by contact pads 38' through apertures in an outer passivation layer 39, to the upper and lower electrodes 18, 20. The external contact pads are plated with a barrier material 45, 45B and terminated with solderable bumps 50 for flip-chip assembly of the package. The packaging of the back end 1 is substantially fabricated from organic (polymer) material, and this vastly decreases unit cost and improves yields when compared to other packaging systems. It will be appreciated that in addition to packaging RF filters, the back end 1 described herein could be used to terminate other electronic components having a back cavity 14, such as various sensors, for example.

An inner layer of passivation material 36 having a relative permittivity (i.e. dielectric constant) $K \leq 4$, such as $SiO_2$, Fluorine-doped Oxide (SiOF), Porous Oxide or Carbon-doped Oxide (SiCO) for example, covers the silicon oxide layer 26 (where present), the front electrode 20 and any bonding layer 22 and silicon membrane 24 extending beyond the active membrane layer 12, and also covers the side walls and extends over the edges of the upper surface of the active membrane later 12.

The back electrode 18 covers the active membrane layer 12 and selectively covers the inner layer of passivation material 36, leaving a section of back electrode material 18B detached from the upper electrode 18 covering the active membrane layer 12. This layer of back electrode material 18B is connected to the lower electrode 20 by a through via hole 44 through the inner layer of passivation material 36. Around the perimeter of the back electrode 18 over the active membrane layer 12, there is a thick rim or frame 18A of the upper electrode material 18.

It will be appreciated that an individual die may comprise an array of resonators coupled together to create a filter. In some of these resonators an additional mass loading layer (not shown) of the same material as the backside electrode material may be selectively patterned over the entire back electrode surface of certain resonators within the filter die. Such a mass loading layer may be used to reduce the central frequency of certain resonators, such as shunt resonators, when compared to the central frequency of other resonators, such as series resonators within the same filter die.

A thin outer passivation layer 39 of AlN, ScAlN, SiN or other dielectric material which is resistant to HF attack and not susceptible to moisture absorption is selectively deposited over the inner layer of passivation material 36, the back electrode 18 and conductive routing layers 38A, 38B. Front and back routs are patterned therein, and inner conductive routing layers 38A, 38B are selectively deposited into the routes, providing contact pads 38' for subsequent coupling to the solderable bumps 50 outside the package.

The internal routing layers 38A, 38B of a conductive material, typically gold, are selectively deposited into the route patterns in the outer passivation layer 39 and coupled to the back electrode layer 18 to improve the conductivity of the connections to the electrodes 18, 20. One routing layer 38A of the conductive layer connects to the section of back electrode material 18 coupled to and extending from that part of the back electrode material covering the active membrane layer 12 but does not itself cover the vibrating part of the active membrane layer 12 spanning the front cavity 16. A second section of routing layer 38B covers and connects to the section of back electrode material 18B that is detached from the upper electrode 18 covering the active membrane layer 12 and by this section of back electrode material 18B to the front electrode by virtue of a through via hole 44 that traverses the inner passivation layer 36.

During processing, the outer passivation layer may be trimmed to adjust its thickness, increasing the yield of the filter and set its frequency response to a desired value. Typically the outer passivation layer of the full array of resonators within each filter unit is trimmed to a desired thickness. A typical thickness of the outer passivation layer before trimming is in the range of from 200 nm to 300 nm, and after trimming is typically around 100 nm with a typical tolerance of +/−4 angstroms. However, it will be appreciated that the different trimming may be specified for different array of filters that are cofabricated within the same wafer and is typically performed by a scanning ion beam etcher using inert gas such as Ar.

An organic support layer 46 covers the outer passivation layer 39 around the resonator 115 and defines the side walls of the back cavity 14. A continuous organic film 48 covers the organic support layer 46 and the cavity 14, sealing the cavity 14.

The organic support layer 46 and the thick continuous organic layer 48 may be SU-8, PDMS, epoxy, PBO (Zylon™) i.e. poly(p-phenylene-2,6-benzobisoxazole) or TMM which is available as TMMF S2000 film photoresist. The organic support layer 46 may also be TMMR S2000 liquid photoresist, both TMMF S2000 and TMMR S2000 are available from TOK™ (Tokyo Ohka Kogyo).

Filled vias 40, 42, typically copper, extend through the organic support layer 46, the thick continuous organic layer 48 and the thin outer passivation layer 39 and connect to the conductive routing layer 38A, 38B by internal contact pads 38' provided by forming apertures in the outer passivation layer 39. The filled vias 40, 42 are terminated with external copper pads 43, 43B and a barrier layer 45, 45B fabricated from nickel and solderable bumps 50, 50B that are fabricated from solder, tin, SnAg or other lead free solder, for example, are applied for flip chip coupling of the package for an electronic component 10 to a circuit.

The package for an electronic component 10 is typically fabricated in a large array by wafer level manufacturing. Back trenches 65 are formed through the back 1 of the array of packages, that is through the thick continuous organic layer 48, the thin outer passivation layer 39 and inner passivation layer 36, but also through any silicon 24 and silicon oxide layer 26 to the silicon handle 28 or more generally to a silicon layer 228 that is common to all embodiments. The back trenches 65 may be patterned together with the vias 42, since both layers of organic materials of the back side are photosensitive. The back trenches reduce stress and facilitate subsequent dicing.

The outer upper back surface and the deep trenches 65 are preferably lined with a sealing liner coating 34' which is typically a dielectric material selected from the group of AlN, SiN, $Ta_2O_5$ and TaN, and having a thickness in the range from 100 nm to 500 nm. The liner coating seals the organic materials, preventing damage due to humidity. The liner coating is preferably applied by using a low deposition temperature (<250° C.) technique, such as RF sputtering or PECVD for example, to generate void free films. In some embodiments, particularly that shown in FIG. 7 where, the front end outer layer 4 comprises an organic material 148, but also where an organic bonding layer 30 is used to attach the inner 28, and outer layer 228 of the front end of the package such as the embodiment shown in FIG. 6, and the component is to be used in applications requiring extra humidity protection levels, corresponding deep trenches 60 may be provided on the front side of the package through outer layer 228 and bonding layer 30, and into silicon handle (wafer) 28.

Corresponding front trenches 60 are optionally fabricated through the outer section 4 of the front end 3 of the package 10 through any package bonding layer 30 to the silicon handle 28 or more generally to a silicon wafer 128 that is common to all embodiments.

Where provided, the deep trenches 60 on front end 3 are aligned with the deep trenches 65 on the back end 1 of the package 310, 410 and traverse the front outer layer 228 (148), and any organic package bonding layer 30 to the silicon handle or wafer 28 of the front inner layer 2. The front outer and back surfaces and the deep trenches 60, 65 may be coated with a sealing liner coating 34, 34' to protecting against humidity. In some embodiments, humidity protection in this manner is not needed, since the filter package is flip-chip assembled over a common IC substrate, along with other components that may all then embedded in an underfill/over-mold epoxy materials. In such instances, and where Moisture Sensitivity specification Levels (MSL) are not as tight, the package the liner coatings 34, 34' may not be necessary.

Where, however, a sealing liner layer 39' is applied on the back of the package 1, it must be selectively removed from the internal pads 38 to enable conductive contact to between the through vias 40, 42 and the internal pads 38' for coupling to the front and back electrodes 20, 18 via the internal routing layers 38A, 38B. Typically, the sealing liner layer 39' will be also removed from inside, in and around the via holes, thereby generating a pad 41 around the via holes 42.

The sealing liner coating 34 seals both organic materials and silicon, preventing damage due to humidity. In some cases, however, depending on the final configuration and the requirement of the package or its application, the sealing layer 34 might be applied into the front trenches 60 and silicon layer 228. In yet some other cases, the sealing layer 34 might not be required since over-mold/underfill material may be applied over the entire filter package thereby providing extra humidity protection. Furthermore, in some embodiments, front trenches may not be needed at all.

The array of packages for an electronic component 10 (110, 210, 310, 410) may be diced into separate filter packages for separate electronic components 10 (110, 210, 310, 410) by cutting through the silicon layer 28 (128) to connect the back and front trenches 65, 60, or, where front trenches 60 are not provided, using the back trenches 60 as guidance.

In preferred embodiments, the back and front electrodes 18, 20 are preferably fabricated from refractory metals having high acoustic velocities and low acoustic attenuation, such as molybdenum (Mo), tungsten (W), titanium-tungsten (TiW) or rubidium (Ru), for example. The quality and coupling of the resonators and filters thus formed are vastly superior to those of the prior art. Due to being deposited on to smooth active membranes of piezoelectric material, and the optional addition of seed layers to bridge the difference in lattice spacing between the active membrane and the electrode, the electrodes 18, 20 may be deposited as highly oriented thin films or even as single crystal layers.

Figure 3:
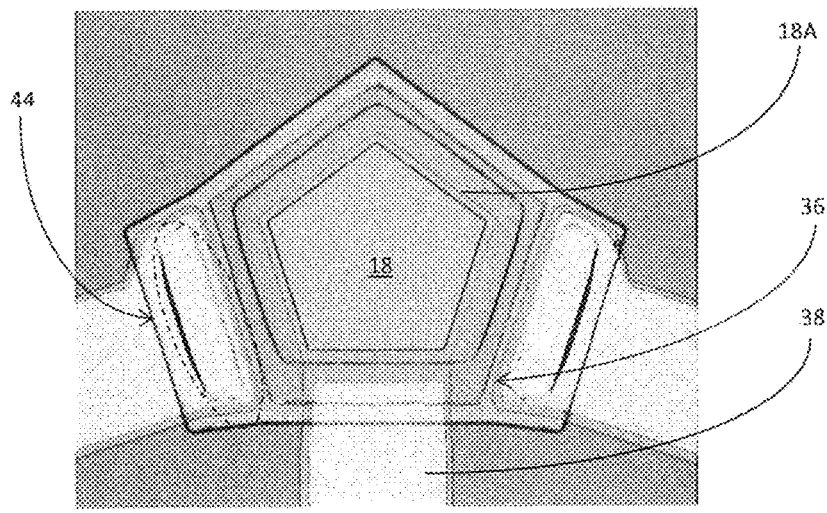
FIG. 3 is a top view photo-micrograph of the active membrane of the embodiments shown herein covered with the back electrode, showing the pentagonal shape of the back electrode within the raised frame ("the vibrating section" or diaphragm) and also showing the gold contact layer.

FIG. 3 is a top view of the resonator 15 showing that the back electrode 18 over the vibrating membrane has a pentagonal shape without parallel edges or 90° angles to suppress lateral spurious modes. The back electrode 18 and raised frame 18A therearound, and a conductive layer 38 over the inner layer of passivation material 36 are also shown. The raised frame 18A aids in enhancing Q values of the resonator. The frame 18A, back electrode 18, and front cavity 16 are coaligned and have the same pentagonal shape without 90° angles to reduce spurious modes.

A conductive routing layer 38A is coupled by a section of the back electrode layer 18A to the back electrode 18 that extends over the vibrating membrane. One external contact bump 50 on a nickel coating 45 on an outer contact 43 is coupled by a via 40 that is typically copper to an aperture in the outer passivation layer 39 that serves as an inner pad 38' in the inner routing layer 38A that is coupled to the back electrode 20. A second external contact bump 50B is coupled by a nickel coating 45B on an outer contact pad 43B to a second copper via 42 via an aperture in outer passivation layer 39 providing a contact pad 38' on a second section of conductive routing layer 38B, that is coupled by a section of the back electrode layer 18B that is detached from the back electrode 18 and which traverses the underlying inner layer of passivation material 36 by a through via hole 44 to the front electrode 20 on the other side of the active membrane layer 12.

Typically the front and back electrodes 20, 18 are fabricated from the same material so the section of the back electrode layer 18B coupled to the front electrode 20 by the through via 44 enables accessing the front electrode 20 and coupling it to the outside world through an inner layer pad 38' in the inner routing layer 38B and a filled via 42 (typically copper). The two copper vias 40, 42 are terminated by copper external layer pads 43 and 43B that are then electroplated with barrier layers 45, 45B of nickel thereover. The barrier layers 45, 45B typically having a thickness in the range of 1 µm to 5 µm, and are followed by solderable bumps 50, 50B that are fabricated from solder, tin, SnAg or other lead free solders, for example.

Not only can the packaging solution described hereinabove be used for packaging different types of electronic components, but the back end 1 may be used together with different front ends 3 to create different embodiments of package for electronic components.

With reference to FIG. 4 a package for an electronic component 110 in accordance with a second embodiment is schematically shown. The electronic component 115 is again an FBAR resonator consisting of an active membrane layer 112 that is a highly oriented, and is preferably a single crystal piezoelectric film that may be BST, AlN, AlGaN, ScAlN, LiNbO$_3$ or LiTaO$_3$, sandwiched between a back electrode 18 and a front electrode 20 which may be Mo, W, Ti—W or Ru, for example. However, in this embodiment the front electrode 20 is attached directly to a silicon wafer (handle) 128 by a bonding layer 122 such as Au—In, Au, AlN, ScAlN or SiO$_2$ mutatis mutandis.

In contradistinction to the first embodiment shown in FIG. 2, in the second embodiment shown in FIG. 4 the silicon or glass wafer 128 is a thicker layer than the silicon membrane 24 of FIG. 1 and will typically be tens of microns thick and may be 50 microns or more. Also, the silicon wafer 128 is fully removed from under the pentagonal vibrating part of the resonator 112, as is the bonding layer 122, exposing the front electrode 20 and forming the lower cavity 116 which has the same pentagonal shape and is coaligned with, and has at least the same size as the upper electrode 18 within the raised frame 18A.

Thus in the second embodiment, the bonding layer 122 couples the front electrode 20 to a silicon wafer 128 only around the cavity 116 (contrary to the first embodiment wherein the bonding layer 22 couples the front electrode 20 to a silicon membrane 24 that is joined to a silicon handle 28 by a silicon oxide box 26.) Furthermore, and most importantly, the resonator 115 of the second embodiment only comprises the piezoelectric membrane 112 and the back and front electrodes 18, 20, a raised frame 18A and possibly a tuning layer of the back electrode material deposited thereover (not shown), and a thin outer passivation layer 39. There is no silicon membrane 24 spanning the cavity 116, serving as a stiffener to the piezoelectric layer 112 and altering the resonant frequency of the resonator 115.

The bonding layer 122 thus only couples the perimeter of the front electrode 20 under the piezoelectric membrane 112 of the resonator 115 that extends beyond the front cavity 116, and extensions of the front electrode 20 needed to enable electrical connection to the filled via hole 44. The front cavity 116 is provided by selectively removing (typically by etching) the silicon or glass layer 128 from under the resonator 115. The silicon layer 128 is attached by a package bonding layer 30 to a silicon carrier 228 to provide a base to the lower cavity 116, and the silicon carrier 228 and, where provided, deep trenches 60 therein, are coated with a sealing liner coating 34 that may be a dielectric with a low deposition temperature (<250° C.) such as AlN, SiN, Ta$_2$O$_5$ or TaN for example. The package bonding layer 30 may be gold or gold indium applied as thin bonding layers to the silicon inner wafer 128 and to the silicon, sapphire, AlN or glass outer wafer 228 and fused together, but is typically an organic adhesive layer such as SU-8, PDMS, PBO, epoxy, TMMF which is available from TOK, various ink jetable die attach polymers as available from Sekisui™ or Inkron™ for example, or the like.

An inner layer of passivation material 36 having low permittivity such as SiO$_2$, Fluorine-doped Oxide (SiOF), Porous Oxide or Carbon-doped Oxide (SiCO) for example, covers the silicon layer 128 around the front electrode 20 and bonding layer 122 and also covers the side walls of the active membrane layer 112, the front electrode 20 and bonding layer 122 and extends over the edges of the upper surface of the active membrane layer 112. The back end 1 of the package 110 is identical to that of the first embodiment 10. The back electrode 18, which is typically Mo, W, Ti—W or Ru, is deposited over the inner layer passivation material 36 and over the piezoelectric membrane 12. A stiffening frame 18A of the back electrode material 18 is selectively deposited onto the back electrode 18 around edges of the top surface of the piezoelectric membrane 112 which typically has a pentagonal shape (see FIG. 3). The pentagonal shape of the backside electrode 18 and the stiffening frame 18A and associated pentagonal shape of the underlying front end cavity 116 (not shown) have the same shape and are coaligned, with the front cavity 116 being at least as big as the vibrating part of the back electrode, as defined by the raised frame 18A. The frame 18A again aids in the reduction of the spurious modes of the resonator 115 and hence increases its Q value.

Usefully, at this stage, the back electrode material can be deposited onto the extensions of the back electrode 18B over the inner passivation layer but not over the vibrating part, to further lower its resistance. It will be appreciated that an individual die may comprise an array of resonators coupled together to create a filter. Additionally, a mass loading layer of the same material as the backside electrode material may be selectively patterned over the entire back electrode surface of certain resonators within the filter die, specifically over the vibrating part. Such a mass loading layer (not shown) may be used to reduce the central frequency of certain resonators, such as shunt resonators, when compared to the central frequency of other resonators, such as series resonators within the same filter die.

Inner conductive routing layers 38, 38', typically gold, is deposited onto the back electrode layer 18 over the inner layer of passivation material 36 around the piezoelectric membrane 12 of the resonator 115. This is covered with an outer passivation layer 39 in which apertures are created to access the conductive routing layers 38, 38B and form inner contact pads 38' for attachment of filled vias 40, 42 thereto.

The inner layer of passivation material 36 and the back electrode layer 18 thereover are patterned. On one side (to the left in FIG. 4) the conductive layer 38 is deposited onto part of the back electrode layer 18 that extends from the piezoelectric membrane 112 and thus provides a contact to the back electrode 18. A second section of back electrode layer 18 over the inner layer of passivation material 36 on one side of the piezoelectric membrane 112 and part of this section of the back electrode layer 18 extends over and covers the back surface of the active layer 112.

On the other side, to the right in FIG. 4, the inner conducting routing layer 38' is attached to the front electrode layer 20 by a section of the back electrode layer 18B is detached from the part of the back electrode layer 18 covering the upper surface of the resonator 115. A through via hole 44 is made through the inner layer of passivation material 36 to the lower electrode 20, and part of the back electrode layer 18B deposited thereover is connected to the front electrode 20 by virtue of the through via hole 44.

A thin outer passivation layer 39 of AlN, ScAlN, SiN or other dielectric material which is resistant to HF attack and free of moisture absorption is deposited over the inner layer of passivation material 36 and back electrode 18. The external passivation layer 39 plays an important rule since its thickness can be adjusted (trimmed) on a resonator by resonator basis across the array, thereby allowing adjustment of the desired frequency of each filter.

The passivation layer 39 is selectively patterned with internal routes. An inner routing layer 38' that is typically gold is deposited into the internal routes onto the back electrode layer 18B and enables coupling of the external contact pad 43B by virtue of a filled via 42 that is typically copper, the part of the routing layer 38B that the filled via attaches to, serving as contact pads 38, 38' for conductive coupling to the subsequently fabricated through vias 40, 42.

An organic support layer 46 covers the inner layer of passivation material 36 around the resonator 115 and defines the side walls of upper cavity 14. A continuous organic film 48 covers the organic support layer 46 and the cavity 14, sealing the cavity 14.

The organic support layer 46 and the thick continuous organic layer 48 may be SU-8, PDMS, epoxy, PBO (Zylon™) i.e. poly(p-phenylene-2,6-benzobisoxazole) or TMM which is available as TMMF S2000 film photoresist. The organic support layer 46 may also be TMMR S2000 liquid photoresist. Both TMMF S2000 and TMMR S2000 are available from TOK (Tokyo Ohka Kogyo).

Filled vias 40, 42, typically of copper, pass through the organic support layer 46, the organic film 48 and outer passivation layer 39 and connect to the conductive routing layer 38, 38' patterned in the outer passivation layer 39 and providing coupling to the back electrode 18, and to the front electrode 20 by virtue of the back electrode layer 18B that is disconnected from the back electrode 18 over the piezoelectric membrane 112.

A liner sealing coating 34' may be selectively applied to the outside surface of the back end of the package to improve the Moisture Sensitivity Level (MSL) of the filter package, taking care to remove the liner coating 34' from the ends of the vias 40, 42, but covering the outer surface and into the trenches 65. The ends of the copper vias 40, 42 are terminated by external pad layers 43 and 43B that are coated with nickel barrier layers 45, 45B by electroplating. The nickel barrier layer 45, typically has a thickness in the range of 1 μm to 5 μm, and is followed by solderable bumps 50, 50B that are fabricated from solder, tin, SnAg or lead free solder, for example.

Apart from not including a silicon membrane 24 within the resonator 115 and a silicon oxide layer 26 thereunder, the construction and materials used for the various parts of the second embodiment shown in FIG. 4 are similar to those of the first embodiment provided with reference to FIGS. 1 and 2.

Figure 5:
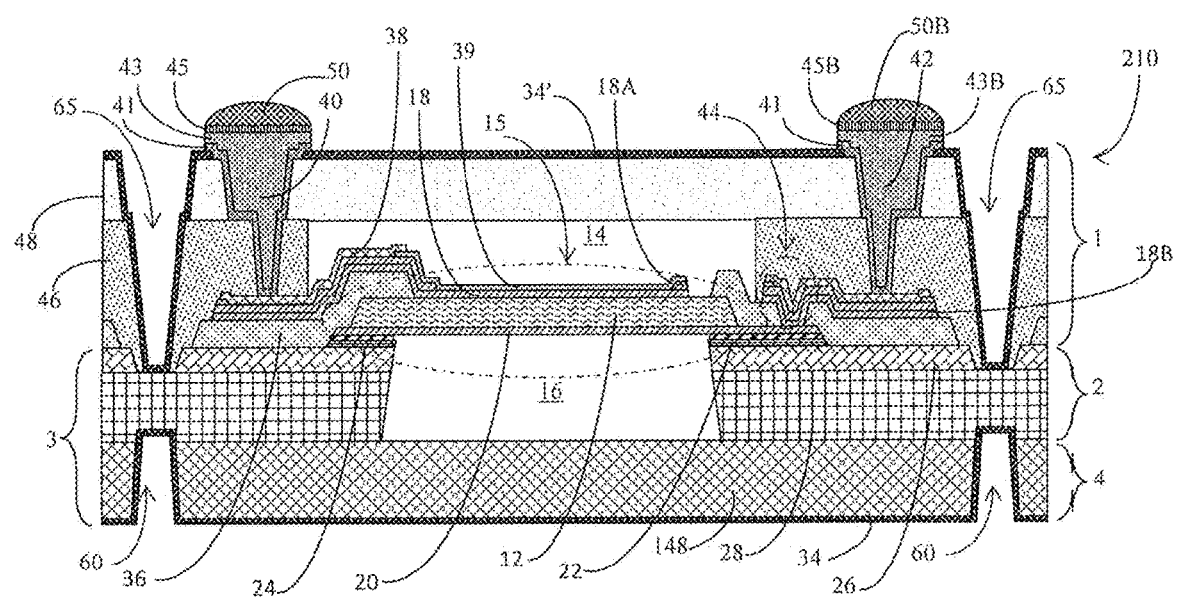
FIG. 5 is a schematic not-to-scale cross-sectional representation of a third embodiment of a packaged membrane such as a FBAR resonator module where in this case, the inner part of the front section consists of a silicon membrane coupled to a silicon handle by a buried oxide (BOX) of silicon oxide, and the outer part of the package consists of a thick organic layer and the front cavity extends through the silicon membrane so the active layer is not supported by the silicon membrane.

With reference to FIG. 5, a third embodiment of a package for an electronic component 210 is now described. As with the embodiment 10 of FIG. 1, the component is an FBAR resonator module 115 having a back cavity 14 and a front cavity 216 on each side of the resonator module 115.

The back end 1 of the embodiment of FIG. 5 is identical to the back end 1 of the first and second embodiments as shown in FIGS. 1, 2 and 4.

The resonator module 115 consists of an active layer 12 that is a piezoelectric membrane, sandwiched between a back electrode 18 and a front electrode 20, where the back electrode 18 is covered with an outer passivation layer 39 but with no further lower layers between the front electrode 20 and the front cavity 216, and is thus identical with the resonator module 115 of the embodiment of FIG. 4. The front electrode 20 forms the inner surface of the lower cavity 216. The electrode coated but unsupported active membrane layer 12 spans across the front cavity 216 that is fabricated in the front inner section 2 of the front end 3 of the package for an electronic component 210, and the front cavity 216 is sealed with a front outer section 4 which in this case consists of an organic outer layer 148 available as a dry film, and which may be SU-8, PDMS, epoxy, PBO (Zylon™) i.e. poly(p-phenylene-2,6-benzobisoxazole) or TMM which is available as TMMF S2000 film photoresist, for example.

The front inner section 2 consists of a silicon membrane 24 coupled by a buried silicon oxide 26 BOX layer to a 'handle', i.e. a silicon wafer 28 as in the embodiment of FIGS. 1 and 2, but in this instance, the silicon membrane 24 within the front cavity 216 is removed and the unsupported active membrane layer 12 with its front and back electrodes 18, 20 and outer passivation layer 39 over the back electrode 18 spans across the front cavity 216 that is fabricated in the front inner section 2 of the front end 3 of the package for an electronic component 210. Since the front outer section 4 consists of an organic layer 148, it can be applied as a film that is directly laminated onto the silicon wafer handle 28 so there is no need for a package bonding layer 30 as required for the embodiments shown in FIGS. 1, 2 and 4.

Again, a low permittivity inner passivation material 36 such as $SiO_2$, Fluorine-doped Oxide (SiOF), Porous Oxide, Carbon-doped Oxide (SiCO) or other low k dielectric material, is selectively deposited onto the back surface of the silicon oxide layer 26, and around the electronic component 115 and partially covers it. In this instance, the low permittivity passivation material 36 covers the sides and outer perimeter of the piezoelectric membrane 12, front electrode 20 and the remains of a bonding layer 22 typically Au, Au—In, ScAlN or AlN, but possibly $SiO_2$, that is typically about 100 nm thick and the silicon membrane 24.

As with the other embodiments, the front electrode 20 and back electrode 18 may be Mo, W, Ti—W or Ru, for example. Again, a stiffening frame 18A which typically has a pentagonal shape (see FIG. 3), typically of the same material as the back electrode 18 may be selectively deposited onto the back electrode 18 itself, around the perimeter of the top surface of the piezoelectric membrane 12. The back electrode 18, the raised frame 18A and front cavity 16 (116, 216) have the same pentagonal shape, with the front cavity 16 (116, 216) being at least as large as the vibrating part of the back electrode 18 as defined by the raised frame 18A, and this aids in optimizing the vibration mode of the resonator.

An individual die may comprise an array of resonators coupled together to create a filter. Additionally, a mass loading layer (not shown) of the same material as the back electrode 18 may be selectively patterned over the entire back electrode surface of certain resonators within the filter die. Such a mass loading layer may be used to reduce the central frequency of certain resonators, such as shunt resonators, when compared to the central frequency of other resonators, such as series resonators within the same filter die.

The structure is coated with an outer passivation layer having routes patterned therein that are filled with a metal, typically gold, to form internal routing layers 38, 38' that are selectively deposited onto the back electrode layer 18 over the inner layer of passivation material 36 and around the resonator membrane 12 for the eventual attachment of filled vias 40, 42 thereto to enable electrical connection of the electronic component 115 to external pads 43, 43B capped with solderable bumps 50, 50B.

The inner layer of passivation material 36 and the back electrode layer 18 thereover are patterned, and on one side of the electronic component 15, a through via hole 44 traverses through the inner layer of passivation material 36 to the front electrode 20. This through via hole 44 may be fabricated by selectively dry etching the inner passivation layer 36. The back electrode layer 18B deposited thereover is thereby connected to the front electrode 20 which is typically fabricated from the same material as that selected for the back electrode 18, but is separated from (in electrical isolation from) the back electrode 18 over the resonator membrane 12. The inner conductive routing layer 38 ensures mechanical adhesion and electrical contact to the filled vias 42 and to the back electrode layer 18 over the inner layer of passivation material 36 on one side (to the left in FIG. 5) of the active membrane layer 12 and part of this section of the back electrode layer 18 extends over and covers the upper surface of the active membrane layer 12. On the other side (to the right in FIG. 5) the back electrode layer 18B is detached from the back electrode layer 18 covering the upper surface of the resonator 12 and this section of the back electrode layer 18B is coupled to the front electrode layer 20 through the via hole 44.

The outer passivation layer 39 may be fabricated from AlN, ScAlN, SiN or some other dielectric material that is resistant to HF attack and free of moisture absorption, and is selectively deposited over the silicon oxide layer 26, the inner layer of passivation material 36, the exposed back surface of the piezoelectric membrane 12 and the back electrode 18, and is patterned with routes. A conductive routing material is deposited into the pattern creating conducting routes 38, 38' that also serve as contact pads for the attachment of the vias 40, 42 thereto.

An organic support layer 46 covers the outer passivation layer 39 around the piezoelectric resonator film and defines the side walls of upper cavity 14. Via holes pass through this layer to the inner routing layer 38. A continuous organic film 48 that is typically the same material as that of the support layer 46, covers the organic support layer 46 and the cavity 14, both defining the outer end of the cavity 14 and sealing it.

The organic support layer 46 and continuous organic film 48 are typically the same material and may be SU-8, PDMS, PBO (Zylon™ i.e. poly(p-phenylene-2,6-benzobisoxazole)), epoxy or TMMF which is available from TOK™. Both the organic support layer 46 and continuous organic film 48 may be TMM. Being photosensitive, the organic support layer 46 may be patterned with the cavity 14, via holes and deep trenches 65, and the continuous organic film 48 may be patterned with via holes 61 and deep trenches 65, as well.

In some embodiments, a sealing liner coating 34' is applied to the back end of the package 1, to improve the Moisture Sensitivity Level (MSL) of the filter package, taking care not to fill the via holes and the upper surface therearound where contact pads 43, 43B are deposited, or subsequently removing the sealing liner coating 34' from these areas.

Filled electrical vias 40, 42, typically of copper, pass through the organic support layer 46 and organic film 48 and mechanically and electrically couple to the conductive routing layers 38, 38' by apertures in the outer passivation layer 39 that act as contact pads 38'. The filled electrical vias 40, 42 and routing layers 38, 38' providing contacts to the back electrode 18 and front electrode 20, and via a termination layer 45 and 45B that may be nickel, that is deposited onto the outer copper via pads 43 and 43B, to solderable bumps 50, 50B fabricated from solder, tin or lead free solder, for example.

The electronic component 115 or resonator, and the back end 1 of the package 210 rest on a silicon oxide layer 26. The edges of the front electrode 20 on the piezoelectric active membrane layer 12 is coupled by a bonding layer 22 to a silicon membrane 24 which is coupled to the silicon oxide layer 26. The bonding layer 22 between the front electrode 20 and the silicon membrane 24 may be a gold-indium eutectic, gold, AlN, ScAlN or SiO$_2$ that is typically about 30 nm to 1000 nm (1 μm) thick. Essentially two identical bonding coatings are fused together to form the bonding layer. However, as with the second embodiment, the front electrode 20 is adjacent to the lower cavity 216.

Unlike the first embodiment, in the third embodiment shown in FIG. 5, the silicon membrane 24 does not span the lower cavity 16. It does, however rest on the inner silicon oxide layer 26.

Thus in this third embodiment of FIG. 5 the silicon membrane 24 is not part of the electronic component 215 which in this instance is a resonator. It does not stiffen the active membrane layer 12, but merely enables it to be connected to the silicon oxide layer 26 which rests on a thicker silicon wafer 28 that is also known as a 'handle'. Thus the silicon membrane 24 together with the bonding layer 22 thereover, only serves to connect the front electrode 20 of the component 215 to the oxide layer 26. The silicon membrane 24, oxide layer 26 and silicon handle 28 are, however, the remains of what once was a continuous silicon membrane connected via a continuous silicon oxide layer to a high resistivity silicon wafer handle, and such membrane 24 on handles, joined by a layer of silicon oxide 26 are commercially available. However, within the cavity 216, all three layers of the wafer 24 on handle are removed, typically by being etched away.

Again, the single crystal silicon membrane 24 may have any of the following orientations: <111>, <100> and <110>. The thicknesses of such membranes are typically within the range 0.05 to 0.5 μm and are commercially available, supplied as membrane on BOX. The appropriate thickness is dependent on the frequency band of the filter.

The front cavity 16 is provided alongside the front electrode 24 attached to the piezoelectric membrane 12 and has side walls formed by the bonding layer 22, silicon membrane 24, silicon oxide 26 box layer, and silicon wafer 28 or handle. The base of the cavity 216 is the front outer layer 4 which in this embodiment is an organic layer 148 that is attached to the silicon wafer 28 around the cavity 216. In this embodiment, the organic front outer layer 148 is much thicker than the optional organic package binding layer 30 of the first and second embodiments and should be available as a dry film. For example, TMM which is available as TMMF S2000 film photoresist from TOK (Tokyo Ohka Kogyo) could be used. It is expected that over time, other appropriate organic dry films will become commercially available.

Trenches 65 may be developed in the organic support layer 46 and continuous organic film 48 of the organic back end 1 of the array of packages for an electronic component 210. The trenches relieve stress 65. The back outer surface and the bank trenches 65 may be coated with a liner sealing coating 34' which may be a dielectric with a low humidity absorption and deposition temperature (<250° C.) such as AlN, SiN, Ta$_2$O$_5$ or TaN. The liner sealing coating 34' seals the organic materials, preventing damage due to humidity. The sealing coating 34' may be applied by RF sputtering or PECVD, for example, to generate void free films.

Also shown in FIG. 5 are deep etched front trenches 60 through the organic front outer layer 148 and into the silicon handle 28.

The front trenches 60 and the under-side of organic front outer layer 148 may be coated with a sealing liner coating 34 such as AlN, SiN, Ta$_2$O$_5$ or TaN, for example.

However, in some embodiments, such as those covered with a thick layer of underfill/over-mold epoxy materials on mounting, there is a much larger thickness of polymer protecting the active membrane than the package per se, and one or other of the sealing coatings 34, 34' may be unnecessary for some applications. However, for applications with harsh environments and so-called "mission critical" applications in the automotive, military or avionics industries and the like, such sealing coatings 34, 34' providing extra humidity protection are required.

The array of packages for an electronic component 210 may be diced into individual packages for an electronic component 210 by cutting through the silicon handle 28 to connect the front and back trenches 60, 65.

Figure 6:
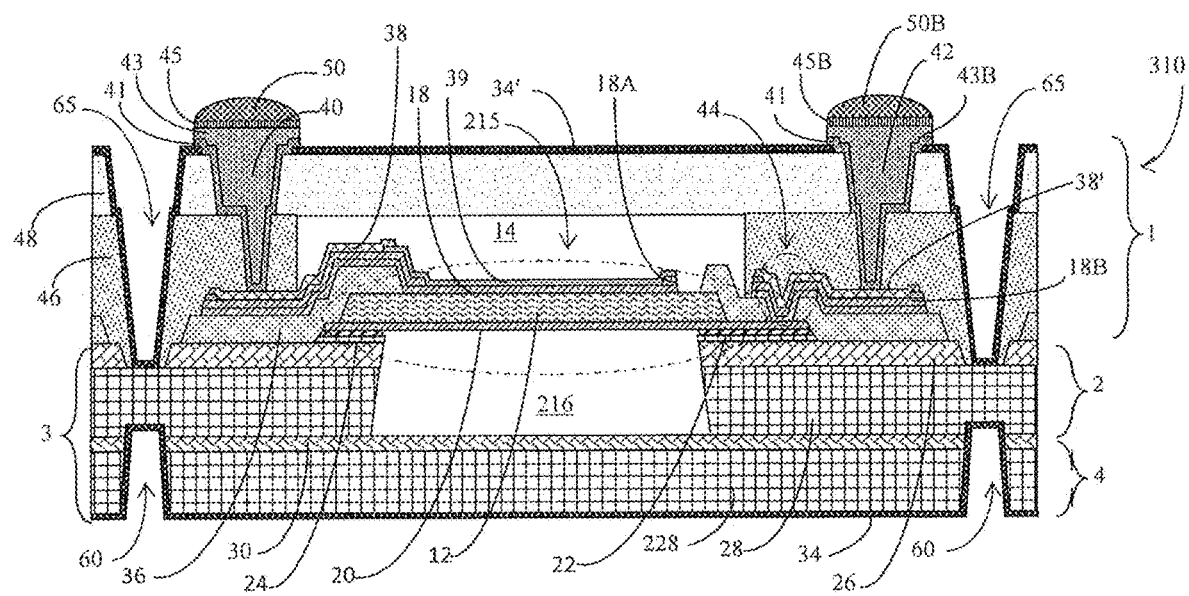
FIG. 6 is a schematic not-to-scale cross-sectional representation of a fourth embodiment of a packaged membrane such as a FBAR resonator module where in this case, the inner part of the front section consists of a silicon membrane coupled to a silicon handle by a buried oxide (BOX) of silicon oxide, and the front cavity extends through the silicon membrane so the active layer is not supported by the silicon membrane, however, the outer part of the front side of the package consists of a silicon wafer.

With reference to FIG. 6, a fourth embodiment of a package for an electronic component 310 is shown. In the fourth embodiment, the back end 1 is the same as in the embodiments above, mutatis mutandis, and the front inner section again comprises a silicon wafer 24 coupled by a BOX (buried oxide) layer of silicon oxide 26 to a silicon handle 28 as in the embodiment of FIGS. 1, 2 and 5. The front cavity 216 is again fabricated by removing part of the silicon handle 28 and silicon oxide layer 26 from under the active membrane layer 12, but in this embodiment, as with the embodiment of FIG. 5, the silicon membrane 24 is also removed from the front cavity 216 so the resonator 215 active membrane layer 12 and lower electrode 20 span the front cavity 26 without being supported by a silicon membrane 28. However, unlike the embodiment of FIG. 5 but like that shown in FIGS. 1 and 2 (and similar to the embodiment of FIG. 4) the front outer section is a silicon, glass, sapphire or AlN wafer 228 which is attached to the silicon handle 28 with a package bonding layer 30.

Where the wafer 228 is silicon, the bonding layer 30 may be SiO$_2$ grown on the mating surfaces by thermal oxidation or deposited by PECVD. The package bonding layer 30 may also comprise an adhesive layer, such as gold or gold-indium, in which case, adhesion layers of titanium or chromium may be required. Alternatively, the silicon, glass sapphire or AlN wafer 228 may be attached to the silicon handle 28 by a bonding layer 30 that is an organic adhesive layer such as SU-8, PDMS, PBO, epoxy, TMMR or TMMF; both available from TOK™, or various ink jetable die attach polymers as available from Sekisui™ or Inkron™ for example, and the like. Again, back trenches 65 and sometimes front trenches 60 are provided through the back of the package 1 and the outer part 4 of the front of the package 3 to the silicon handle 28 to reduce stress and possibly facilitate sectioning, and the back of package and back trenches 65 may be coated with a sealing liner coating 34. Similarly, the wafer 228, exposed package bonding layer 30 and front trenches 60 may be coated with a sealing liner coating layer 34. The sealing liner coatings 34, 34' may consist of a dielectric material with a low humidity absorption and low deposition temperature (<250° C.) such as AlN, SiN, Ta$_2$O$_5$ or TaN, for example.

With reference to FIG. 7, in a fifth embodiment of a package for an electronic component 410, the back section 1 of the package is the same as in the other embodiments, but in this embodiment, the front electrode 20 mutatis mutandis is directly attached by a bonding layer 22 mutatis mutandis to a silicon oxide layer 26 on a silicon wafer 28 'handle', (i.e. in contradistinction to the third and fourth embodiments, without any silicon membrane 24 intervening between the bonding layer 22 and silicon oxide layer 26). A cavity 216 is formed in the silicon oxide layer 26 and silicon handle 28. Usefully, for bonding to silicon-oxide layer 26, a thin bonding layer 22 of silicon oxide may be deposited onto the ultra smooth front electrode 20 and then fused to the silicon oxide layer 26 on the silicon handle 28. Then, when the cavity 216 is made in the silicon handle 28 and silicon oxide bonding layer 26, the silicon oxide bonding layer 22 is also etched away. Alternatively the bonding layer 22 may be gold, gold-indium, AlN or ScAlN, and is removed from within the front cavity 216, exposing the lower front electrode 20.

As in the third embodiment shown in FIG. 5, the base of the cavity is provided by an organic front outer layer 148 which may be SU-8, PDMS, PBO (Zylon™) or TMM, for example. The trenches 60 and the under-side of the organic front outer layer 148 may be coated with a sealing layer 34, mutatis mutandis. However, in some applications, due to the application of underfill and over-mold materials that are part of the RF module package that contains the filter flip chip die, the sealing layer 34 may not be needed.

It will be noted that the organic front outer layer 148 may be applied as a dry polymer film and no separate package bonding layer 30 is required to attach the organic front outer layer 148 to the silicon handle 28. Again, front trenches 60 and back trenches 65 are provided through the back of the package 1 and the outer part 4 of the front of the package 3 to the silicon handle 28 to reduce stresses and to aid in sectioning.

It will be appreciated that although RF resonators are primarily used as filters, they also find other uses, such as sensors, for example. There is also interest in tunable resonators that can operate at different frequencies. It will also be appreciated that the back end 1, i.e. the organic packaging solution used for creating the back cavity 14 over the back electrode 18 and having filled vias 40, 42 terminated with external via pads 43, 43B, thin layers of terminations 45, 45B typically nickel, and then solderable bumps 50, 50B fabricated from solder, tin, SnAg or lead free solder, for example, as shown in FIG. 1 may be used to provide the 'back end' for other electronic components, and may also be used in other packaging solutions for the 'front end', i.e. the front electrode 20, lower cavity 16 and the layers therearound. Such package solutions may include other resonator packages, and also packages for other electronic components for example, the package 10 shown in FIG. 1, particularly the back end 1 thereof may be used for packaging a fuse surrounded by cavities 14, 16 and running between vias 40 and 42 for flip chip coupling to a circuit board.

At a first approximation, the resonant frequency fR of a piezoelectric resonator is given by the following equation: $fR=v/\lambda \approx vL/2t$ where vL is the longitudinal acoustic velocity in the normal direction of the piezoelectric layer, t is the thickness of the piezoelectric film and $\lambda$ is the acoustic wavelength of the longitudinal wave. However, in practice, the acoustic properties of the other layers of the resonator affect the resonator performance. In particular, the mass loading effect of the electrodes which may be fabricated by heavy metals such as molybdenum, tungsten, titanium-tungsten or rubidium, for example.

The various possible arrangements of resonators to create filters is beyond the scope of this application. In general, however, a filter module comprises a plurality of composite FBAR resonators modules 10 coupled in half ladder or lattice arrangements or combination thereof.

Figure 8:
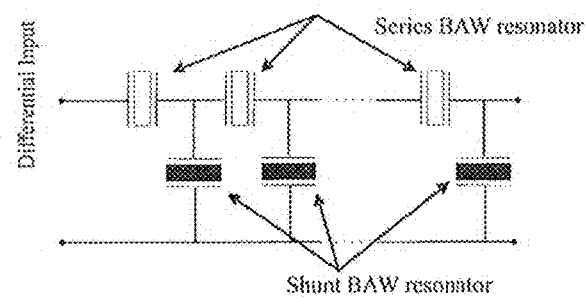
FIG. 8 is a simplified circuit of a ladder type RF filter configuration.
Figure 9:
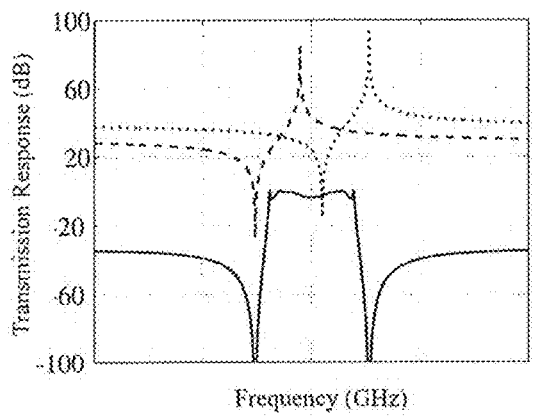
FIG. 9 is a graph showing the transmission response of the ladder filter configuration of FIG. 8.
Figure 10:
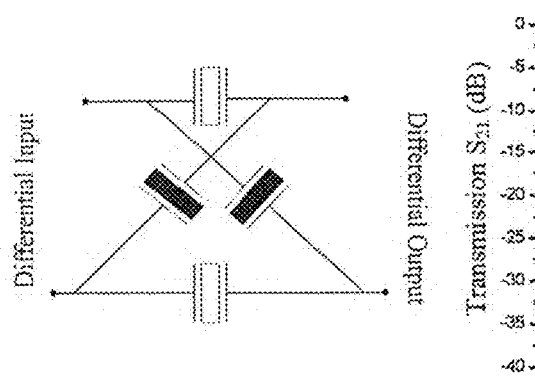
FIG. 10 is a simplified circuit of a lattice type RF filter configuration.
Figure 11:
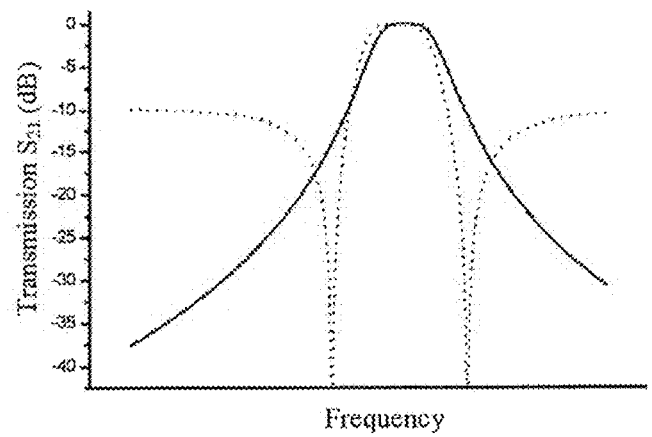
FIG. 11 is a graph showing the transmission response of the lattice type filter configuration of FIG. 10.

With reference to FIG. 8, a simplified circuit of a half ladder type filter configuration created by BAW resonators in series with shunt BAW resonators is shown. In a filter, resonators are combined in a 'ladder', wherein each 'rung' or 'stage' comprises two resonators: one in series and the other connected in shunt. With reference to FIG. 9, adding rungs to the ladder, improves the rejection of undesired frequencies, creating a signal with less out-of-band rejection (a steeper skirt) but this is at the expense of insertion loss and greater power consumption. With reference to FIG. 10, another resonator configuration may be a "lattice", which, as shown in FIG. 11 has poorer cutoff but better out-of-band attenuation.

Figure 12:
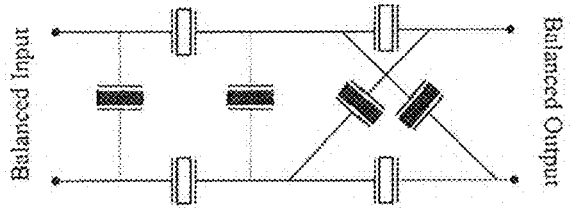
FIG. 12 is a simplified circuit of a combined ladder and lattice type RF filter configuration.
Figure 13:
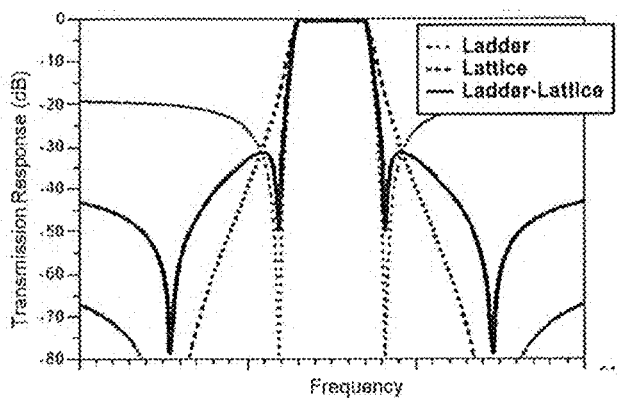
FIG. 13 is a graph showing the transmission response of the filter configuration of FIG. 12.

With reference to FIG. 12, the ladder and lattice type circuits may be combined to provide the transmission response shown in FIG. 13.

It is a feature of the present invention, that the thickness of the piezoelectric membrane, the electrodes and the outer passivation layer may all be trimmed to very precise thicknesses, thereby setting the frequency response of the filter to a desired value, thereby increasing yields.

In some embodiments the active membrane is trimmed to a desired thickness by applying a scanning surface ion milling process over the surface of the active membrane. After trimming, the piezoelectric layer may have a thickness uniformity of +/−0.5 nm, and a surface roughness of below 0.3 nm.

Typically the full array of resonators within each filter unit is trimmed by reducing the outer passivation layer to a desired thickness. A typical thickness of the outer passivation layer before trimming is in the range of from 200 nm to 300 nm, and after trimming is typically around 100 nm. However, it will be appreciated that different trimming may be specified for different filters that are cofabricated within the same wafer and the thickness of the passivation layer covering different resonators within a filter unit may vary between resonators. Furthermore, some resonators within a multiple resonator filter package further comprise a mass loading layer covering the entire vibrating part of the back electrode thereby providing a damping effect. This provides a very high level of controlled variability between resonators and filters fabricated in one batch, where essentially each and every resonator may be individually tailored for a specific application.

It will, be appreciated that the various candidate materials listed for parts of embodiments shown herein may be used in other embodiments. Furthermore, the packages described herein may be used for packaging other electronic components, and not just resonators and filters as described. Furthermore, the back end 1 of the package may be combined with front ends of other packages for packaging other resonators, filters, sensors, fuses, and so on.

Methods of fabrication of the packaged filters and resonators will now be described.

For purpose of illustration, the following description will focus on a manufacturing route for an FBAR resonator having an ScAlN membrane.

Figure 14A:
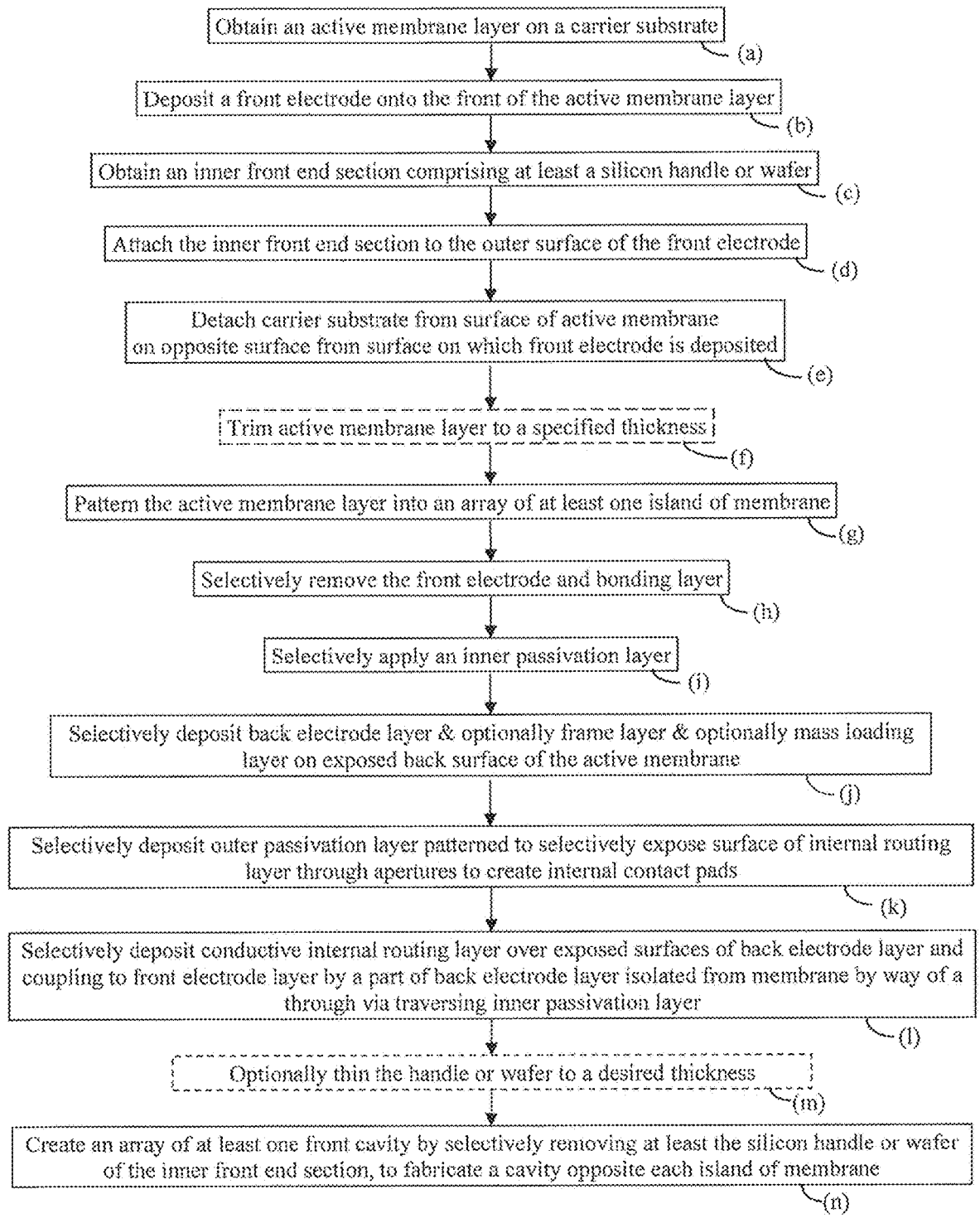
FIGS. 14A and 14B are flowcharts showing the steps for manufacturing the packaged electronic component in accordance with embodiments of the invention.
Figure 14B:
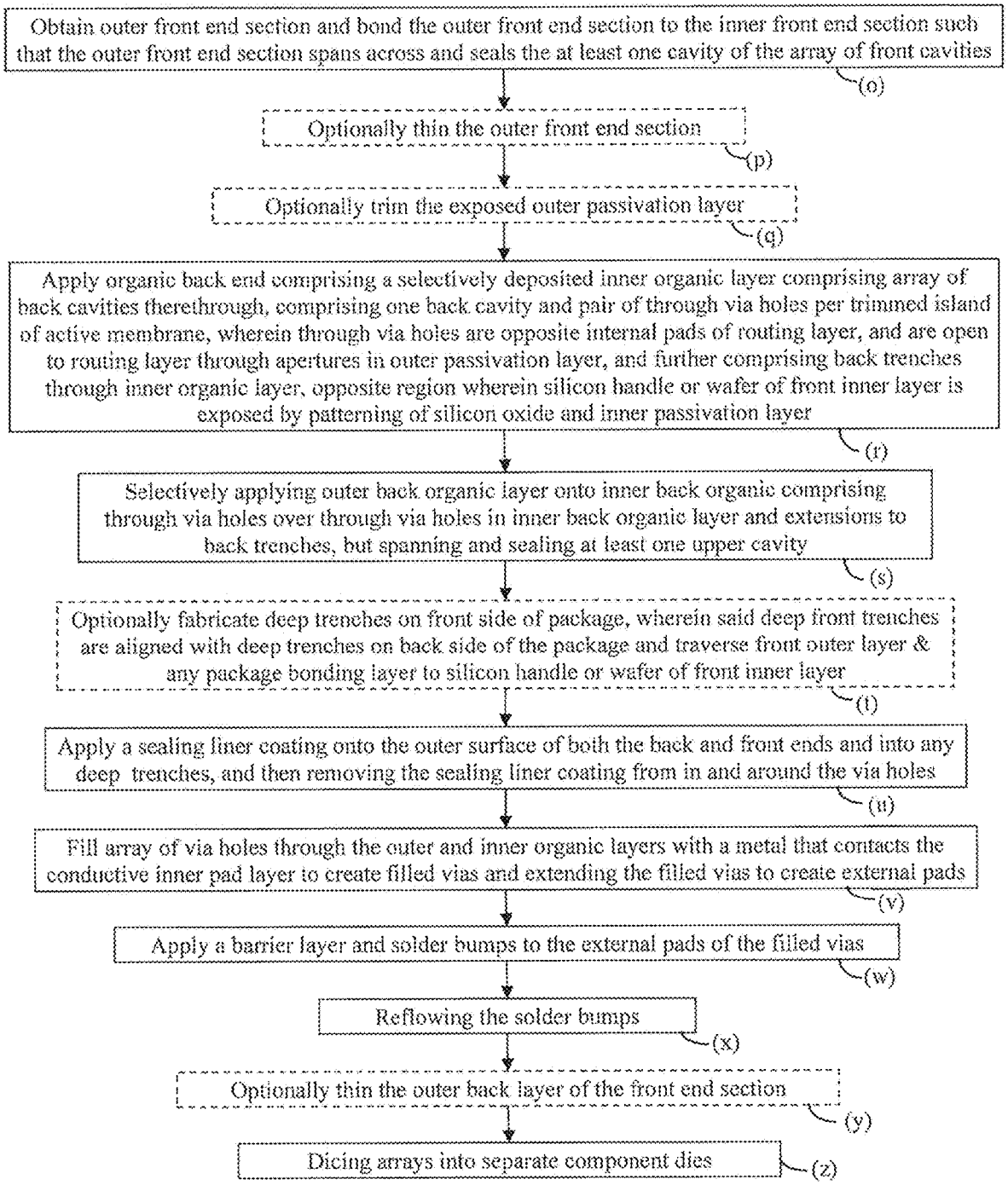

FIGS. 14A and 14B are flowcharts showing the steps of a method for fabricating the embodiment of FIG. 2. FIGS. 15-49 illustrate intermediate structures. Where appropriate, variant steps are given to show how the embodiments of FIGS. 3-7 are obtained.

Thus, with reference to FIGS. 14A and 14B, a method for fabricating the package for an electronic component 10 of FIG. 2 is now provided.

Figure 15:
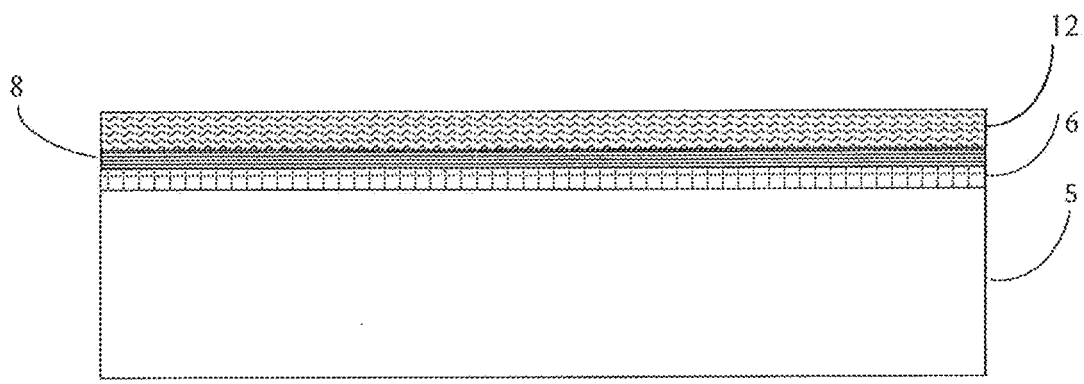
FIGS. 15-49 show intermediate structures obtained when manufacturing the packaged electronic component by following the method of FIGS. 14A and 14B.

Firstly, and as shown in FIG. 15, an active membrane 12 such as a single crystal (XRD FWHM<0.1 degree) layer or highly oriented (XRD FWHM<1 degree) crystalline membrane of a piezoelectric material is obtained—step (a). The piezoelectric material may be $Ba_xSr_{(1-x)}TiO_3$ (BST) typically with x ranges from 5% to 50%, AlN, $Al_xGa_{1-x}N$ (AlGaN) typically with x ranges from 10% to 90%, or $Sc_xAl_{(1-x)}N$ (ScAlN) with x in the range of 5% to 43%, and typically between 10% to 36%, and is provided on a carrier substrate 5 which is typically a single crystal sapphire substrate, but could be a silicon wafer, for example.

The carrier substrate 5 is covered with a release layer 6 of GaN.

Carriers 5 consisting of c-axis <0001>±1° sapphire wafers with an un-doped Gallium Nitride (U-GaN) release layer 6 having a c-axis <0001>±1° orientation are commercially available with diameters of 4" and 6", for example and thicknesses of 650 µm and 1000 µm respectively. These have a highly polished, smooth surface having an RMS smoothness of less than 1 nm. The U-GaN release layer 6 has a thickness ranging from 0.5 µm to 5 µm and a polished surface having an RMS of less than 1 nm ready for epitaxial growth thereon. At present such Sapphire wafers 5 coated with U-GaN 6 are commercially available from various Chinese manufacturers including San'an Optoelectronics Co., Ltd. (San'an™), Suzhou Nanowin Science and Technology Co., Ltd (NANOWIN™). These substrates were developed for the Light Emitting Diode (LED) industry.

If required, one or more buffer or seed layers 8 may be deposited onto the GaN release layer 6 and then an active membrane layer 12 that is typically a highly oriented polycrystalline membrane and preferably single crystal of a piezoelectric material is attached thereto. Methods of depositing various piezoelectric materials as single crystals on sapphire membranes are described in US patents such as co-owned U.S. Pat. Nos. 10,508,364, 10,601,397, 10,466,572, and 10,439,581 all to Hurwitz.

Where the active membrane layer 12 is $Ba_xSr_{(1-x)}TiO_3$ (BST) the buffer or seed layer 8 may be of <100> $TiO_2$ (rutile) or of <111> $SrTiO_3$ or a single crystal layer of <100> $TiO_2$ layer followed by a <111> single crystal $SrTiO_3$ layer and may be deposited by Oxide Molecular Beam Epitaxy using commercially available equipment that is obtainable from vendors such as Vacuum Microengineering Inc., Varian™, Veeco™ and SVT Associates™. The Gallium Nitride release layer 6 is typically about 2.5 µm thick and has an RMS smoothness of <1 nm. Because of the lattice matching between the <100> plane of the rutile $TiO_2$ or the <111> plane of single crystal $SrTiO_3$ in the buffer layer 8 and the <0001> plane of the GaN 6 and Sapphire 5, the buffer layer 8 may be laid down as a single crystal membrane.

In other embodiments, the carrier substrate 5 comprises a single crystal <111>, <110> or <100> silicon wafer having a c-axis <0001> single crystal GaN release layer deposited thereon. Such U-GaN release layers 6 on silicon substrates 5 typically having a thickness in the range of 0.05 µm to 10 µm and are commercially available from various companies such as Xiamen Powerway Advanced Material Co. Ltd. from China for example.

An active membrane layer 12 of $Ba_xSr_{(1-x)}TiO_3$ (BST), typically having a thickness of between about 300 nm and 1000 nm is then deposited onto the buffer layer 16 using oxide molecular beam epitaxy (MBE) using Barium Oxide, Strontium Oxide and Titanium Oxide effusion cells in low pressure excess oxygen. The oxide molecular beam epitaxy (MBE) is a high purity low energy deposition technique that allows for low point defect manufacturing. Because of the close matching between the <111> $Ba_xSr_{(1-x)}TiO_3$ lattice spacing and the lattice spacing of the <100> $TiO_2$ (rutile) or <111> single crystal $SrTiO_3$ buffer or seed layer 8 and between the lattice spacing of the buffer or seed layer 8 and the lattice spacing of the c-axis <0001>±1° Sapphire wafer 5 with c-axis <0001>±1° Gallium Nitride (U-GaN) 6 release layer, the $Ba_xSr_{(1-x)}TiO_3$ 18 may also be deposited as a single crystal active membrane layer 12.

AlN, $Al_xGa_{1-x}N$ and $Sc_xAl_{(1-x)}N$ are HCP type Wurtzite crystal structures having a C plane orientation. A strong C axis texture is the most important prerequisite for AlN, ScAlN and AlGaN FBAR filters because the acoustic mode of the FBAR needs to be longitudinally activated and the piezoelectric axis of AlN, ScAlN and AlGaN is along its c-axis. The addition of either gallium or especially scandium to AlN makes it easier to match the lattice spacing of the film with that of the substrate and to further increases the $K^2_{eff}$ of the piezo material thus the bandwidth of the RF filter. For example, a piezoelectric layer 12 of $Sc_{0.16}Al_{0.84}N$ (x=has a lattice constant of 3.19 angstrom, the same atomic spacing as the lattice constant of the GaN release layer 6. Thus, a low stress $Sc_{0.16}Al_{0.84}N$ film with a very high crystal orientation or single crystal may be grown onto GaN and exhibits high Q and $K^2_{eff}$ values.

Methods of making RF resonators and filters from these materials are described in U.S. Pat. Nos. 10,141,912 and 10,153,750 titled "RF Resonators and Filters". However, the packaging solutions described therein include ceramic lids that are expensive and fragile.

Since there are no grain boundaries in a single crystal, the attenuation of the acoustic signal in single crystal piezoelectric membranes is reduced. This also minimizes the lost energy that is otherwise transferred into heat and which has to be dissipated.

Strongly textured piezoelectric membranes 12 of BST, AlN, AlGaN and ScAlN and single crystal membranes thereof have smoother surfaces than randomly oriented films. This results in less surface roughness of the interface between the piezoelectric film and the electrode, thereby avoiding longitudinal acoustic waves being into lateral acoustic waves and reducing Q factor. The smooth electrode-piezoelectric interfaces that are obtainable with a highly textured crystalline or a single crystal piezoelectric membrane 12 having both back and front electrodes 18, 20 deposited thereupon, are thus extremely advantageous. Furthermore, the improved surface roughness assists with reducing the sheet resistance of the thin film electrodes (towered bulk resistivity values of the metal) for additional improvements of Q values. Where the electrode deposition process is well controlled it becomes possible to take advantage of the highly oriented piezoelectric film to grow highly oriented electrode structures thereover, and thus achieve even better electrical conductivity properties of the electrode with improved acoustic properties and over all better resonator Factor Of Merit (FOM) values.

In the case of AlN or Ga and especially Sc doped AlN piezoelectric membranes 12, the usage of a gallium or scandium doped AlN seed layer 8 makes it easier to match the lattice spacing of the piezoelectric membrane 12 with that of the U-GaN layer and with thee electrodes.

For example, if a piezoelectric single crystal layer 12 of $Sc_{0.275}Al_{0.725}N$ that has a lattice constant of 3.25 angstrom is required, a seed layers 8, such as $Sc_{0.20}Al_{0.80}N$ with lattice spacing of 3.22 angstrom between the GaN and piezoelectric layer 12 may help to bridge the lattice mismatching and enable the growth of a low stress, highly oriented or single crystal $Sc_{0.275}Al_{0.725}N$ membrane 12.

A single crystal active membrane of $Sc_xAl_{1-x}N$ 12 where $0.1 < x \leq 0.25$ may be fabricated by applying a first $Sc_{0.1}Al_{0.9}N$ seed layer 8 onto the surface of the GaN layer provided on a single crystal sapphire carrier. The $Sc_xAl_{1-x}N$ 12 is deposited thereover, and a second seed layer having the same stoichiometry of $Sc_{0.1}Al_{0.9}N$ is deposited onto the $Sc_xAl_{1-x}N$ piezoelectric membrane. The lattice spacing of $Sc_{0.1}Al_{0.9}N$ is 3.15 Å which is the crystal lattice constant of molybdenum, and despite being tetragonal, molybdenum, can be grown as a highly oriented or single crystal form onto the $Sc_{0.1}Al_{0.9}N$ seed layers. A front molybdenum electrode is deposited onto the second seed layer, and subsequently, following removal of the carrier membrane and the GaN layer, a second single crystal layer of molybdenum may be deposited on the freshly exposed back membrane. Although the lattice spacing of GaN is 3.19, it has been found possible to grow $Sc_{0.1}Al_{0.9}N$ directly thereonto. Similarly, but by changing the process sequence, a single crystal active membrane of $Sc_xAl_{1-x}N$ where $0.1 < x \leq 0.36$ may be fabricated by applying the active membrane layer directly onto the surface of the GaN layer provided on a single crystal sapphire carrier. A $Sc_{0.1}Al_{0.9}N$ first seed layer is deposited onto the $Sc_xAl_{1-x}N$ piezoelectric membrane. Again, the lattice spacing of $Sc_{0.1}Al_{0.9}N$ is 3.15 Å which is the crystal lattice constant of molybdenum, and despite being tetragonal, molybdenum, can be grown as a single crystal onto the $Sc_{0.1}Al_{0.9}N$ seed layers. A front molybdenum electrode is deposited onto the first seed layer, and subsequently, following removal of the carrier membrane and the GaN layer, a second seed layer of $Sc_{0.1}Al_{0.9}N$ may be deposited on the freshly exposed back membrane. Following a later step, a second highly oriented or single crystal layer of molybdenum electrode might be deposited onto the second seed layer.

Typically, for fabricating an active membrane layer 12 of $Al_xGa_{1-x}N$ or $Sc_xAl_{(1-x)}N$, the seed layer 8 should be as fully relaxed as possible, and is chosen to bridge the lattice mismatch between the piezoelectric layer 12 and the release layer 6, and in certain applications, to the electrode material, to grow highly oriented electrodes. Typically, the seed layer 8 has a thickness ranging from 3 nm to 100 nm in order to not significantly influence the $k^2_{eff}$ value of the RF resonator and thus the entire filter.

It will be appreciated that the stoichiometry of the piezoelectric layer 12 may be selected for its resonant frequency bandwidth, and one or more seed layers may be applied on both surfaces of the piezoelectric layer 12 to enable lattice matching with the release layer and/or the electrode. Furthermore, once released from the U-GaN release layer 6, one or more further seed layers may be applied on the exposed surface to match the lattice constant of the back electrode that is subsequently deposited thereon.

Typically, the seed layer 8 and the piezoelectric layer 12 may be applied by plasma assisted molecular beam epitaxy, metal-organic chemical vapor deposition (MOCVD) or physical vapor deposition PVD.

Additionally, seed layer 8 may serve as an etch stop layer between the piezoelectric layer 12 and the release layer 6 since later in the process, the release layer 6 must be removed with minimal impact to the thickness and surface roughness of the piezoelectric layer 12. For example, where the release layer 6 is GaN and the active membrane layer 12 is $Sc_xAl_{(1-x)}N$ or $Al_xGa_{1-x}N$, it may be used as seed layers 8 with appropriate stoichiometry (values of x). The seed layer 8 then protects the piezoelectric layer 12 whilst remains of the release layer 6 are removed, by ICP (Inductive Coupling Plasma) dry etching for example.

Other active membranes include $LiNbO_3$ at YX1/36° and $LiTaO_3$ at YX1/42° to YX1/52°. Such wafers can be fabricated by obtaining a bulk single crystal donor wafer of lithium niobate or single crystal lithium tantalate and bombarding the single crystal donor wafer with hydrogen or helium ions to a depth of less than 1.5 microns to generate a membrane that is weakly coupled to the single crystal donor wafer; attaching the side of the wafer with the weakly coupled membrane to a silicon handle by a silicon dioxide layer that is either thermally grown or deposited onto the silicon handle; exposing the single crystal donor wafer to elevated temperature, thereby rupturing bonds holding the membrane to the donor wafer and leaving the single crystal support membrane coupled to the silicon handle by the silicon dioxide layer, polishing to remove damage, and annealing if necessary, to cause atomic rearrangement, and the carrier comprises a silicon wafer. For more information on the fabrication of active membrane layers of these materials, see FIGS. 34-38 of U.S. Pat. No. 10,771,031 to Hurwitz which explains how membranes of these materials may be fabricated by spalling off a single crystal by helium ion bombardment.

Figure 16:
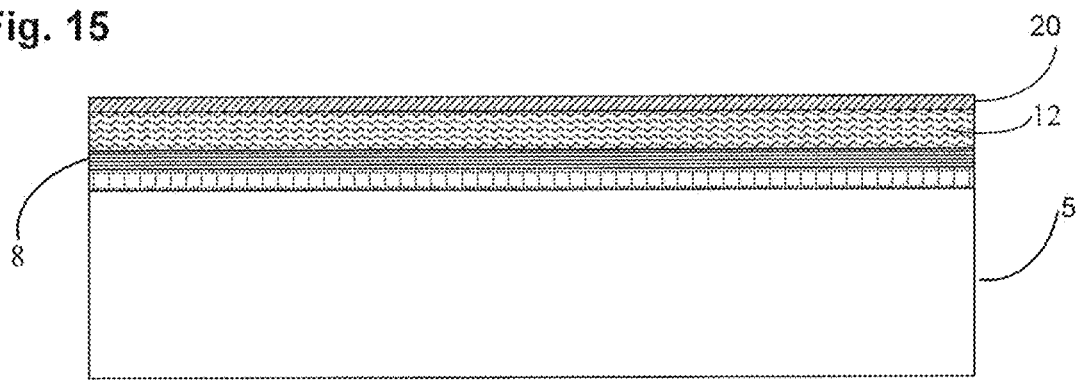

With further reference to FIG. 16, a front electrode 20 is now deposited onto the active layer 12—step (b) of FIG. 14A.

The front electrode 20 is typically a refractory metal such as Mo, W, Ti—W or Ru, which are desirable, having high acoustic velocities, low acoustic attenuations and highly oriented crystalline structure.

The front electrode 20 may be deposited by sputtering or MBE for example. Where, for example, Mo is chosen as the front electrode 20 over a ScAlN piezoelectric layer 12, it is possible to further take advantage of the highly oriented nature of the piezoelectric layer to grow a highly oriented Mo layer with improved conductivity and acoustic properties when compared to a non-oriented Mo structure. This may be achieved by selecting the doping level of the ScAlN, or by applying a seed layer with an appropriate doping level.

Figure 17:
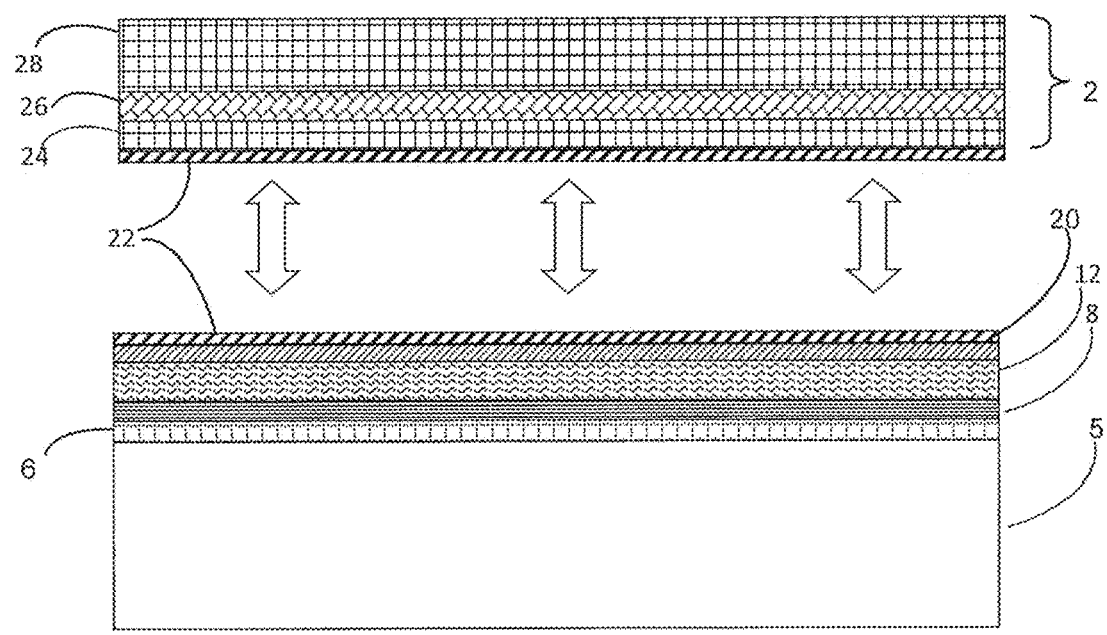

With further reference to FIG. 17, a substrate to serve as a front inner section 2 of the front 3 of the package is provided—step (c). In the embodiments of FIGS. 1, 2, 5 and 6, the substrate consists of a silicon membrane 24 attached by a silicon oxide BOX (Buried Oxide) layer 26 to a silicon handle 28. Such a silicon membrane 24 attached by a silicon oxide BOX (Buried Oxide) layer 26 to a silicon handle 28 is a commercially available structure that is fabricated using the SMARTCUT™ process.

The silicon membrane 24 supporting the active membrane layer 12 in the first embodiment, is part of the resonator 15, and is typically a single crystal silicon layer and may have a <111>, <100> or <110> orientation. In general, the thinner the piezoelectric membrane layer 12, the higher the frequency of the resultant resonator. As the piezoelectric membrane layer 12 becomes thinner, any silicon membrane 24 retained for mechanical support and/or to minimize frequency shifts due to temperature changes has to be thinner as well, to prevent degradation of the resonator performance. Consequently, the optimal thickness of the silicon membrane 24 is in the range from 0.1 μm to 0.5 μm that is frequency dependent. For very high frequencies resonators, the silicon membrane might be abandoned all together. For lower frequencies, a thickness of 0.5 μm is acceptable. The single crystal silicon membrane 24 provides a mechanical support layer and compensates for temperature related frequency changes in the resonator 15 that has low acoustic losses and is itself attached by a layer of silicon oxide 26 using SOI technology to a thicker silicon wafer 28 that is also known as a 'handle', providing a membrane on handle'. Such a membrane 24 joined by a layer of silicon oxide 26 to a silicon wafer 28 handle, is commercially available as a silicon on insulator (SOI) products. Such silicon membrane 24 on handle products are obtainable from SOITEC™ (www.soitec.com) and from WaferPro (www.waferpro.com), for example, who supply silicon films 24 that come in thicknesses in the typical range 0.1 to 0.5 μm that are coupled by a SiO$_2$ box 26 that is typically 1 to 3 μm thick to a silicon 28 handle, that may be 700 μm thick or more, depending on wafer diameter.

Figure 18:
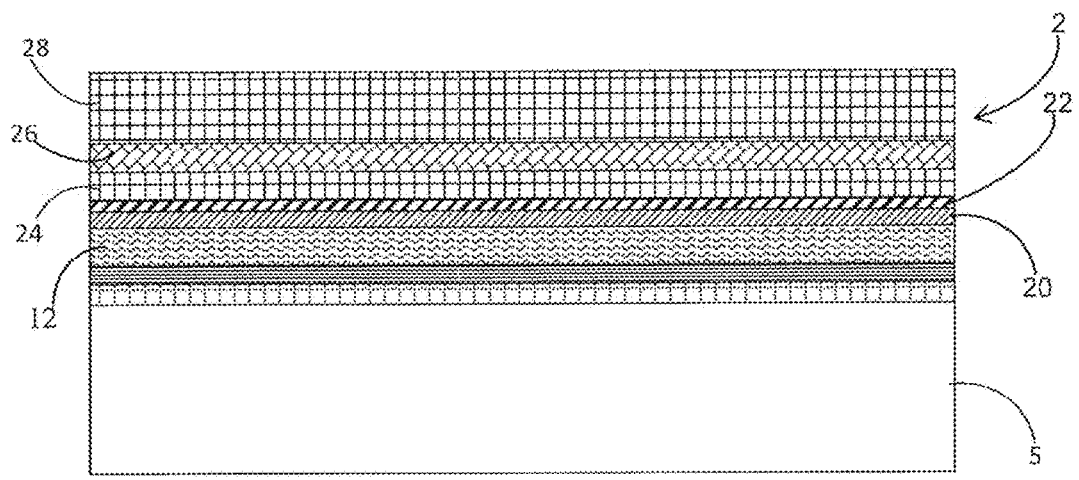

With reference to FIG. 18, the substrate 2 that subsequently serves as the inner section 2 of the front of the package may be attached—step (d) to the front electrode 20 by coating both the first electrode 20 and the inner surface of the front section 2, in this instance, the silicon membrane 24 with half bonding layers which are fused together of FIG. 2, to create a bonding layer 22 that attaches the front electrode 20 to the silicon membrane 24 providing the structure shown in FIG. 13. The bonding layer 22 may consist of Au—In, Au, AlN, ScAlN or SiO$_2$ for example.

In the embodiment of FIG. 4 the substrate that forms the inner section 2 of the front end 3 of the package 110 is simply a silicon wafer 128. In this embodiment, the bonding layer 22 is generated by coating both the first electrode 20 and the inner surface of the front section 2, in this instance, the silicon wafer 128, with half bonding layers which are fused together. The bonding layer 22 may consist of Au, Au—In, AlN, ScAlN or SiO$_2$ for example. Where Au or Au—In is used, sputter deposition is typically chosen. Where AlN or ScAlN is used, sputter or MBE are typically chosen. Where the bonding layer is SiO$_2$, a half layer may be deposited by PECVD on to the electrode layer 20 and the second half PECVD may be deposited or thermally grown onto the silicon wafer 128 and then the two half bonding layers are fused together.

In the embodiment of FIG. 7, the substrate forming the inner section 2 of the front end 3 of the package 310 consists of a silicon oxide layer 27 that might be PECVD coated or thermally grown onto a silicon handle 28 (without a silicon membrane thereover) and fused to a silicon oxide layer deposited by PECVD on electrode layer 20, or a bonding layer 22 that may consist of Au, Au—In, ScAlN, or AlN may be used.

The active membrane 12 is now detached—step (e) from the carrier substrate 5.

Where the carrier substrate 5 comprises a single crystal <111>, <110> or <100> silicon wafer with a c-axis <0001> single crystal GaN release layer, step (e) of detaching the wafer carrier comprises grinding away the wafer carrier to expose the GaN and then removing the residual GaN with ICP plasma.

Where the carrier substrate 5 comprises a sapphire single crystal wafer coated with GaN 6 release layer which typically has a thickness in the range of 0.5 μm to 5 μm. The carrier substrate 5 may be detached—step (e) by laser lift off comprising irradiating the GaN 6 through the carrier substrate 5 using a 248 nm excimer square waveform laser to disassociate the GaN. Such a pulsed laser, with a square waveform is available from IPG Photonics™. The process of detaching step (e) in this manner is known as laser lift-off.

Residual GaN 5 may be removed by Inductively Coupled Plasma with Cl$_2$, BCl$_3$ and Ar for example. This can be achieved at temperatures of below 150° C., avoiding heat treatment of the piezoelectric thin film, and subsequently deposited layers such as the electrode layer. The Cl$_2$, BCl$_3$ and Ar gas ratios may be varied during the GaN removal by ICP to achieve high etch rate selectivity between the GaN 6 layer and the piezoelectric layer 12, as it is vital to keep the uniformity thickness of the piezoelectric layer to below +/−0.5 nm, and the surface roughness to below 0.3 nm to achieve high performance RF resonators.

Inductively Coupled Plasma (ICP) is a commercially available process, using equipment obtainable from NMC (North Microelectrics) China Tool and by SAMCO INC, for example. In embodiments where ScAlN, AlN or AlGaN are used as the piezoelectric layer 12, these values of uniformity and surface roughness may be achieved by the laser lift-off process. Further, a seed layer 8 of ScAlN or AlGaN with a different doping level to that of the piezoelectric layer 12, serving as a robust etch stop, might be applied to protect the thickness uniformity and surface roughness of the piezoelectric 12.

Where the active membrane layer 12 is a Ba$_x$Sr$_{(1-x)}$TiO$_3$ single crystal film, the purpose of the TiO$_2$ (rutile) and/or SrTiO$_3$ buffer layer 8, is to enable the removal of any residual GaN 6 without damaging the integrity of the Ba$_x$Sr$_{(1-x)}$TiO$_3$ active membrane layer 12.

Figure 19:
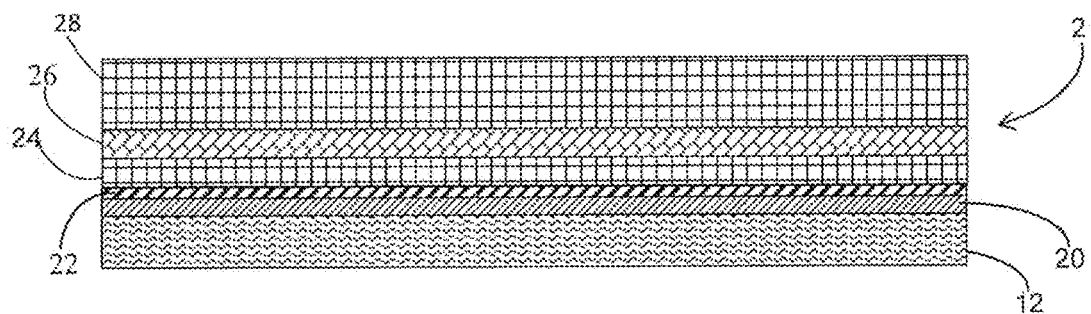
Figure 20:
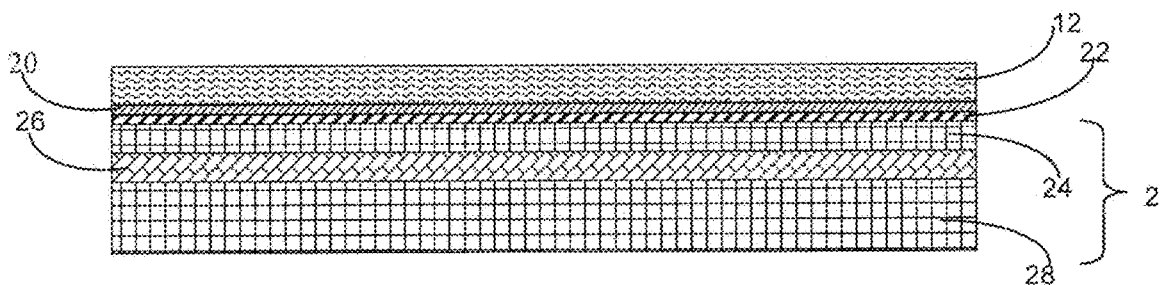

The resultant structure is shown in FIG. 19, and after rotating through 180°, in FIG. 20.

The active membrane layer 12 or seed layer 8 (where used) is then trimmed to a desired thickness—step (f). This may be achieved by applying a scanning surface ion milling process over the exposed surface of the active membrane. By trimming, it is possible to obtain a piezoelectric surface with an average surface roughness of below 0.3 nm and a thickness uniformity better than +/−0.5 nm.

Figure 21:
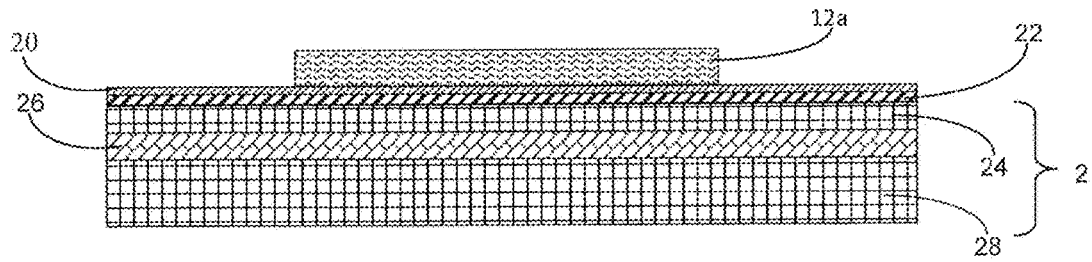

With reference to FIG. 21, when fabricating resonators, the (piezoelectric) active membrane layer 12 is patterned and selectively removed—step (g) of FIG. 14A, to fabricate discrete resonator islands 12a, one of which is shown in FIG. 21. It will be appreciated that the resonators are fabricated in large arrays and FIG. 21 is only a part of such an array so only one island 12a of active membrane layer 12 is shown. One method for selective removal of the (piezoelectric) active membrane layer 12 consists of etching with induction coupled plasma.

Figure 22:
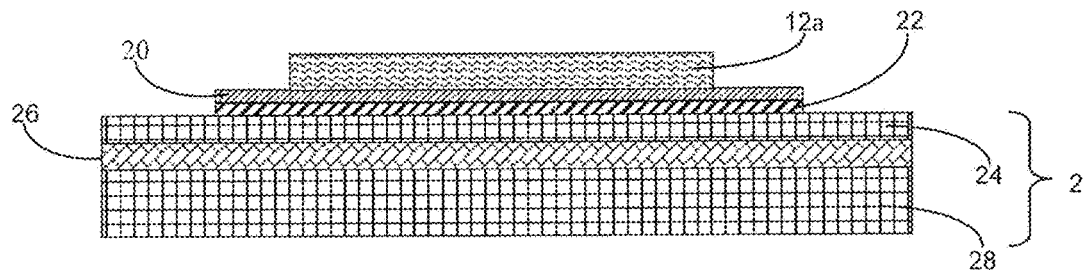

With reference to FIG. 22, the front electrode 20 and the bonding layer 22 are selectively removed from around the islands 12a of active membrane layer 12—step (h) of FIG. 14A, using ion beam etching and/or ion milling for example, selectively exposing the silicon membrane 24 around the resonator island.

Where provided, the silicon membrane 24 may be selectively removed from the back of the structure by ICP or deep reactive ion etching RIE, selectively exposing the silicon oxide box layer 26 around the front electrode 20.

Figure 23:
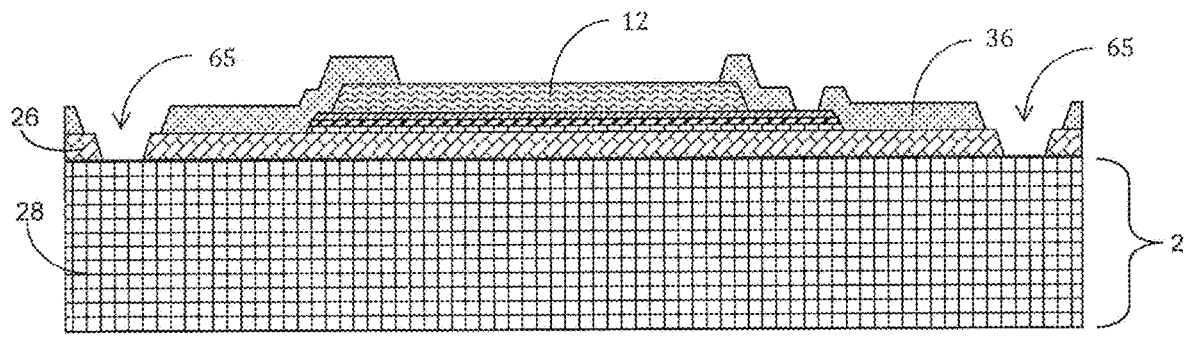

With reference to FIG. 23, an inner layer of passivation material 36 is selectively applied to (applied and selectively etched away from) the back of the islands of active membrane 12a and together with the silicon oxide layer 26 to form trenches 65 down to the silicon handle 28—step (i) of FIG. 14A. The inner layer of passivation material 36 typically consists of a low dielectric constant and low dissipation factor dielectric material such as SiO$_2$, Fluorine-doped Oxide (SiOF), Porous Oxide or Carbon-doped Oxide (SiCO), and having a dielectric constant k≤4.

Figure 24:
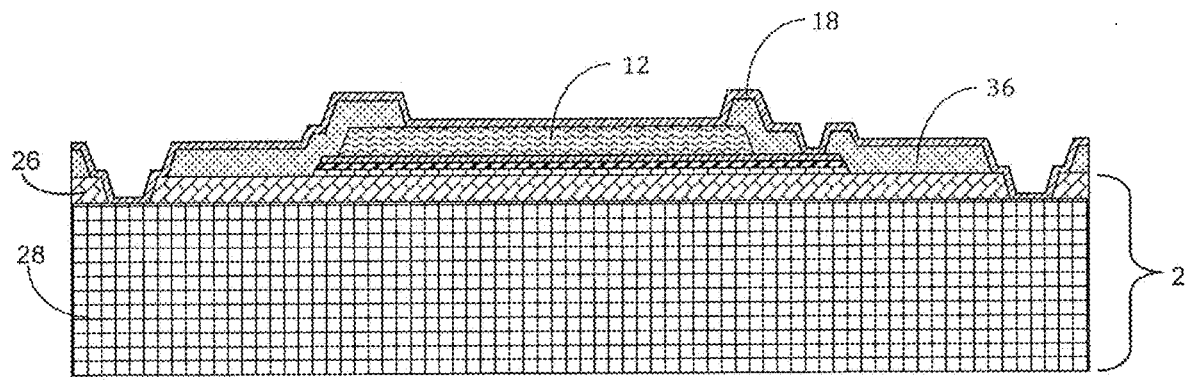

With reference to FIG. 24, a back electrode 18 is now selectively deposited—step (j) of FIG. 14A, onto the exposed active membrane layer 12 and onto the first inner layer of passivation material 36.

Figure 25:
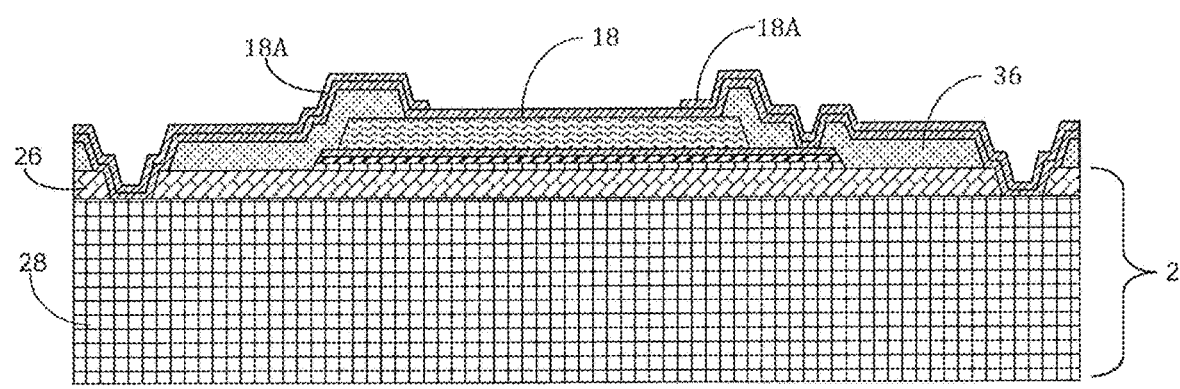

The back electrode 18 may be deposited as a continuous layer onto the exposed active membrane layer 12 and onto the first inner layer of passivation material 36. Preferably, the back electrode 18 comprises a refractory metal having a high acoustic velocity and low acoustic attenuation, such as Mo, W, W—Ti or Ru and it may be deposited by sputtering, MBE or MBE followed by sputtering, for example. Referring to FIG. 25, preferably, in an additional step, a raised frame 18A is deposited onto the back electrode 18 around the perimeter thereof, which typically has a pentagonal shape (see FIG. 23) onto the back of the piezoelectric membrane 12. Preferably the raised frame material 18A is fabricated from the same material as that selected for the back electrode 18, and aids in enhancing the Q value of the resonator.

Figure 26:
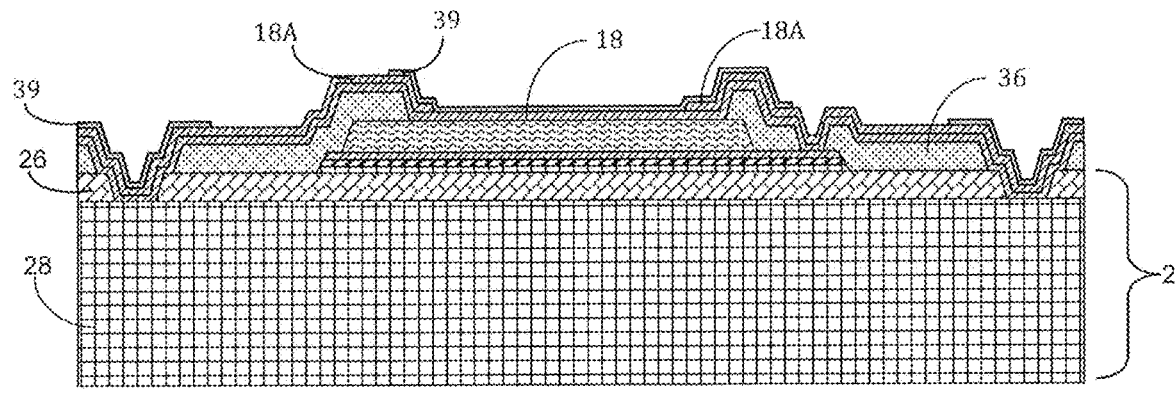

Referring now to FIG. 26, a thin outer passivation layer 39 is then deposited over the back electrode 18 and frame 18A. The thin outer passivation layer 39 may be a dielectric material which is resistant to HF attack and free of moisture absorption. The outer passivation layer 39 may comprise AlN, ScAlN or SiN, for example, and typically has a thickness in the range of between 200 nm to 300 nm. Typically AlN or ScAlN may be deposited by RF sputtering while PECVD may be used to deposit SiN. The outer passivation layer 39 is then selectively patterned to create routes therein, selectively exposing the underlying frame layer 18A.

Figure 27:
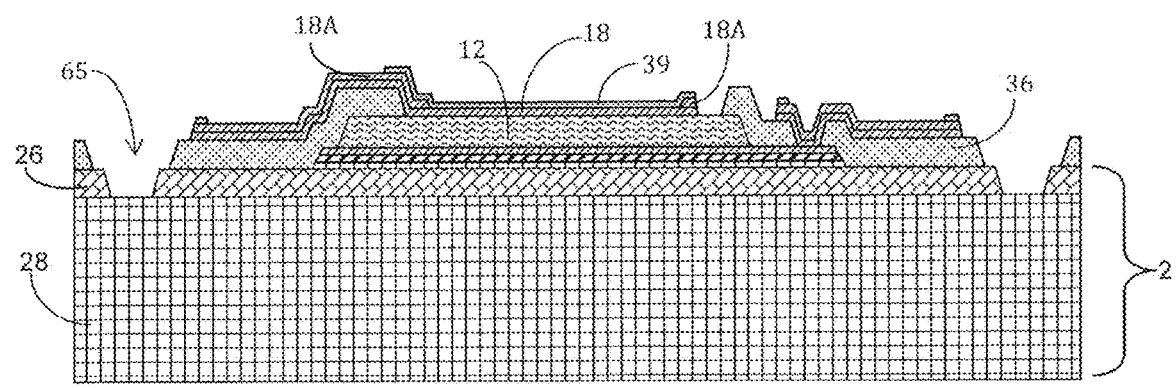

As shown in FIG. 27, the top electrode 18 and the frame layer 18A may be patterned at the same time and selectively etched away, thereby ensuring that the top electrode 18 and the frame layer 18A have a clear edge cut. This also isolates a region of the top electrode material 18B from the piezoelectric layer whilst leaving it electrically coupled to the bottom electrode 20 by virtue of a through via hole 44 patterned in the inner passivation layer 36.

Figure 28:
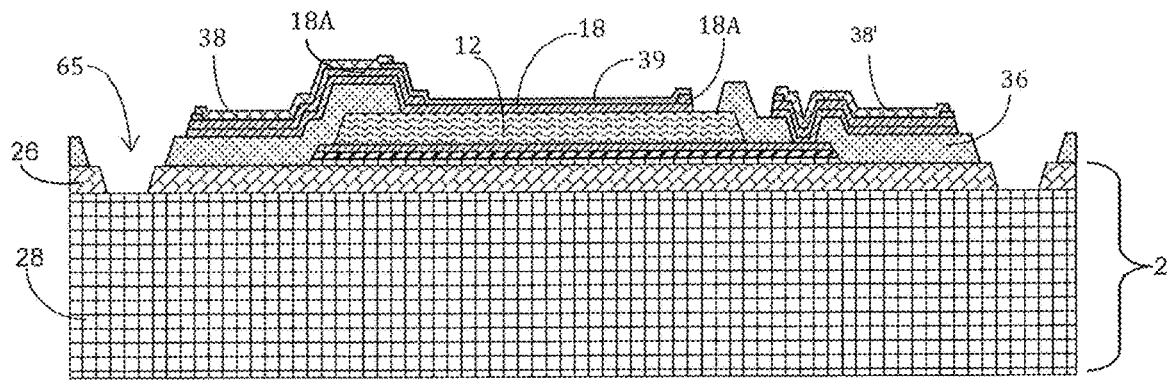

Referring now to FIG. 28, conductive routing layers 38, 38' that may be gold, are selectively deposited—step (k) into the routes patterned into the outer passivation layer 39. The conductive routing layers 38, 38' also serve as inner conductive pads that enable subsequently fabricated through vias 40, 42 (shown in FIGS. 1, 2, 4-7) to couple the upper and lower electrodes 18, 20 to the outer pads 43, 43B with termination layers 45, 45B and solder bumps 50, 50B on the outside of the package. One conductive routing layer 38 enhances electrical conductivity to the non-vibrating part of back electrode layer 18 and later enable contacting the back electrodes 18 to the outside of the package. A second conductive routing layer 38' is deposited over the part of the back electrode layer 18B that is isolated from the vibrating part of the back electrode 18, but connected by the via 44 through the passivation layer 36 to the front electrode 20.

For fabricating an individual die comprising an array of resonators coupled together to create a filter, a mass loading layer of the same material as the back electrode may be selectively patterned over the entire back electrode surface of certain resonators within the filter die. Typically, the thickness of the mass loading layer is in the range of between 5 nm and 200 nm. Referring back to FIG. 3 wherein a top view of the intermediate structure of FIG. 28 is shown, the raised frame 18A and back electrode 18 preferably have a pentagonal shape without right angles or parallel sides to minimize spurious vibrations. The cavity under the first electrode 16, (116, 216) has the same shape, and at least the same size, and is aligned coaxially with the edges of the top electrode (with frame).

Figure 29:
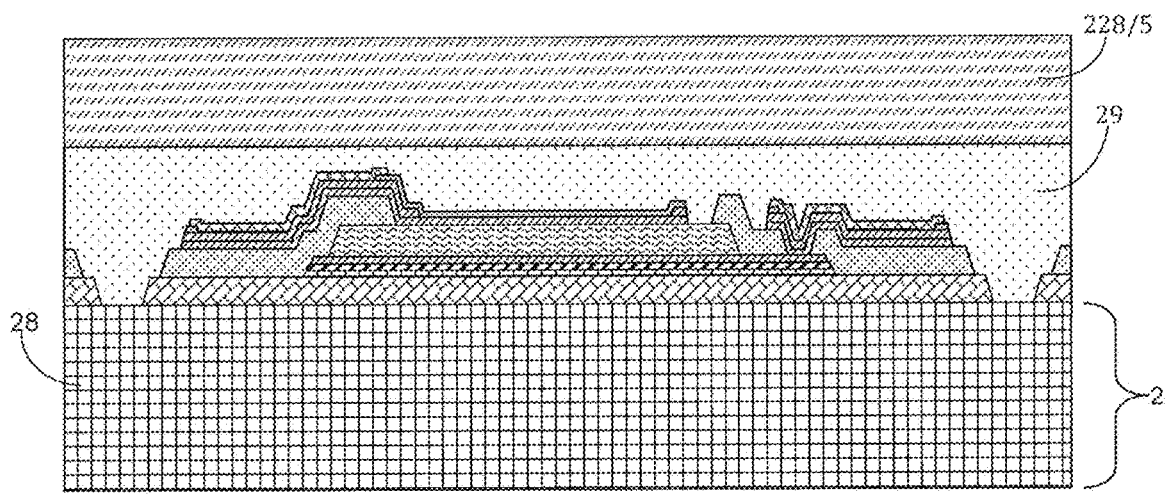

With reference to FIG. 29, the back of the device wafer (i.e. the array of islands of active membrane 12a, exposed bottom electrode 20 and exposed upper side of the silicon membrane 14) may be temporary bonded to a carrier wafer 228/5 that could be silicon 228, sapphire 5, glass, etc., with an organic bonding material 29 such as a resin, polyester, wax or rubber.

Then the silicon wafer 28, (128 in the embodiment of FIG. 4) may be thinned-optional step (m) of FIG. 14A, by a method such as grinding, chemical polishing and/or chemical mechanical polishing CMP. Preferably the silicon handle 28 (or wafer 128) is thinned to a thickness of less than 200 microns. This is necessary for achieving the next step of creating through silicon vias (TSV) in the silicon handle 28 (or wafer 128) at various dimension sizes to generate resonators with different front cavities 16, 116, 216 as necessary for the various filter dies. Were the remaining silicon wafer 28 (128) to be too thick, the loading effect of liquid solutions or gas mixtures might under or over release the sacrificial material under the piezoelectric material resulting in oversized or undersized membranes. The thinner the silicon wafer 28 (128), the more accurate the dimensions of the cavities that can be generated. In this manner, the thickness of the silicon handle 28 (wafer 128) may be reduced to a desired thickness, that is typically less than 50 microns. This is also desirable for achieving a slender final package having minimal thickness.

An array of front cavities 16 (116, 216) is now formed—step (n) of FIG. 14A.

In the embodiment of FIG. 29 where the front inner section 2 consists of a silicon membrane 24 coupled to a silicon wafer 28 'handle' by a buried oxide (BOX) layer of silicon oxide 26 this step is a two stage process where the silicon membrane 24 is left spanning the front cavity 16 as in the embodiment of FIGS. 1 and 2. In the embodiments shown in FIGS. 5 and 6, this step is a three stage process wherein the silicon membrane 24 is also etched away.

In the embodiment of FIG. 7, where the front inner section 2 consists of a silicon oxide layer 25 on a silicon wafer 28 'handle', this is a two stage process, and in the embodiment of FIG. 4 where the front inner section 2 consists only of a silicon wafer 128, this is a one stage process.

Figure 30:
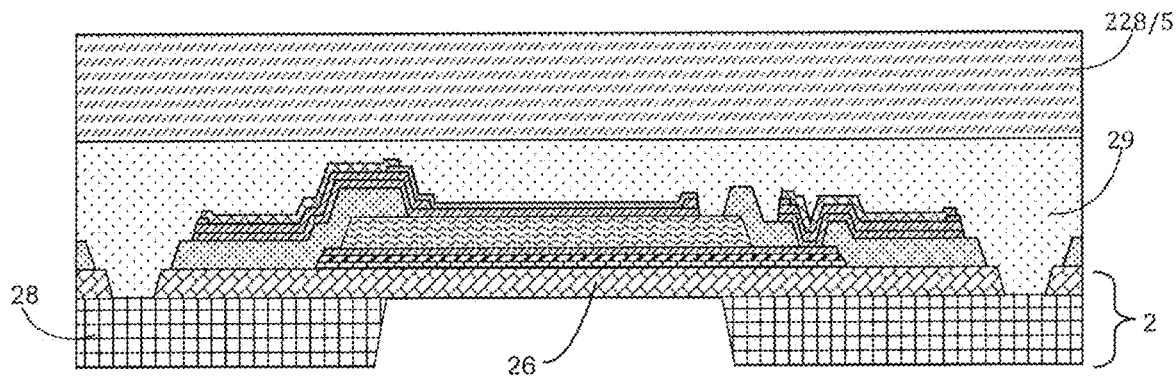

With reference to FIG. 30, the (thinned) silicon wafer 28 handle (or silicon wafer 128 in the embodiment of FIG. 4) is selectively etched away opposite to the island 12a of active membrane layer 12 to expose the underlying layer. This may be accomplished using deep reactive etching of the silicon handle 28 (silicon wafer 128) as commonly practiced to create through silicon vias. The front cavity 16 thus formed has the same shape as the back electrode and frame 18A and is concentrically arranged therewith, and is at least as large.

Figure 31:
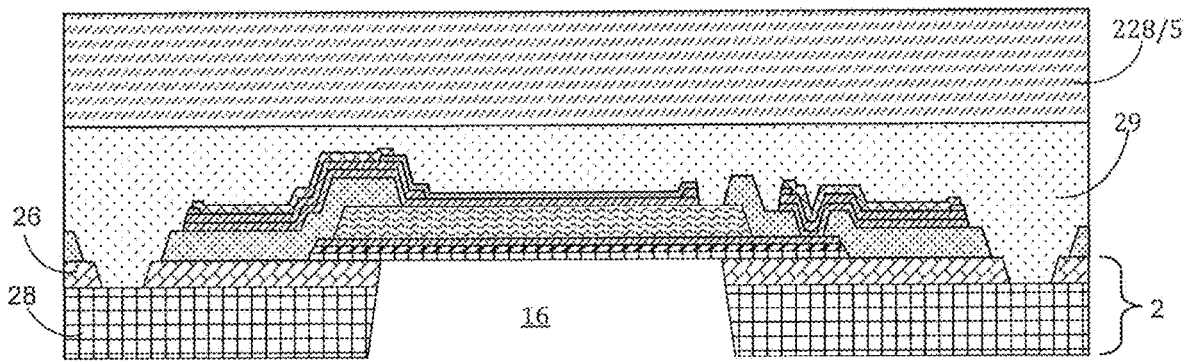

With reference to FIG. 31, in the embodiments of FIGS. 1, 2, 5-7, the silicon oxide layer 26 may then be removed by one or more techniques selected from chemical etching with HF vapor, chemical etching with a BOE (Buffered Oxide Etch) solution containing HF as an active ingredient, by ICP or by RIE etching, with the silicon wafer 28 'handle' acting as the mask to create each front cavity 16 behind the silicon membrane 24 that is aligned with an island of piezoelectric resonator membrane 12a.

In some embodiments having a silicon membrane 24, the silicon membrane 24 adhered to the front electrode 22 on the front side of the active membrane 12 that is selectively exposed by selective removal of the BOX layer 26 to form at least one front cavity 16 is retained as a stiffener of the active membrane 12 that spans across the at least one front cavity 16 of the array of front cavities. This is the case in the embodiment of FIGS. 1 and 2, for example and is the structure shown in FIG. 31.

Figure 32:
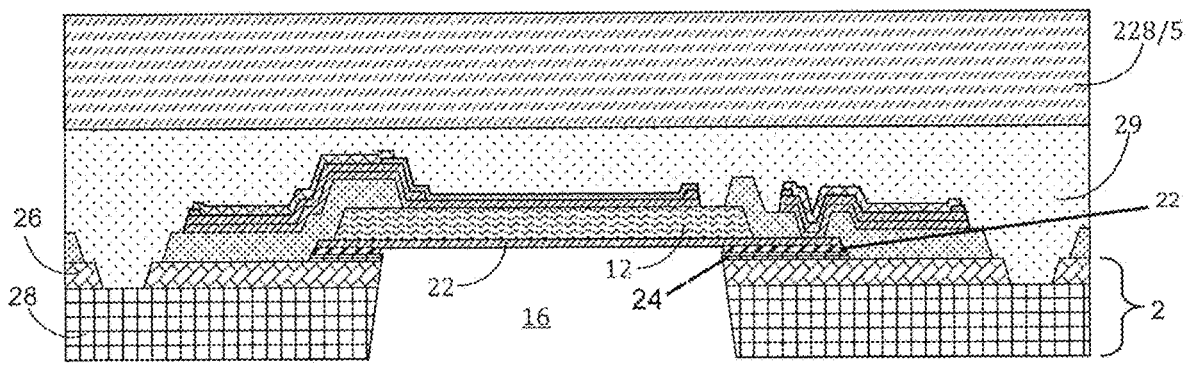

With reference to FIG. 32, in other embodiments such as those shown in FIGS. 5 and 6, the silicon membrane 24 adhered by the bonding layer 22 to the front electrode 20 on the front side of the active membrane 12 that is selectively exposed by the selective removal of the BOX layer of silicon oxide 26 is itself etched away from within the cavity 16 by reactive ion etching, and the bonding layer 22 may also be removed (or it may be retained), leaving the unsupported front electrode 20 on the front of the islands 12a of the active membrane layer 12 spanning across the at least one front cavity 16. Where the bonding layer comprises Au or Au—In, it may be removed by KI/I$_2$ wet solution. In some embodiments, adhesion layers of Ti or Ti—W may be required to bond the gold or Au-in to both the front electrode 20 and to the SiO$_2$ layer 26. If so, these may be removed by dry etching.

Alternatively, half bonding layers of AlN or ScAlN may be attached to both the front electrode 20 and to the SiO$_2$ layer 26 and fused together. These may be etched away from within the front cavity 216 by Induction Coupled Plasma ICP using BCl$_3$ and/or Cl$_2$ and/or diluted tetra methyl ammonium hydroxide (TMAH) 2.4%. wet solution which has a 100% selectivity for molybdenum.

Then, the lower cavities 16 are sealed—step (o) of FIG. 14B.

Figure 33:
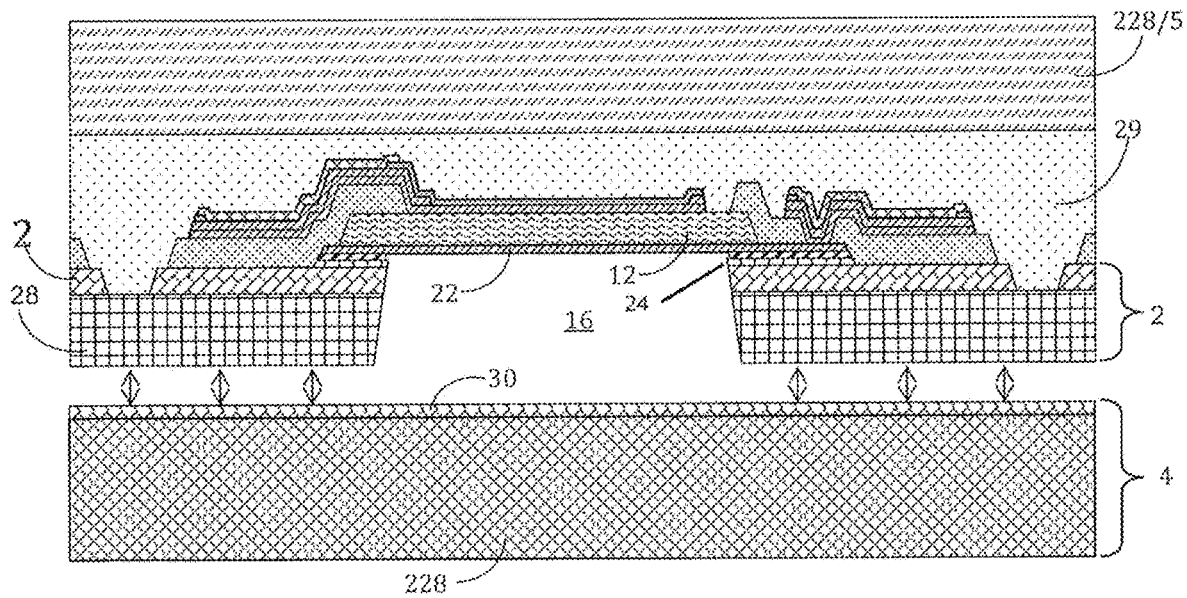

With reference to FIG. 33, in some embodiments (e.g. those shown in FIGS. 1, 2, 4, and 6, the front outer end section 4 may be a silicon, glass, sapphire or AlN wafer 228 which may be bonded to the (typically thinned) handle 28 by a package bonding layer 30 which may again be gold, gold-indium. If necessary, adhesion layers of titanium or chromium may be first deposited.

Alternatively, the package bonding layer 30 may be a relatively thin layer of an organic adhesive such as SU-8, PDMS, epoxy, TMMF which is available from TOK™, or various ink jetable die-attach polymers as available from Sekisui™ or Inkron™ for example, with a thickness typically in the range of from 5 microns to 50 microns for example.

Figure 34:
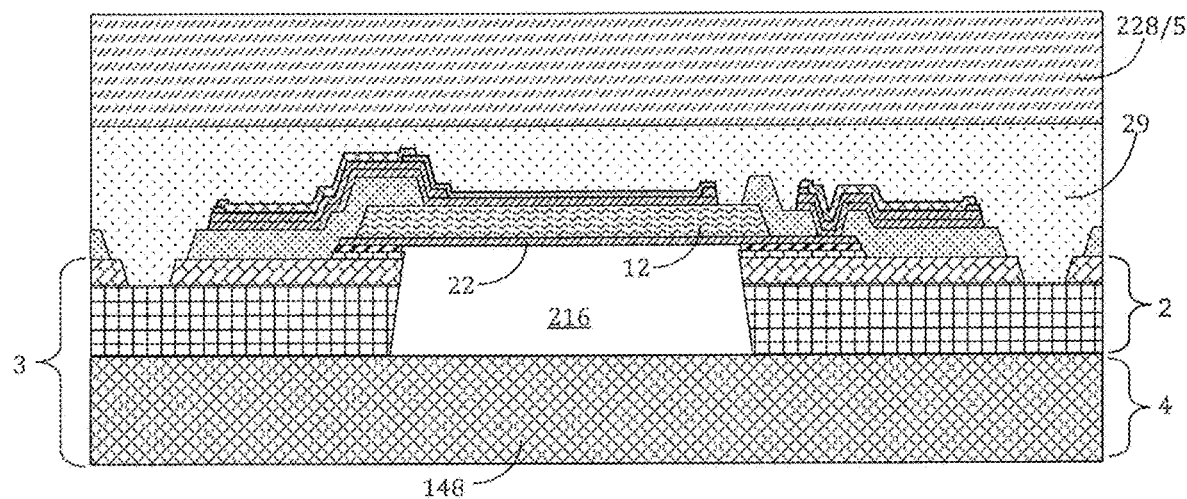

With reference to FIG. 34, in other embodiments (e.g. those shown in FIGS. 5 and 7) step (o) of sealing the bottom cavities 216, 316 may consist of laminating a thick continuous organic layer to the outer surface of the silicon wafer 28 'handle' spanning the at least one cavity 16 of the array of front cavities.

The thick continuous organic front outer layer 148 may be TMMF™ S2000 film photoresist as currently available from TOK™ (Tokyo Ohka Kogyo). However, other organic materials available as films may be used.

Figure 35:
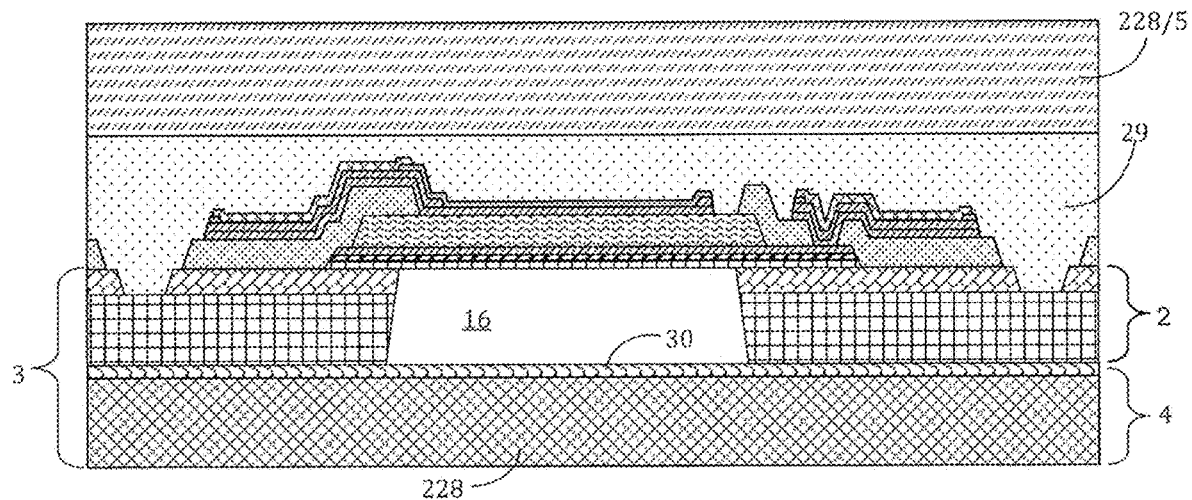

Referring to FIG. 35, where the front outer end section 4 is a silicon wafer 128 as in FIGS. 1, 2, 4 and 6 that is bonded to the (optionally thinned) handle 28 by a package bonding layer 30, whether gold or organic, if the wafer is thicker than the desired thickness for the outer section 4 of the front part 3 of the package 10, then the wafer may be thinned—step (p) by a method selected from the group comprising grinding, chemical polishing and chemical mechanical polishing CMP, In this manner, the thickness of the front outer end section 4 may be reduced to under 50 microns thereby ensuring the overall thickness of the package 10 is kept small.

Figure 36:
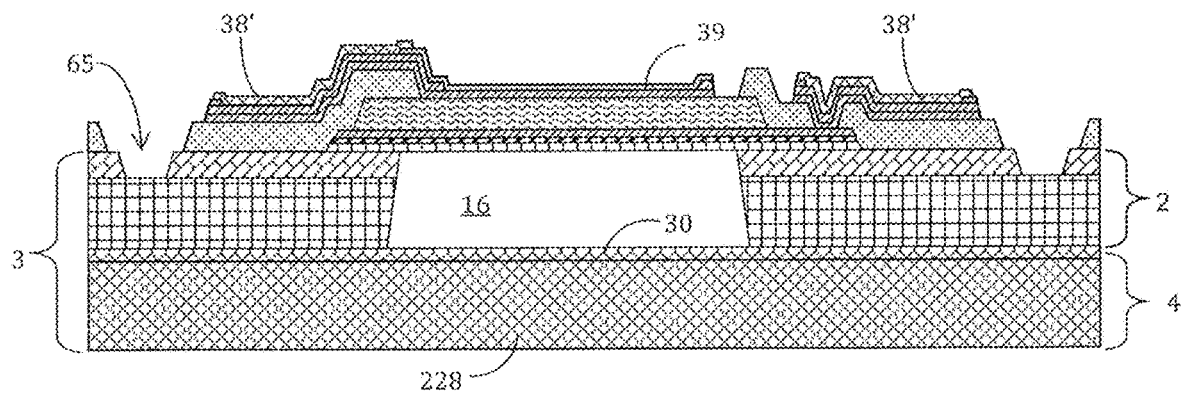

The carrier wafer 228/5 and organic bonding material 29 may then be removed by dissolving, melting or laser heating the organic binding material 29, leaving the structure shown schematically in FIG. 36.

With reference to FIG. 26. in optional step (q), the exposed outer passivation layer 39 is trimmed. This step increases the yield of the filter and set its frequency response to the desired value. Typically, the full array of resonators within each filter unit is trimmed by reducing the outer passivation layer to a desired thickness. A typical thickness of the outer passivation layer before trimming is in the range of from 200 nm to 300 nm, and after trimming is typically around 100 nm with a typical tolerance of +/−5 angstroms. However, it will be appreciated that the different trimming may be specified for different filters that are cofabricated within the same wafer and is typically achieved by employing a scanning ion beam etcher using an inert gas such as argon, for example.

Figure 37:
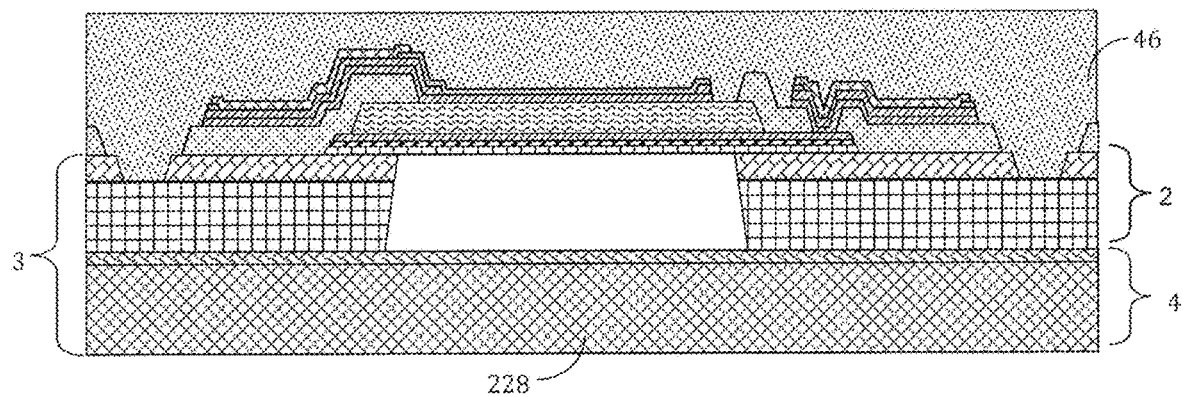
Figure 38:
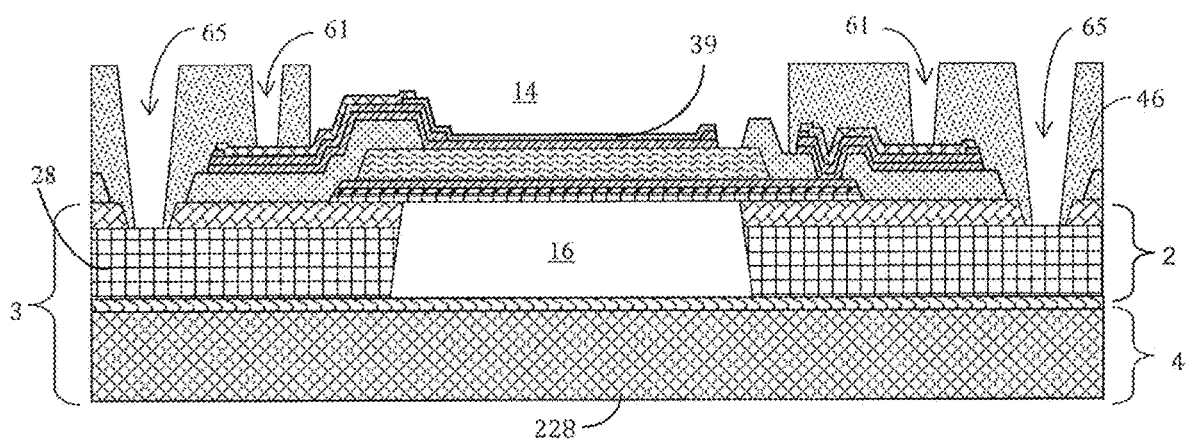

As shown in FIG. 37, an organic support layer 46 is selectively applied—step (q) over the surface of the structure shown in FIG. 36 covering the outer passivation layer 39 that is exposed by removal of the carrier 228/5 of FIG. 35. The organic support layer 46 may be SU-8, PDMS, PBO (Zylon™) i.e. poly(p-phenylene-2,6-benzobisoxazole). The organic support layer 46 may also be TMM photoresist, either as a film available as TMMF S2000 film photoresist or as TMMR S2000 Liquid Photoresist which can be applied by spin-coating over the outer passivation layer 39. Both forms of TMM are available from TOK (Tokyo Ohka Kogyo). In practice, being photosensitive, the organic support layer 46 may be laminated over the surface of the structure shown in FIG. 36 to give the structure shown in FIG. 37, and then, as shown in FIG. 38, the organic support layer 46 may be patterned to form the walls of an array of back cavities 14 and via holes 61 down through the apertures of the outer passivation layer to the conductive routing layer 38, 38B.

The patterning also extends the trenches 65 through the inner passivation material 36 and any silicon membrane 24 or silicon oxide layer 26 to the silicon wafer 28' handle (or silicon wafer 128). In general, where a coating layer is described as applied or deposited selectively it may either be deposited through a stencil or it may be applied as a continuous layer and then selectively removed.

Figure 39:
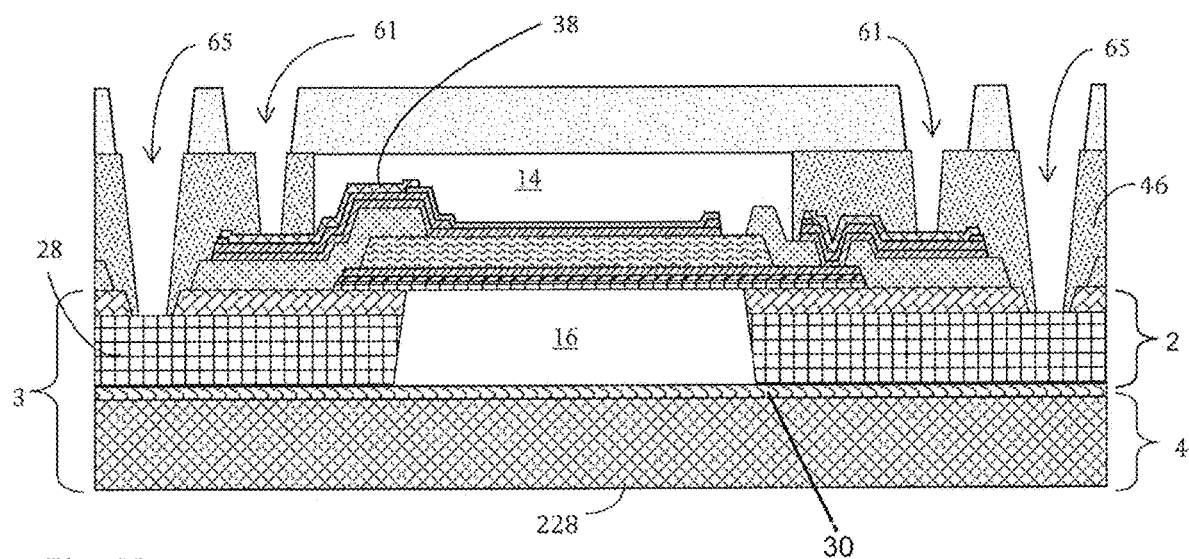

Then, as shown in FIG. 39, a continuous dry organic film 48 is selectively applied over the organic support layer 46, closing the cavity 14—step (r). Extensions to the via holes 61 and the trenches 65 are made through the continuous organic film 48.

The continuous organic film 48 is typically the same material as that of the organic support layer 46 and both are photo-sensitive polymers facilitating patterning with trenches, via holes (and cavities in the case of organic support layer 46) and may be any of a wide range of materials such as SU-8, PDMS, PBO, epoxy or PBO (Zylon™). Both the organic support layer 46 and continuous organic film 48 may also be TMM photoresist but the continuous organic film 48 cannot be applied in liquid form so must be supplied as film, for example, as TMMF S2000 film photoresist and not as TMMR S2000 Liquid Photoresist.

Figure 40:
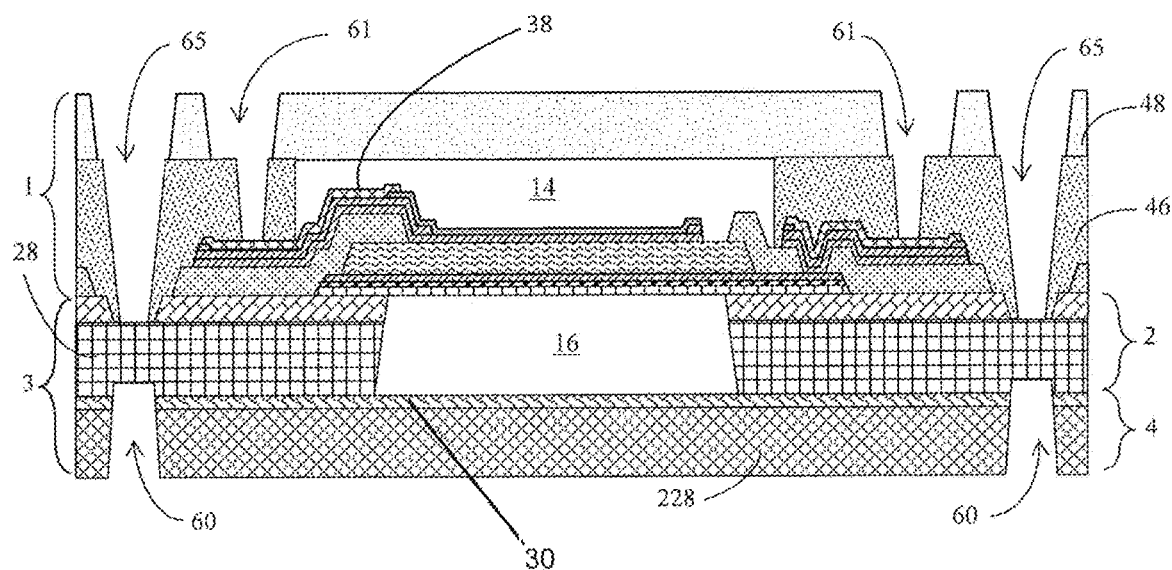

It will be appreciated that typically organic materials are not used for packaging of MEMS components. One reason for this is that polymers may absorb humidity and this may corrode the moving parts of the MEMS device, in this case the piezoelectric membrane, thereby causing its performance to shift and finally fail. The present application discloses a package having an organic back end 1. The package is designed for flip-chip assembly, and the contacts are on the back part of the package. After soldering the contacts, the package is typically embedded in underfill/over-mold epoxy materials so there is a much larger thickness of polymer protecting the active membrane than the package per se. However, for some applications with harsh environments and also for so-called "mission critical" applications such as in the automotive, military and avionics industries, for example, packages with extra humidity protection are required. With reference to FIG. 40. for such applications, an optional step of fabricating deep trenches 60 on the front side 3 of the package may be performed—step (u), wherein the deep trenches 60 on the front side are aligned with the deep trenches 65 on the back side of the package 1 and traverse the front outer layer 228, and any organic package bonding layer 30 to the silicon 28 of the front inner layer 2. The trenches 60 may be fabricated with mechanical blade dicing technology, or with laser or plasma ablation, for example.

Figure 41:
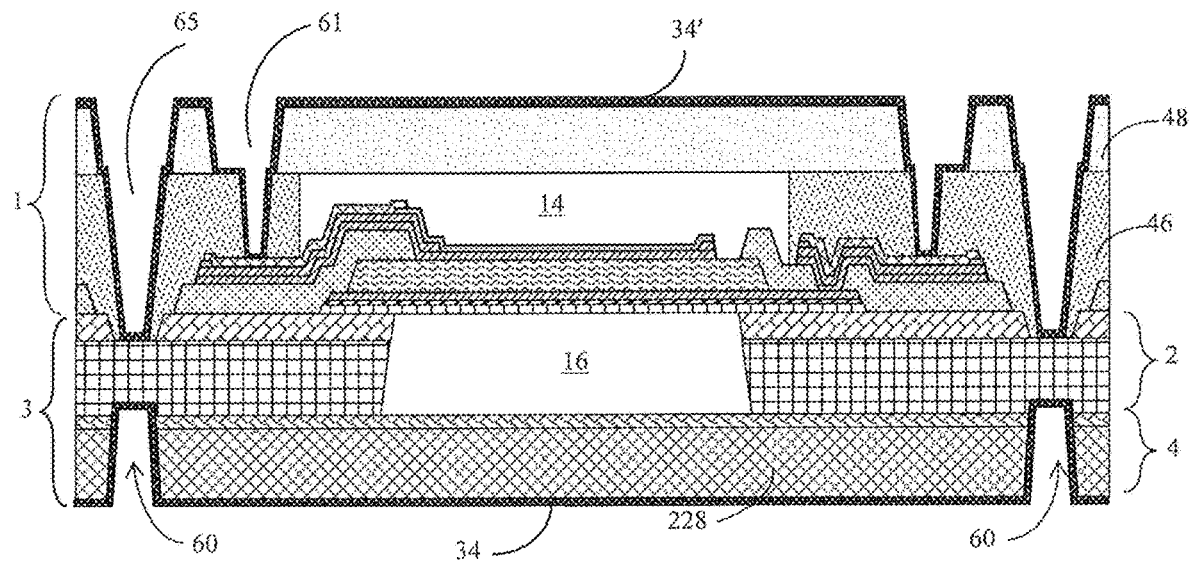

With reference to FIG. 41, following fabrication of the trenches 65, sealing liner coatings 34, 34' may be applied onto the outer surface of the front end section 3 and back end section 1 and into the deep trenches on the (front end 60 and) back end 65. The sealing liner coatings 34, 34' may consist of a dielectric material such as AlN, SiN, $Ta_2O_5$ or TaN, for example, having a thickness in the range of between 100 nm and 500 nm. The sealing liner coatings 34, 34' seal the organic materials and preventing damage due to humidity. In some embodiments, the sealing liner coatings 34, 34' are applied by using a low deposition temperature (<250° C.) RF sputtering or PECVD for example, to generate void-free, low stress films.

Figure 42:
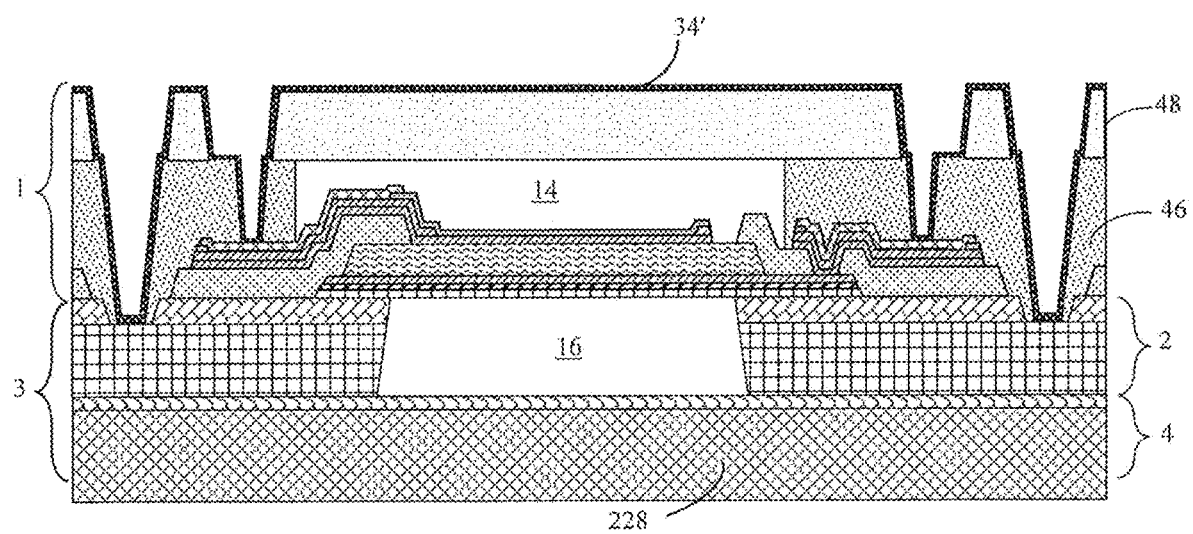

In yet another embodiment, the step of generating the deep trenches 60 and/or the step of depositing the front side sealing liner coating 34 may be skipped and, the lining coating 34' applied only onto the outer surface and into the trenches 65 of the back side, see FIG. 42. Furthermore, for applications using modules where the filter package is flip-chip assembled over a common IC substrate, along with other components that are all then embedded in an underfill/over-mold epoxy materials and where Moisture Sensitivity specification Levels (MSL) are not as tight, the step of liner deposition might be avoided all together.

Figure 43:
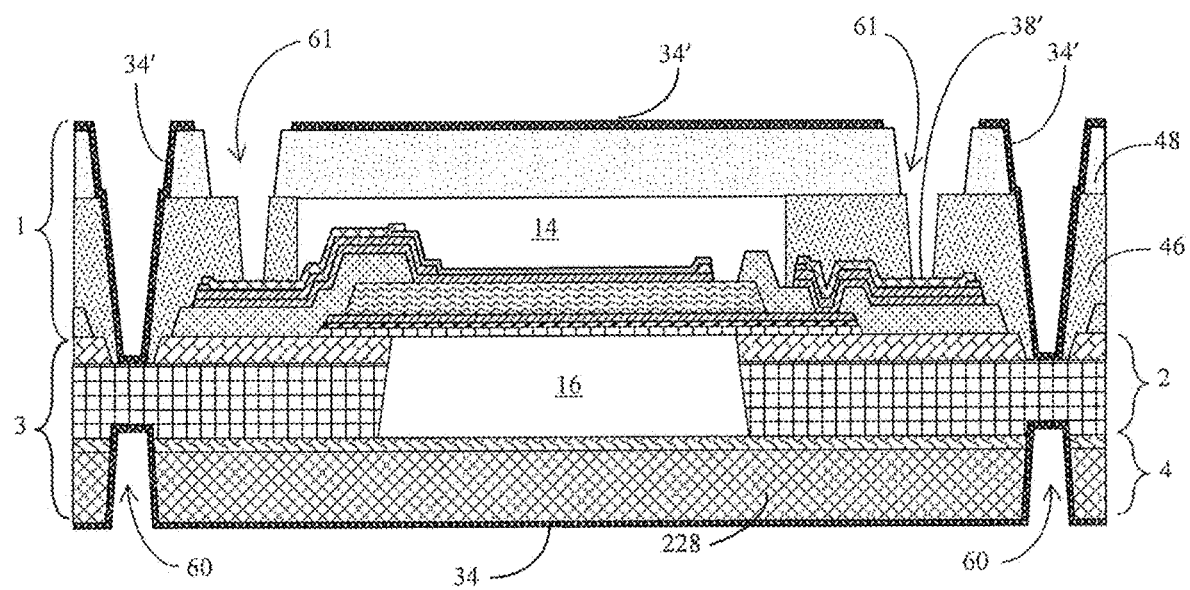

With reference to FIG. 43, where a sealing liner coating 34' is applied to the back surface, it must be selectively removed to expose pads on the routing layers 38, 38'. Typically, the sealing liner coating 34' will also be removed from the via holes 61 and to a small area therearound on the external surface of the back outer surface, thereby enabling the fabrication of outer pads around the via holes 61. This may be achieved by using a photoresist to expose the via holes 61 and then dry ablation or etching away the sealing liner 38' using Ion Beam milling or plasma etching for example.

The via holes 61 are then filled—step (v) of FIG. 14B.

Figure 44:
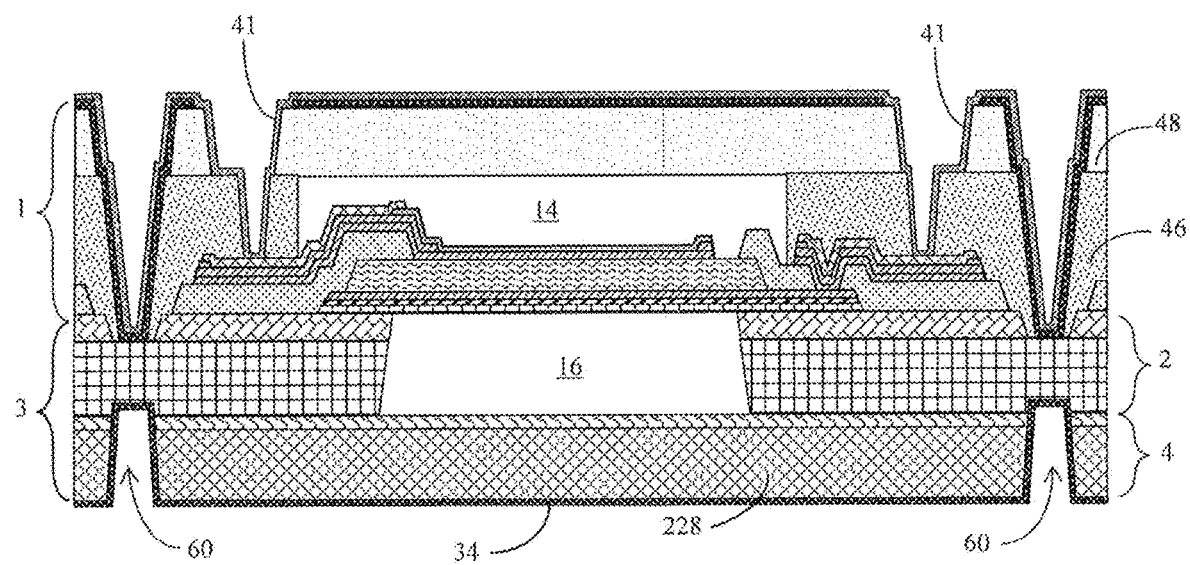

With reference to FIG. 44, a seed layer 41, typically copper, but possibly first an adhesion layer of titanium, Ti—W or Cr having a thickness in the range of between 20 nm and 100 nm and then the copper seed layer 41, typically with a thickness of about 1000 nm is sputtered into the via holes 61 and over the back surface.

Figure 45:
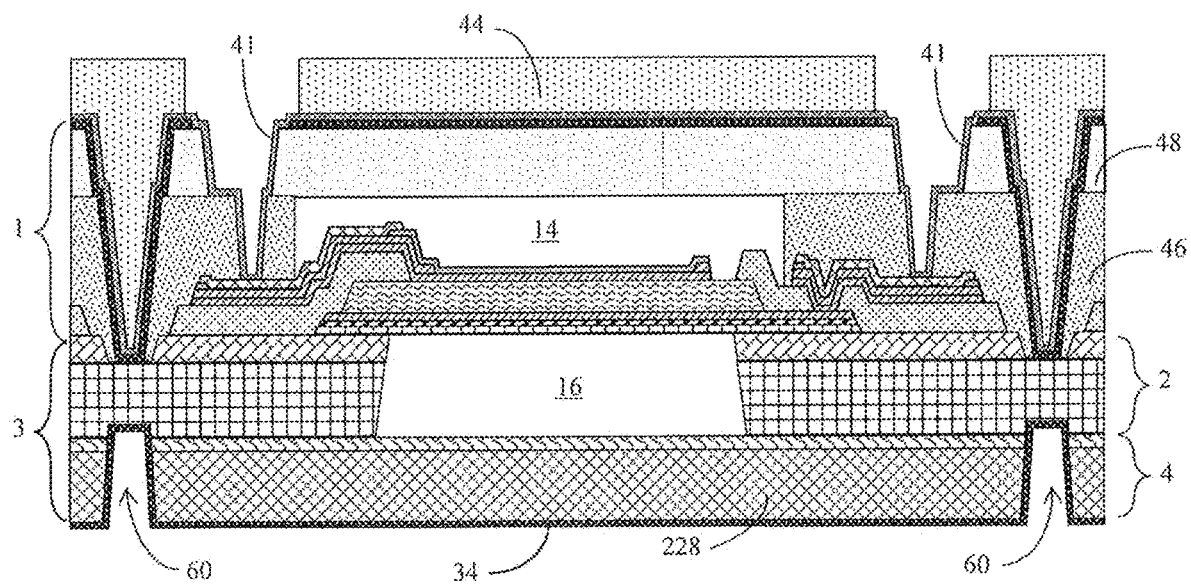

With reference to FIG. 45, following deposition of the seed layer 41, the seed layer 41 is coated with photoresist 44 and patterned to expose the via holes 61. The exposure of the photoresist 44 also creates a pad area around the via holes 61 and it may also generate a pattern for a redistribution layer (RDL) where future flip chip copper and solder bumps might be positioned. It is a unique feature of embodiments of the current invention, that copper pads 43, 43B and flip chip bumps 50, 50B may be fabricated vertically over the via holes 61 which is a feature that facilitates miniaturization.

Figure 46:
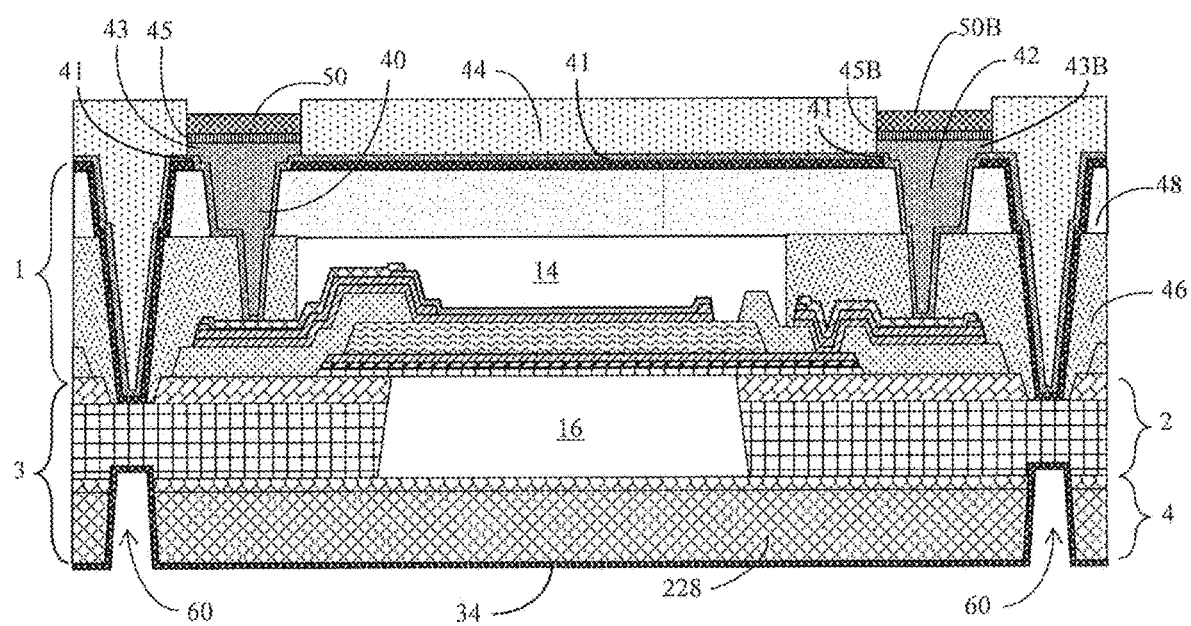

With reference to FIG. 46, the via holes 61 are filled by electroplating to fabricate filled vias 40, 42 and via pads thereover 43, 43B. The filled electrical vias 40, 42 and pads 43, 43B are typically fabricated from copper. The filled vias 40, 42 pass through the organic support layer 46 and organic film 48 and connect to the inner pads 38' of the conductive routing layer 38, 38B, providing contacts to the back electrode 18 and front electrode 20.

Figure 47:
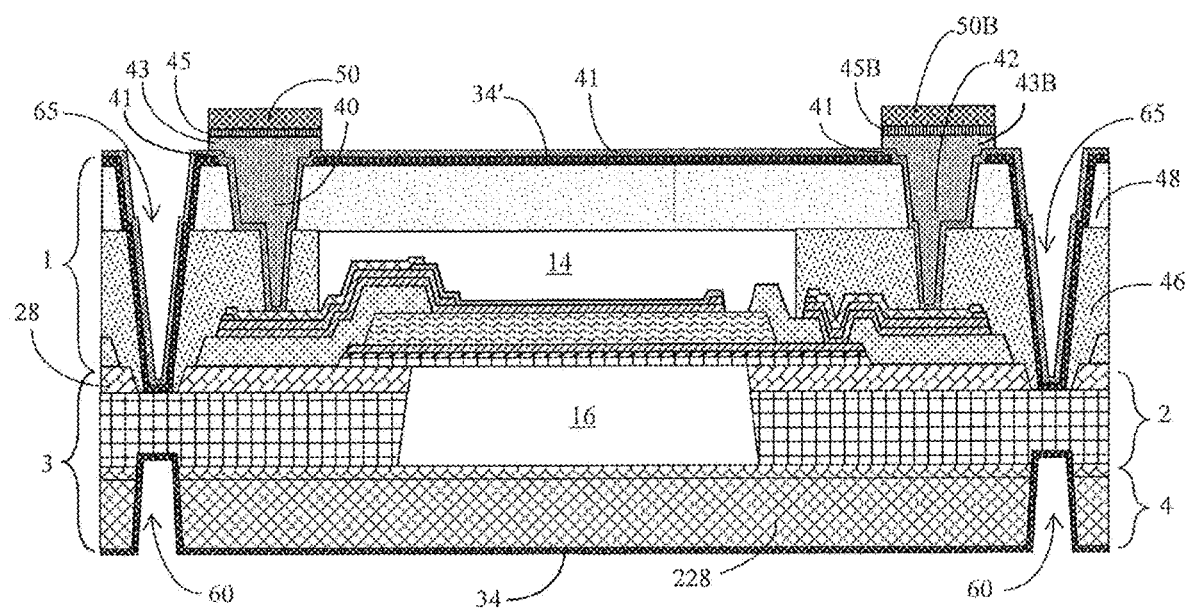

With further reference to FIG. 47, typically a barrier layer 45, 45B is applied to the outer contact pads 43, 43B, followed by solderable bumps 50, 50B fabricated from solder, SnAg, tin or lead free solder, for example—step (w) to terminate the copper vias 40, 42.

Figure 48:
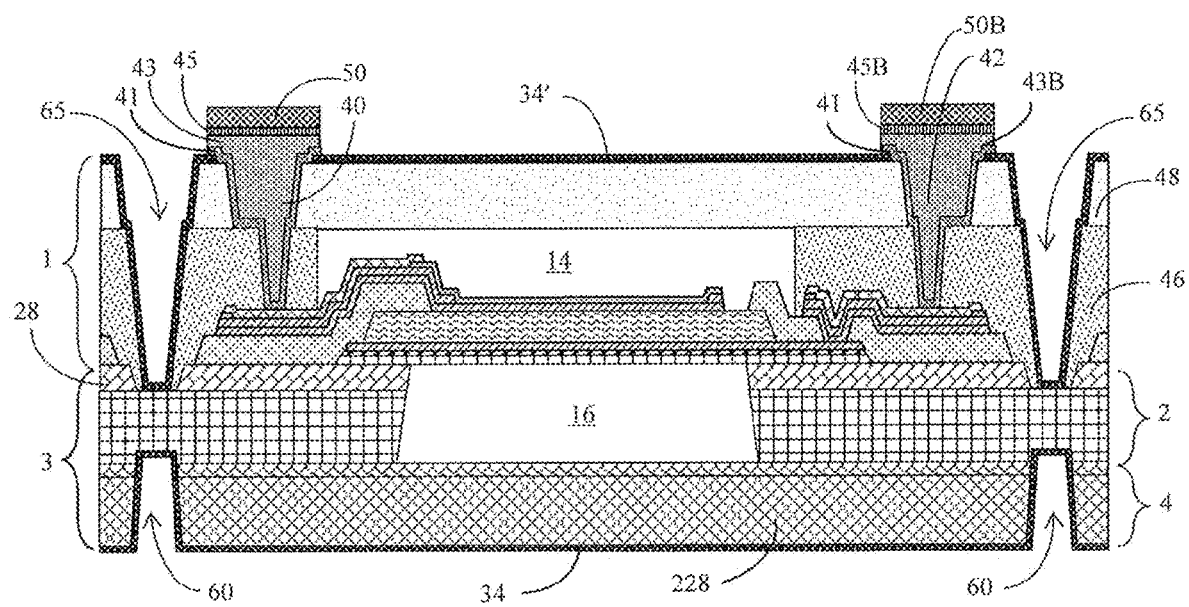

With reference to FIG. 47, the photoresist is stripped away, and with reference to FIG. 48, the seed layer is then removed.

Figure 49:
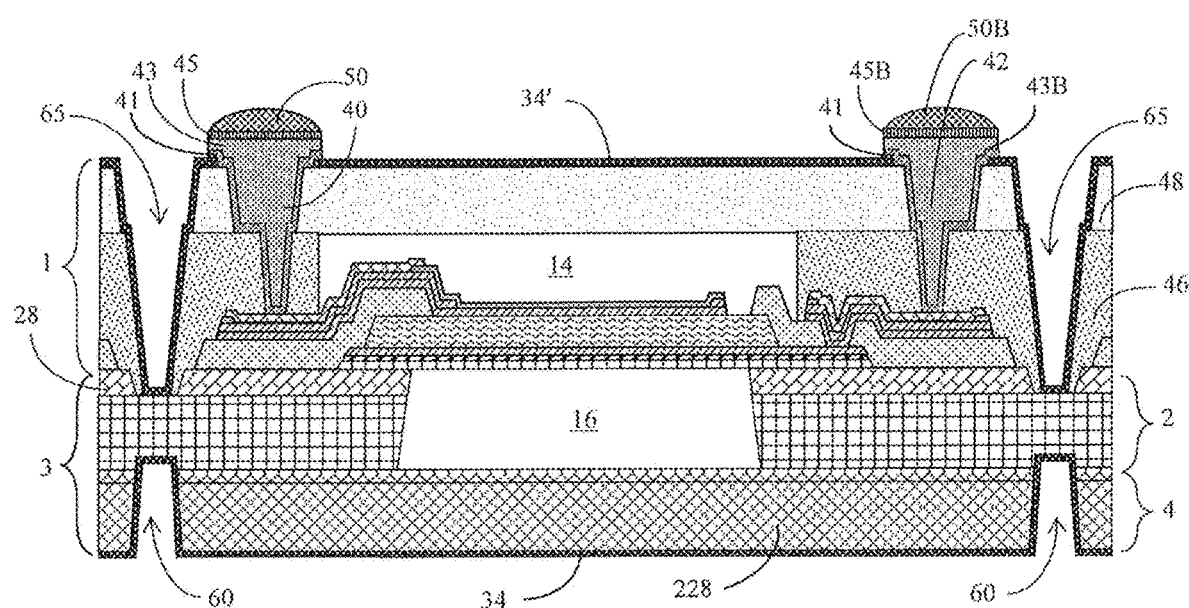

Then, with reference to FIG. 49, the solder bumps 50, 50B may be reflowed (step (x)).

At this stage, in embodiments where the front outer layer 228 is too thick, it may be thinned—step (y) of FIG. 14B.

Referring back to FIG. 39, where the front outer layer 4 is a silicon wafer 228 that is thicker than specified, and trenches 60 are optionally generated see FIG. 40, the silicon front end 228 might still be subsequently thinned, thereby removing the sealing liner layer 34 from its outer surface but leaving a liner coating 34 within the front side trenches 60 to still protect the organic bonding layer 30. However, as described previously with reference to FIG. 35, the front outer layer may have been thinned whilst attached to the carrier 228/5 before applying the organic layers 46 and 48 that form the back of the package in step (p). Nevertheless, additionally or alternatively, a final thinning stage may be performed—step (y) after application and reflow of the solder bumps (step (x)). In such a processing option, a UV tape is applied over the back of the work-piece and then the front outer layer 228 is thinned to its final thickness. Chemical, mechanical or chemical mechanic polishing CMP may be used. Thus, not only thinning is optional, depending on the thickness of the wafer used for sealing the front cavities 16 and the desired final thickness, but also there is flexibility not only if, but also when this stage is performed.

The array be now be diced—step (z) into separate packaged electronic components 10 which may be packaged resonators as shown in FIGS. 1 and 3, or filters consisting of arrays of resonators that may subsequently be coupled in series and parallel using the contact pads 43, 43B with the solderable bumps 50, 50B thereon. Due to the deep trenches 65 (and 60), the dicing step (x) simply consists of cutting through the array along the deep trenches 65, or through the thinned silicon handle 28 between the back trenches 65, 60 on the back side 1 and front side 3. This may be accomplished using a saw blade, by laser or by plasma with deep reactive ion etching, for example.

The packaged electronic component 10 may be flipped over and electrically coupled to an IC Substrate in a module configuration along with other filters and/or active semiconductor devices and/or passive components or in a discrete configuration, without active devices and with or without passive components. Typically, the IC substrate may itself contain lumped elements such as inductors and capacitors to enhance the filter performance and especially its bandwidth, which is largely dictated by its $K^2_{eff}$ value.

Another approach to enhancing the $K^2_{eff}$ of the filter is for the IC substrate to provide large numbers/lengths of inductors in several layers that increase its layer count, size and price. In general, the high $K^2_{eff}$ resonators and thus filters described herein, require fewer inductors with lower inductance values in order to meet high-performance, wideband filters specifications. With the embodiments of the present invention, higher $K^2_{eff}$ values may be achieved through high percentage Sc doping of AlN, for example with $Sc_xAl_{1-x}N$ (where typically x is in the range of $0.1 \leq X \leq 0.36$) without degrading Q values below 2000, since the piezoelectric layer and its electrodes have good crystal orientations (XRD FWHM<1 degree). With these characteristics, not only the FOM and the power handling of the filter increases, but also the resonator size and thus overall package size is smaller. Furthermore, the corresponding IC substrate requires less inductors and layers and thus its form factor and cost is expected to drop. Thus embodiments of the invention disclosed herein present a filter with higher performance (FOM), larger bandwidth ($K^2_{eff}$), better power handling, reduced package size and cost, requiring an IC substrate with a smaller layer count and form factor, and thus reducing overall costs.

Thus, aspects of the present invention are directed to such single crystal piezoelectric films and electrodes for use in RF filters.

Bulk Acoustic Resonators (BAW) such as FBAR comprise piezoelectric membranes sandwiched between metal electrodes. Although refractory electrodes of molybdenum, tungsten, titanium-tungsten and rhodium are discussed, it is a feature of the technology disclosed herein that the piezoelectric films are first fabricated and only then an electrode metal is applied onto the piezoelectric film. Consequently, the electrode material may have high crystal orientation corresponding only to the orientation and lattice spacing of the piezoelectric layer and achieves superior surface roughness values and lower electrical resistance in a thin film form along with better acoustic properties than those obtained. Furthermore, in contrast with other fabrication techniques and designs where the piezoelectric layer is deposited onto the electrodes, in embodiments of the present invention, the electrodes do not have to withstand the deposition or fabrication temperatures of the piezoelectric material, and thus a wider range of electrode materials may be used, and the electrode materials provided in the specification are provided by way of example only.

The packaged electronic component 10 is generally a resonator and is one of an array of similar resonators that together provide a filter which is usually provided in a common package. A very large array of packaged resonators may be fabricated and then diced into individual filter units using the deep trenches 60 and/or 65, with each filter consisting of a number of interconnected resonators; the interconnections being provided by the vias 40, 42 and corresponded external flip chip pads 43, 43B. It will be appreciated that pentagons (apart from square based pentagons) do not tessellate, but can still be packed closely together. This, and the resonator (piezoelectric and electrode) material properties and wafer level package (WLP), provide the designer with the possibility of placing the flip-chip pads 43,43B at any package location, since they and interconnecting vias 40, 42 may be shifted in the plane of the array due to flexibility of the placement of the inner contact pads on the inner routing layers 38, 38'.

Having the contact vias 40, 42 for the back electrode 18 and front electrode 20 of each resonator 15 being adjacent to the individual pentagonal resonator 15 of the filter helps ensure that the dimensions of the filter package is kept small.

Due to the scanning surface ion milling process and other trimming techniques that may be applied to accurately control the thickness of each layer, together with the selective deposition of mass loading layers over selected resonators, different resonators within the same array may have different resonant frequencies and each resonator may effectively be separately tailored, despite the manufacturing being mass production on a wafer level.

The filter package comprising an array of resonators may be flipped over and attached to an IC Substrate or a circuit board. Providing filters in flip chip packages like this enables them to be very small, which contributes to the miniaturization and functionality of the user device, which may be required to be hand-held, compact and light weight, whilst having high functionality.

Having described various embodiments of electronic packages of the invention, and resonators and filters packaged with the electronic packages, it will be noted that the various package have front ends that are fabricated by a common method, and an organic back end with contacts that is common to all the embodiments.

Figure 50:
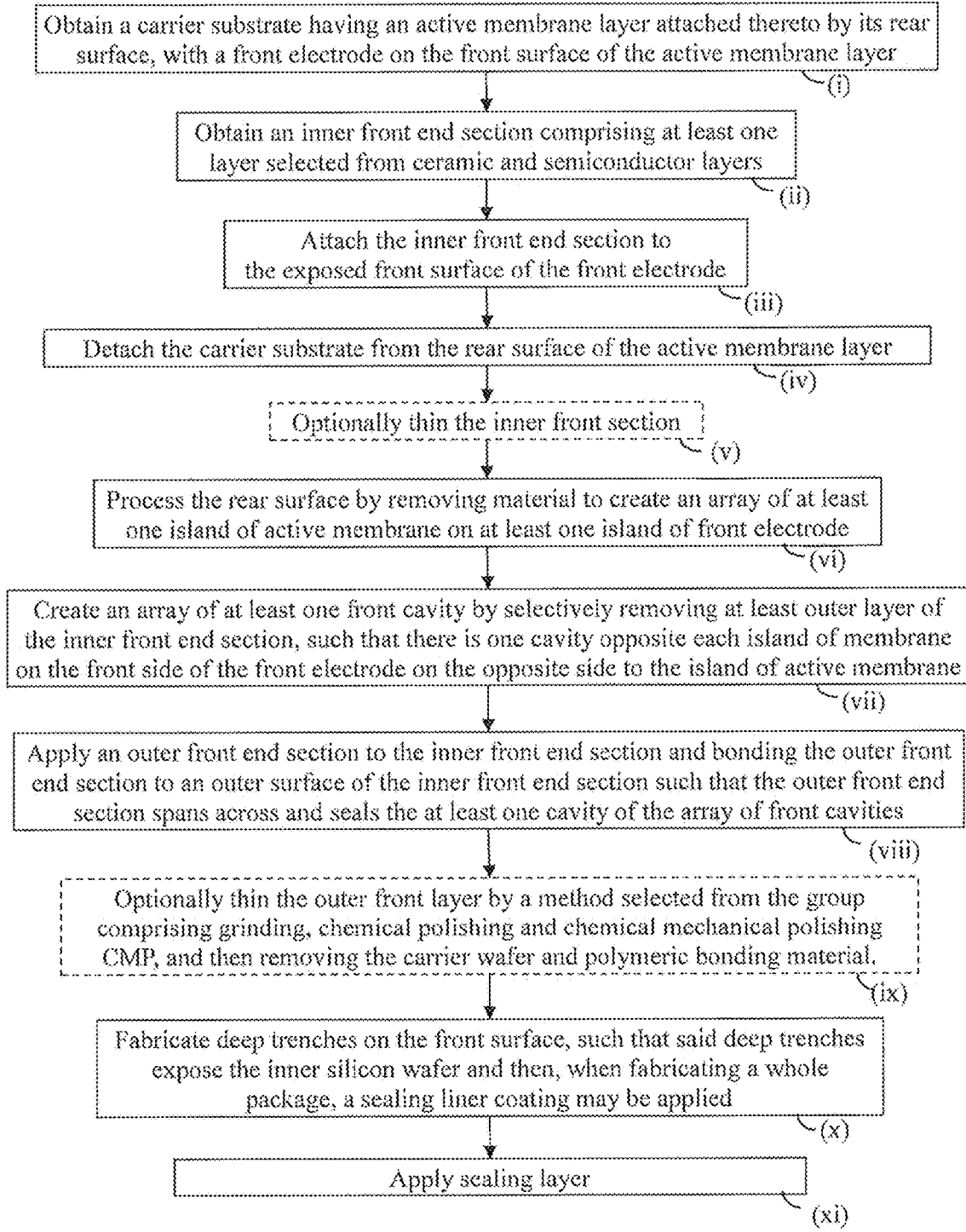
FIG. 50 is a flow chart showing generalized method of fabricating front ends of packages of the invention.

With reference to FIG. 50, a method of fabricating an array of front ends for an array of packaged electronic component comprises the stages of:
  i. Obtaining a carrier substrate having an active membrane layer attached thereto with a front electrode on exposed surface of the active membrane layer;
  ii. Obtaining a front inner end section comprising at least one layer selected from ceramic and semiconductor layers;
  iii. Attaching the front inner end section to the exposed surface of the front electrode;
  iv. Detaching the carrier substrate from rear surface of the active membrane layer
  V. Optionally thinning the front inner section;
  vi. Processing the rear surface by removing material to create an array of at least one islands of active membrane on at least one island of front electrode;
  vii. Creating an array of at least one front cavity by selectively removing at least outer layer of the front inner end section, such that there one cavity opposite each island of membrane on opposite side of the island of front electrode;
  viii. Applying a front outer end section to the front inner end section and bonding the front outer end section to an outer surface of the front inner end section such that the front outer end section spans across and seals the at least one cavity of the array of front cavities;
  ix. Optionally thinning the front outer end section;
  X. Optionally creating front trenches wherein the front end trenches cross all organic layers to the inner silicon layer, and
  xi. Optionally applying a sealing layer over the package and into the deep trenches.

A back part of the package which is organic may be fabricated, having back end trenches on the back side of the package corresponding to the front end trenches on the front part of the package, for subsequent dicing.

Figure 51:
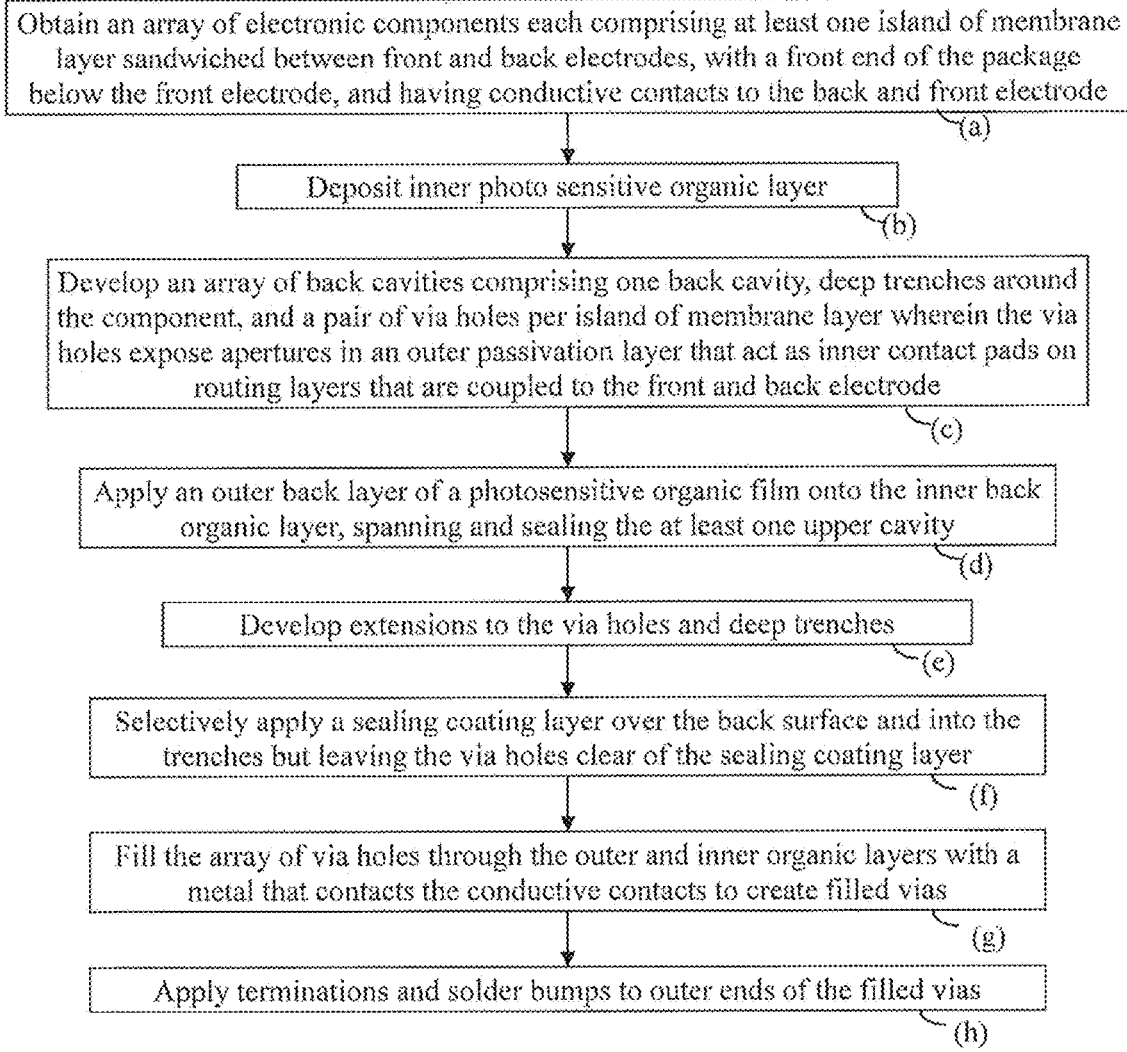
FIG. 51 is a flow chart showing a generalized method for fabricating a back end for packages of the invention.

One method of fabricating an array of the back end for a package for an electronic component is described in FIG. 51 and comprises:
  a. obtaining an array of electronic components each comprising at least one island of membrane layer sandwiched between front and back electrodes, with a front end of the package below the front electrode, and having conductive contacts to the back and front electrode;
  b. depositing an inner photosensitive organic layer;
  c. developing an array of back cavities comprising one back cavity, deep trenches around the component, and a pair of via holes per island of membrane layer wherein the via holes expose apertures in an outer passivation layer that act as inner contact pads on routing layers that are coupled to the front and back electrodes;

d. Applying a back outer layer of a photosensitive organic film onto the back inner organic layer, spanning and sealing the at least one upper cavity;
e. Developing extensions to the via holes and deep trenches;
f. Selectively applying a sealing coating layer over the back surface and into the trenches but leaving the via holes clear of the sealing coating layer;
g. Filling the array of via holes through the outer and inner organic layers with a metal that contacts the conductive contacts to create filled vias;
h. Applying terminations and solder bumps to outer ends of the filled vias.

Generally, the array of electronic components each comprises an active membrane layer on a front electrode over a front end of a package and a first passivation material surrounding the electronic components and partially covering the electronic components; a layer of back electrode material selectively covering the passivation material and the active membrane, where a via through the first passivation material enables a section of the back electrode material disconnected from the back electrode over the active membrane layer contact the front electrode; one area of conductive material connecting to and covering part of the back electrode material that conductively extends from a back of the active membrane layer and a second area of conductive material connecting to and covering part of the back electrode layer not conductively connected to back of the active membrane layer but connected via front electrode to front of the active membrane layer.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

The invention claimed is:

1. A package for an electronic component, the package comprising:
 a front end;
 a back end; and
 an active membrane layer sandwiched between front and back electrodes of conducting material, the active membrane layer having two corresponding lateral ends, the back electrode having two corresponding lateral ends, the front electrode having two corresponding lateral ends;
 a first adjacent surface of the active membrane layer in contact with the front electrode substantially along an entire length of the first adjacent surface, the front electrode having a surface that extends a first distance between the lateral ends of the front electrode along a first direction and beyond the first adjacent surface of the active membrane layer at both lateral ends of the active membrane layer, both lateral ends of the active membrane layer being in contact with the front electrode, a second adjacent surface of the active membrane layer in contact with the back electrode, the second adjacent surface extending beyond both lateral ends of the back electrode, the active membrane being mechanically supported by the front end and covered by the back end, the package comprising at least one back cavity having walls and lid of organic material, with filled through vias traversing the organic walls and a lid for coupling to the electrodes by an internal routing layer, the back cavity having a dimension along the first direction which is less than the first distance of the front electrode;
 the vias being coupleable by external solderable bumps to a circuit board for coupling the package in a flip chip configuration.

2. The package of claim 1 wherein the package further includes a front inner section having:
 a high resistivity silicon handle;
 a front cavity formed within the front inner section, adjacent to the front electrode on the active membrane layer; and
 a layer of silicon oxide on the inner surface of the silicon handle, wherein said front cavity lies within both the silicon handle and within the layer of silicon oxide.

3. The package of claim 2 comprising resonators or arrays of resonators providing a filter.

4. The package of claim 3 wherein the electronic component comprises an RF filter comprising a plurality of resonators in series and shunt, each resonator having dedicated back and front cavities.

5. The package of claim 2 wherein:
 the active membrane layer comprises a piezoelectric membrane, and
 a section of the back electrode with a raised frame therearound and the front side cavity adjacent to the front electrode both have a same pentagonal shape and are concentrically aligned, the front side cavity being at least as large as the shape of the back electrode as defined by the raised frame.

6. The package of claim 5 wherein the piezoelectric membrane has a top surface, a bottom surface and edges, and the package further comprises an inner passivation material around the edges of the active membrane.

7. The package of claim 2 wherein said front inner section further comprises a layer of silicon membrane attached to the layer of silicon oxide on an opposite side of the silicon oxide from the silicon handle by a bonding layer and the silicon membrane and bonding layer are removed from within the front cavity to expose the front electrode within the front cavity.

8. The package of claim 2 wherein said front inner section further comprises a layer of silicon membrane attached to the layer of silicon oxide on an opposite side of the silicon oxide from the silicon handle by a bonding layer and the silicon membrane and bonding layer are retained adhered to the front electrode and spanning the front cavity.

9. The package of claim 2, wherein:
 the front inner section is bonded to the front electrode by a bonding layer and is coupled to a front outer section that closes the front cavity; and
 the front outer section comprises a film of an organic material or of a photo-sensitive dielectric selected from the group consisting of SU-8, PDMS, PBO, epoxy, and TMM.

10. The package of claim 2 wherein the active membrane layer comprises a piezoelectric membrane selected from the group consisting of $Ba_xSr_{(1-x)}TiO_3$, c-axis-oriented $Sc_xAl_{(1-x)}N$, $Al_xGa(1-x)N$, AlN, $LiNbO_3$ and $LiTaO_3$.

11. The package of claim 2 wherein the back end of the package comprises an outer passivation layer covering a back side electrode area and frame and said outer passivation layer has first and second routes patterned therein, selectively exposing the back side electrode metal surface outside the vibrating part of the back electrode.

12. The package of claim 2 wherein the back end of the package comprises an inner patterned back layer of a photo-sensitive polymer defining side walls of the back cavity, and a back outer layer comprising a photo-sensitive polymer.

13. A package for an electronic component, the package comprising:
   a front end;
   a back end; and
   an active membrane layer sandwiched between front and back electrodes of conducting material, the front electrode having two corresponding lateral ends, the active membrane layer having two corresponding lateral ends, the back electrode having a portion in contact with the active membrane, the portion having two corresponding lateral ends;
   a first adjacent surface of the active membrane layer in contact with the front electrode substantially along an entire length of the first adjacent surface, the front electrode having a surface that extends a first distance between the lateral ends of the front electrode along a first direction and beyond the first adjacent surface of the active membrane layer at both lateral ends of the active membrane layer, both lateral ends of the active membrane layer being in contact with the front electrode, the active membrane being mechanically supported by the front end and covered by the back end, the package comprising at least one back cavity having walls and lid of organic material, with filled through vias traversing the organic walls and a lid for coupling to the electrodes by an internal routing layer, the back cavity having a dimension along the first direction which is less than the first distance of the front electrode;
   the vias being coupleable by external solderable bumps to a circuit board for coupling the package in a flip chip configuration.

14. The package of claim 13 wherein the package further includes a front inner section having:
   a high resistivity silicon handle;
   a front cavity formed within the front inner section, adjacent to the front electrode on the active membrane layer; and
   a layer of silicon oxide on the inner surface of the silicon handle, wherein said front cavity lies within both the silicon handle and within the layer of silicon oxide.

15. The package of claim 14 comprising resonators or arrays of resonators providing a filter.

16. The package of claim 15 wherein the electronic component comprises an RF filter comprising a plurality of resonators in series and shunt, each resonator having dedicated back and front cavities.

17. The package of claim 14 wherein said front inner section further comprises a layer of silicon membrane attached to the layer of silicon oxide on an opposite side of the silicon oxide from the silicon handle by a bonding layer and the silicon membrane and bonding layer are removed from within the front cavity to expose the front electrode within the front cavity.

18. The package of claim 14 wherein said front inner section further comprises a layer of silicon membrane attached to the layer of silicon oxide on an opposite side of the silicon oxide from the silicon handle by a bonding layer and the silicon membrane and bonding layer are retained adhered to the front electrode and spanning the front cavity.

19. The package of claim 14, wherein:
   the front inner section is bonded to the front electrode by a bonding layer and is coupled to a front outer section that closes the front cavity; and
   the front outer section comprises a film of an organic material or of a photo-sensitive dielectric selected from the group consisting of SU-8, PDMS, PBO, epoxy, and TMM.

20. The package of claim 14 wherein the back end of the package comprises an inner patterned back layer of a photo-sensitive polymer defining side walls of the back cavity, and a back outer layer comprising a photo-sensitive polymer.

21. A package for an electronic component, the package comprising:
   a front end;
   a back end; and
   an active membrane layer sandwiched between front and back electrodes of conducting material, the active membrane layer having two corresponding lateral ends, the back electrode having two corresponding lateral ends, the front electrode having two corresponding lateral ends;
   the front electrode having a surface that extends a first distance between the lateral ends of the front electrode along a first direction and beyond the first adjacent surface of the active membrane layer at both lateral ends of the active membrane layer, the active membrane being mechanically supported by the front end and covered by the back end, the package comprising at least one back cavity having walls and lid of organic material, with filled through vias traversing the organic walls and a lid for coupling to the electrodes by an internal routing layer, the back cavity having a dimension along the first direction which is less than the first distance of the front electrode;
   the vias being coupleable by external solderable bumps to a circuit board for coupling the package in a flip chip configuration.

* * * * *